US011328842B2

(12) United States Patent
Blacken et al.

(10) Patent No.: US 11,328,842 B2
(45) Date of Patent: May 10, 2022

(54) FORM BOARD PREPARATION FOR WIRE BUNDLING

(71) Applicant: The Boeing Company, Chicago, IL (US)

(72) Inventors: Lars E. Blacken, Bothell, WA (US); Damien O. Martin, Everett, WA (US); Eerik J. Helmick, Seattle, WA (US); Keith M. Cutler, Kirkland, WA (US); John R. Porter, Edgewood, WA (US)

(73) Assignee: The Boeing Company, Chicago, IL (US)

( * ) Notice: Subject to any disclaimer, the term of this patent is extended or adjusted under 35 U.S.C. 154(b) by 245 days.

(21) Appl. No.: 16/666,270

(22) Filed: Oct. 28, 2019

(65) Prior Publication Data

US 2021/0125750 A1    Apr. 29, 2021

(51) Int. Cl.
*H01B 13/012* (2006.01)
*H01R 43/20* (2006.01)
*G06F 30/00* (2020.01)

(52) U.S. Cl.
CPC ....... *H01B 13/01209* (2013.01); *G06F 30/00* (2020.01); *H01B 13/01227* (2013.01); *H01B 13/01245* (2013.01); *H01R 43/20* (2013.01)

(58) Field of Classification Search
CPC ........ H01B 13/01209; H01B 13/01227; H01B 13/01245; G06F 30/00; H01R 43/20
See application file for complete search history.

(56) References Cited

U.S. PATENT DOCUMENTS

| 4,598,469 | A | | 7/1986 | Weixel |
| 4,603,476 | A | | 8/1986 | Tarbox |
| 4,607,430 | A | | 8/1986 | Young |
| 4,653,159 | A | | 3/1987 | Henderson et al. |
| 4,677,734 | A | | 7/1987 | Bloch et al. |
| 4,692,974 | A | * | 9/1987 | Cross .................... H01R 43/28 29/760 |
| 4,715,100 | A | | 12/1987 | Cross |
| 4,765,589 | A | | 8/1988 | Sauze |
| 4,781,227 | A | | 11/1988 | Cross |
| 4,979,544 | A | | 12/1990 | Swindlehurst |
| 5,153,839 | A | | 10/1992 | Cross |
| 6,196,779 | B1 | | 3/2001 | Falk |
| 6,272,387 | B1 | | 8/2001 | Yoon |

(Continued)

FOREIGN PATENT DOCUMENTS

JP        2004119444 A  *  4/2004

*Primary Examiner* — Peter Dungba Vo
*Assistant Examiner* — Jose K Abraham
(74) *Attorney, Agent, or Firm* — Ostrager Chong Flaherty & Broitman P.C.

(57) ABSTRACT

Systems and methods for designing and assembling form boards with attached wire routing devices for use in wire bundle assembly. The assembly method comprises: (a) establishing a coordinate system of a form board having a multiplicity of holes; (b) using a computer system to determine locations of form board devices of different types with reference to the coordinate system of the form board based on engineering data specifying a wire bundle configuration; and (c) fastening the form board devices of different types to respective holes of the form board having centers closest to respective locations determined in step (b). The form board devices may be inserted robotically or manually.

19 Claims, 43 Drawing Sheets

(56) References Cited

U.S. PATENT DOCUMENTS

| | | | |
|---|---|---|---|
| 7,082,590 B2 | 7/2006 | Kragh et al. | |
| 7,337,933 B1 * | 3/2008 | Klinberg | A47G 25/82 |
| | | | 223/118 |
| 8,534,651 B2 | 9/2013 | Scapa et al. | |
| 8,955,714 B1 | 2/2015 | Brzon et al. | |
| 9,687,946 B2 | 6/2017 | Cole et al. | |
| 2006/0170142 A1 * | 8/2006 | Scapa | B25B 31/005 |
| | | | 269/49 |
| 2008/0152457 A1 * | 6/2008 | Schmier | F16B 21/125 |
| | | | 411/348 |
| 2015/0298825 A1 * | 10/2015 | Cole | B21J 15/142 |
| | | | 29/426.1 |
| 2017/0369271 A1 | 12/2017 | Mitchell et al. | |
| 2018/0138771 A1 * | 5/2018 | Murphy | H02K 3/521 |
| 2018/0257903 A1 * | 9/2018 | Takada | B65H 65/00 |
| 2018/0267498 A1 | 9/2018 | Helmick et al. | |

* cited by examiner

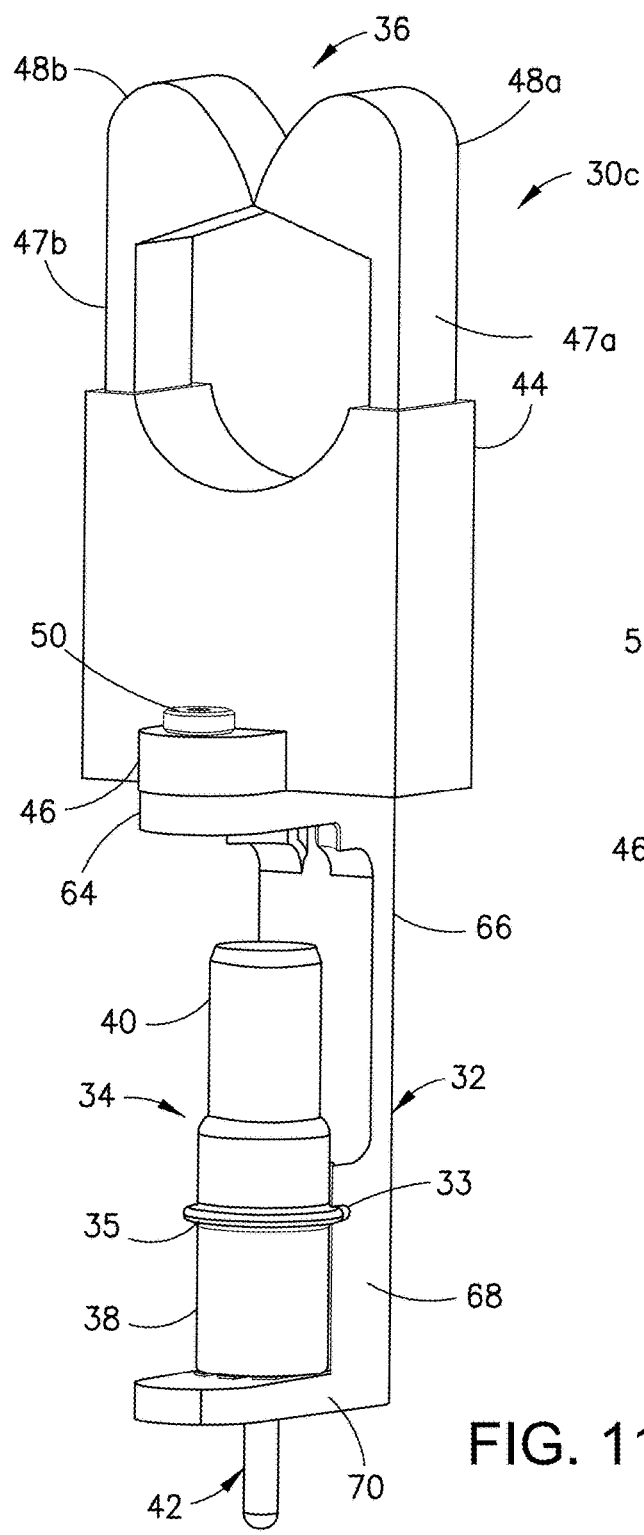
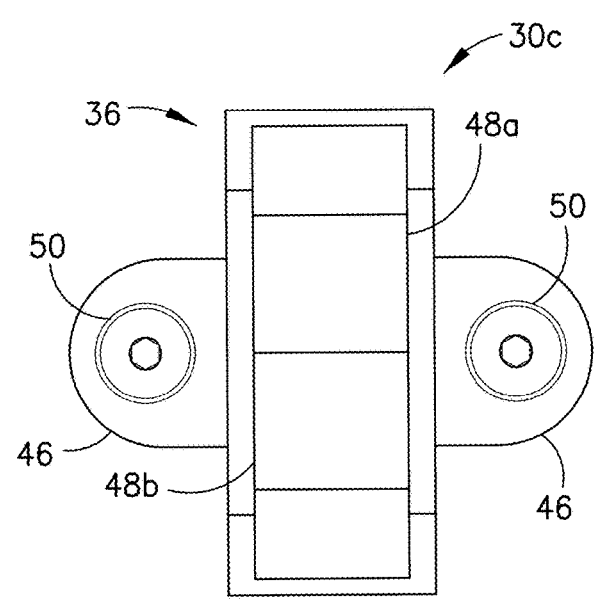
FIG. 11
FIG. 11A

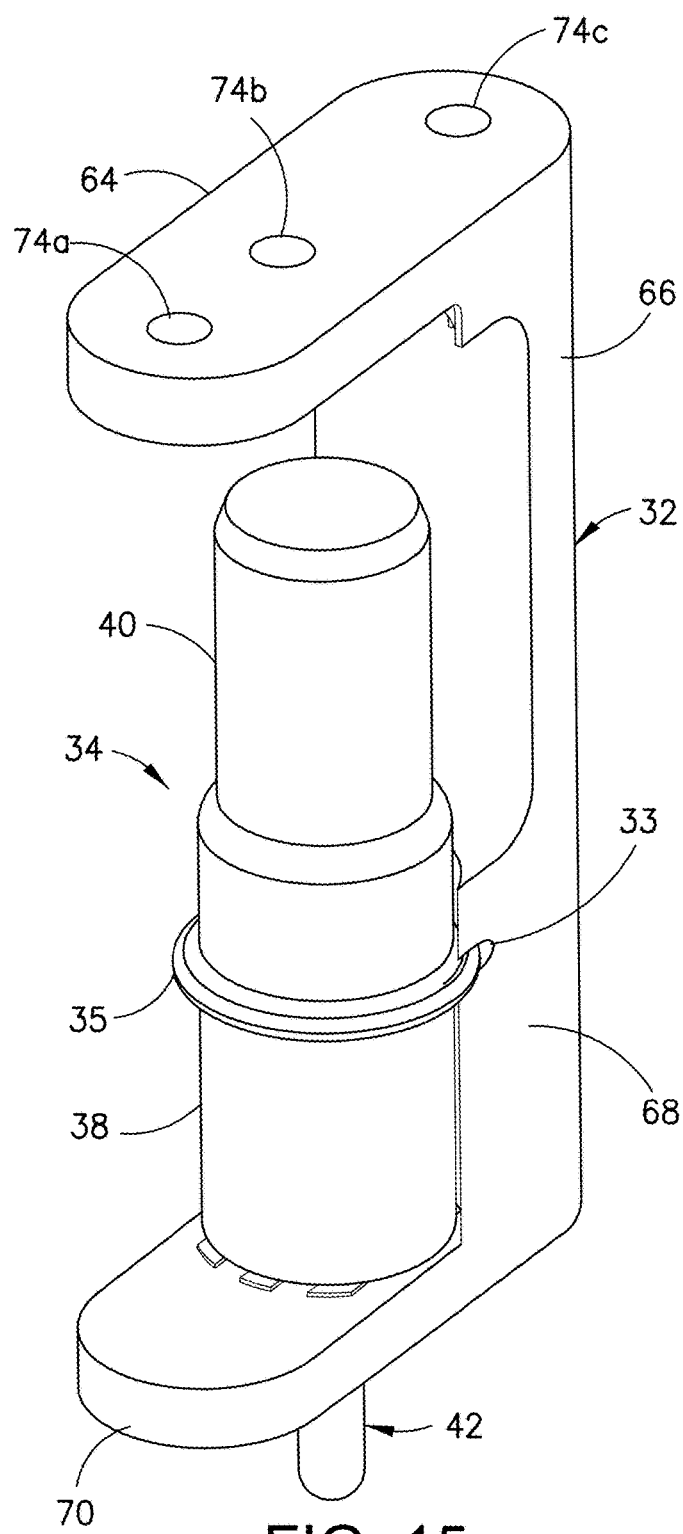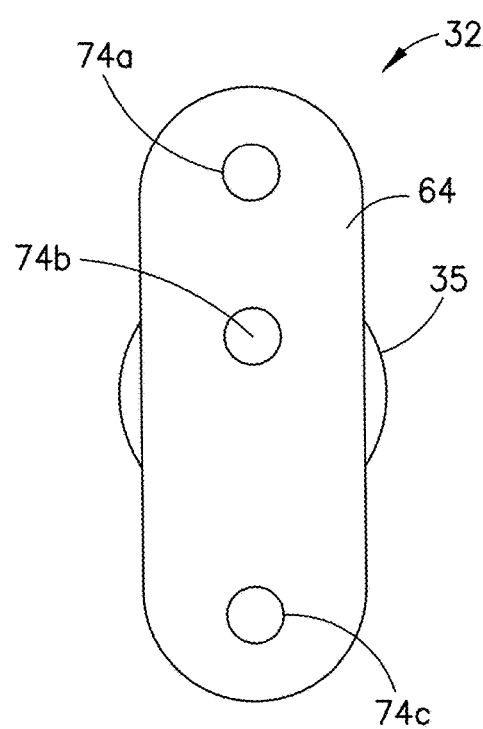
FIG. 15
FIG. 15A

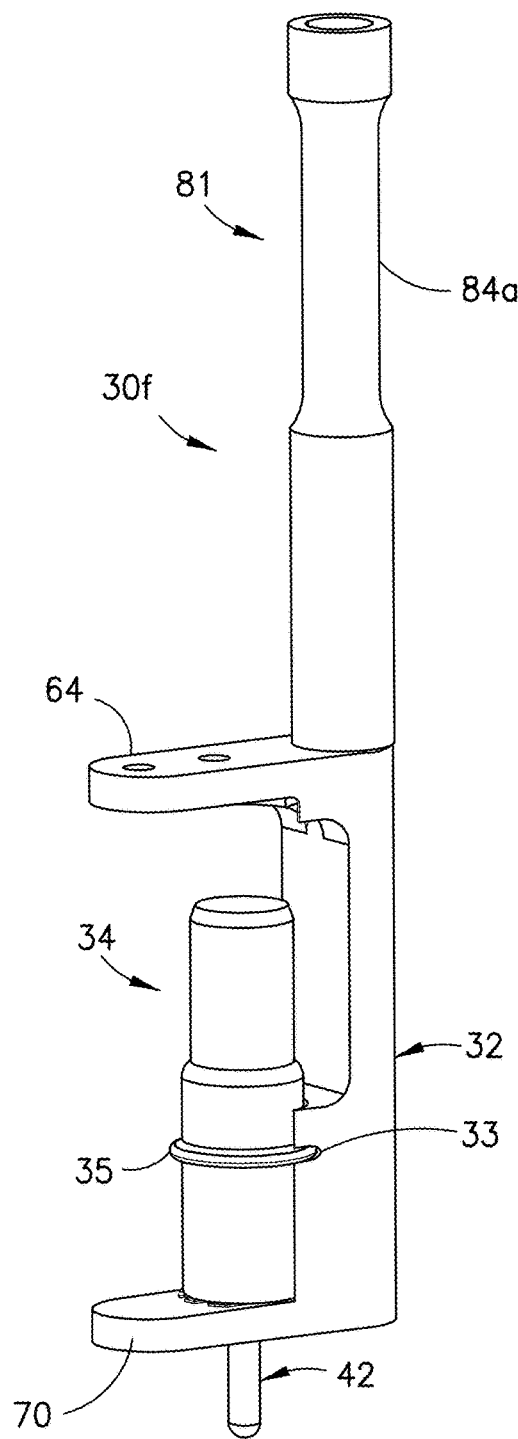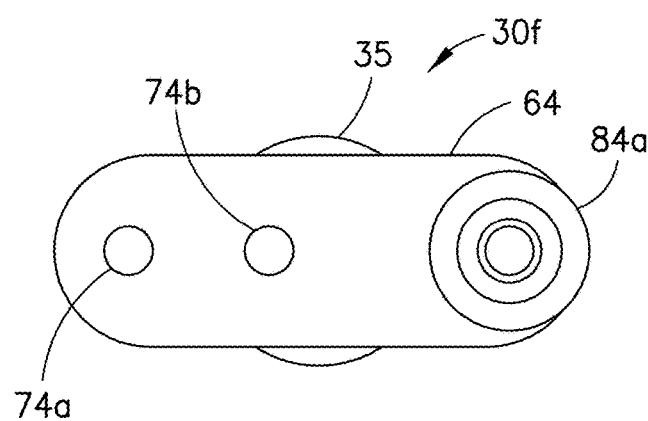
FIG. 17
FIG. 17A

FORM BOARD PREPARATION FOR WIRE BUNDLING

BACKGROUND

The present invention relates to the field of wire harness fabrication, and in particular to the assembly of form boards for use in producing wire bundles of varying configurations.

Vehicles, such as large aircraft, have complex electrical and electromechanical systems distributed throughout the fuselage, hull, and other components of the vehicle. Such electrical and electromechanical systems require many bundles of wire, cables, connectors, and related fittings to connect the various electrical and electromechanical components of the vehicle. For example, a large aircraft may have over 1000 discrete wire bundles. Often these discrete wire bundles are grouped into assemblies known as wire bundle assembly groups, which may comprise as many as 40 wire bundles and 1000 wires. Wire bundles are typically assembled outside of the aircraft.

In accordance with a typical method for assembling wire bundles, form boards are used to stage a wire bundle into its installation configuration. Typically, these form boards are sheets of plywood, generally 4 ft×8 ft, that are made manually and stored for future use. Typically each wire bundle of a given configuration fabricated in a wire shop requires a customized form board for lay-up. The form board typically includes a plurality of fixed form board devices which together define the given wire bundle configuration. The fabrication of a respective form board for each wire bundle configuration involves high costs when many wire bundle configurations must be dealt with. The costs result from the need to create, maintain, store, and set-up these form boards prior to fabrication of a particular wire bundle configuration.

It would be desirable to quickly design and assemble a form board with devices fastened thereto without delays to production when the design of a wire bundle is changed. It would also be desirable to provide a method for fabricating form boards that do not need to be stored after use.

SUMMARY

The subject matter disclosed in some detail herein is directed to systems and methods for designing and assembling form boards for use in wire bundle assembly. In some embodiments, automation technology is employed for robotically assembling form boards, routing wires, applying plastic wire ties, and cutting branches to final length. Because of high variability in wiring, these automation systems need to be automatically responsive to release and changes in engineering data. The software disclosed herein automatically generates robot control files from engineering data.

In accordance with one embodiment, the method for assembling a form board comprises: (a) establishing a coordinate system of a form board having a multiplicity of holes; (b) using a computer system to determine locations of form board devices of different types with reference to the coordinate system of the form board based on engineering data specifying a wire bundle configuration; and (c) fastening form board devices of different types to respective holes of the form board having centers closest to respective locations determined in step (b). The form board devices may be inserted robotically or manually.

Creation of form boards for fabricating respective different wire bundle configurations involves generating different coordinate systems for the form boards and attached devices (e.g., wire routing devices, wire end holders and connector supports; hereinafter "form board devices") and a method to align those coordinate systems. The solution proposed herein is capable of recognizing if the form board was used prior, or is totally empty, and which devices to displace or remove or add to the form board. The solution proposed herein is also capable of recognizing when multiple boards are needed and laying out the routing and support devices on the multiple boards.

Some embodiments disclosed in some detail below involve systems and methods for quickly designing and automatically assembling form boards for use in wire bundle assembly. The system for the assembly of form boards is designed to enable the form board to be reconfigured as needed, based on production and manufacturing requirements. The system comprises a form board, installed form board devices, installation tools (robots with end effectors or handheld devices), a vision system, and multiple background algorithms that generate the data required for system operation. The purpose of the system is to define, assemble, disassemble, and reassemble form boards as needed to meet production rates. The form boards fabricated using the methods disclosed herein do not need to be stored after use, thereby freeing up floor space for additional value-added work in the manufacturing environment.

Although various embodiments of systems and methods for designing and assembling form boards with attached wire routing devices for use in wire bundle assembly are described in some detail later herein, one or more of those embodiments may be characterized by one or more of the following aspects.

One aspect of the subject matter disclosed in detail below is a method for assembling a form board, the method comprising: (a) establishing a coordinate system of a form board having a multiplicity of holes; (b) using a computer system to determine locations of form board devices of different types with reference to the coordinate system of the form board based on engineering data specifying a wire bundle configuration; and (c) fastening form board devices of different types to respective holes of the form board having centers closest to respective locations determined in step (b). The form board devices may be inserted robotically or manually by a human operator.

In accordance with various embodiments of the method described in the immediately preceding paragraph, the method further comprises: determining a first sequence in which the form board devices should be installed in order to avoid a pick-and-place end effector colliding with installed form board devices, wherein the form board devices of different types are fastened to the form board in the first sequence; and removing the form board devices in a second sequence which is a reverse of the first sequence upon completion of a wire bundle assembly procedure. In addition, the method further comprises: comparing locations of form board devices attached to the form board to the locations determined in step (b); and removing form board devices having locations not included in locations determined in step (b).

Another aspect of the subject matter disclosed in detail below is a method for assembling a form board, the method comprising: flattening a three-dimensional model of a wire bundle into a two-dimensional map of an envelope of the wire bundle; determining the type and location of each form board device from a multiplicity of form board devices needed to form the wire bundle, avoiding positions corresponding to locations of other form board devices from the multiplicity of form board devices; generating a set of coordinates in a coordinate system of a form board and an associated device angle which digitally locate each form board device from the multiplicity of form board devices on the form board; and fastening the form board devices of different types to the form board at the determined locations. Flattening a three-dimensional model of a wire bundle into a two-dimensional map of the wire bundle comprises transforming first digital data representing the three-dimensional model of the wire bundle into second digital data representing the two-dimensional map of the envelope of the wire bundle. In accordance with some embodiments, the method further comprises: identifying tie locations, wherein determining the type and location of each form board device from the multiplicity of form board devices further comprises avoiding the tie locations.

Another aspect is a method for assembling a form board, the method comprising: (a) flattening a three-dimensional model of a wire bundle into a two-dimensional map of an envelope of the wire bundle; (b) calculating diameters of every branch in the wire bundle; (c) placing a virtual starting wire connector on the map; (d) placing routing recipes on the map; (e) snapping all form board devices to their nearest form board hole locations; (f) simplifying adjacent routing recipes; (g) reducing routing feature conflicts; (h) checking for collisions between a device placement end effector and the form board devices; (i) calculating the envelope of the wire bundle as routed through the form board devices; (j) calculating a preliminary tool center point path for a routing end effector; (k) checking for collisions between the routing end effector and the form board devices; (l) checking for collisions between the routing end effector and the wire bundle envelope; (m) writing a form board layout control file based on results of at least steps (a) through (l); and (n) fastening form board devices to respective holes of the form board in accordance with the form board layout control file using the device placement end effector.

A further aspect of the subject matter disclosed in detail below is a wire routing device comprising: a frame having upper and lower arms which are mutually parallel, the lower arm having a hole; a temporary fastener fastened to the hole in the lower arm; and a routing clip comprising a base in contact with the upper arm of the frame, the base comprising first and second mounting flanges fastened to the upper arm of the frame. The routing clip further comprises first and second flexible clip arms configured to bend resiliently away from each other, and first and second hooks respectively connected to or integrally formed with the first and second flexible clip arms, each of the first and second hooks having a respective outer inclined surface and a respective inner inclined surface. Optionally, there may be a "spacer" between the upper arm and the routing clip. The spacer enables all of the various routing clips to have the same height (z-axis) off the form board. The spacer is only required for the shorter routing clips; effectively making them the same height as the tallest routing clip.

In accordance with some embodiments of the wire routing device described in the immediately preceding paragraph, the temporary fastener comprises a cylindrical housing having an external annular flange, a plunger which is slidably coupled to the cylindrical housing, first and second locking pins having respective proximal ends connected to the plunger and respective distal ends latched to an underside of the lower arm of the frame, and a spacer affixed to the cylindrical housing and disposed between respective portions of the first and second locking pins; and the frame comprises a fastener retaining block having an arc-shaped groove in which a portion of the annular flange of the temporary fastener is seated.

Yet another aspect of the subject matter disclosed in detail below is a wire routing device comprising: a frame having upper and lower arms which are mutually parallel, the lower arm having a hole; a temporary fastener fastened to the hole in the lower arm; and a first post having one end fastened to the upper arm of the frame. In accordance with some embodiments, the wire routing device further comprises a second post having one end fastened to the upper arm of the frame, wherein the first and second posts are mutually parallel and separated by a gap.

Another aspect of the subject matter disclosed in detail below is a wire end holder comprising: a frame having upper and lower arms which are mutually parallel, wherein the lower arm of the frame has a hole; a temporary fastener fastened to the hole in the lower arm of the frame; and a wire clip fastened to the upper arm of the frame.

A further aspect of the subject matter disclosed in detail below is a form board assembly comprising a form board and a multiplicity of form board devices fastened to the form board, wherein the form board comprises a perforated plate having a multiplicity of holes, and the multiplicity of form board devices comprises a multiplicity of wire routing devices, wherein each wire routing device from the multiplicity of wire routing devices comprises a frame having upper and lower arms which are mutually parallel, the lower arm having a hole, and a temporary fastener fastened to the hole in the lower arm. A first wire routing device from the multiplicity of wire routing devices further comprises a routing clip attached to the upper arm of the frame of the first wire routing device which is fastened to a first hole of the multiplicity of holes in the perforated plate by the temporary fastener of the first wire routing device. A second wire routing device from the multiplicity of wire routing devices further comprises a post having one end attached to the upper arm of the frame of the second wire routing device which is fastened to a second hole of the multiplicity of holes in the perforated plate by the temporary fastener of the second wire routing device.

Yet another aspect is a form board assembly comprising a form board and a first wire routing device fastened to the form board, wherein the form board comprises a perforated plate having a multiplicity of holes, and wherein the first wire routing device comprises: a first frame having upper and lower arms which are mutually parallel, wherein the lower arm of the first frame has a hole; a first temporary fastener fastened to the hole in the lower arm of the first frame and to a first hole in the form board; a first post having a shaft with a lower end fastened to the first frame; and a second post having a shaft with a lower end fastened to the first frame, wherein the shafts of the first and second posts extend upward in parallel with a first gap therebetween with axes of the shafts being separated by a first distance.

A further aspect of the subject matter disclosed in detail below is a wire connector support device comprising: a frame comprising a base plate having a hole and a vertical plate connected to or integrally formed with the base plate; a first temporary fastener fastened to the hole in the base plate; and a detent pin installed on the vertical plate, wherein the detent pin is a quick-release alignment pin with a solid shank and spring-loaded locking balls. In accordance with one embodiment, the wire connector support device further comprises a notched projection connected to or integrally formed with and extending vertically upward from the vertical plate; a horizontal platform connected to or integrally formed with and extending horizontally from the vertical plate in a first direction opposite to a second direction in which the base plate is projecting; and a routing clip attached to the horizontal platform.

Other aspects of systems and methods for designing and assembling form boards with attached wire routing devices for use in wire bundle assembly are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

FIGS. 10 through 13 are diagrams representing three-dimensional views of respective wire routing devices having elastic routing clips of different sizes.

FIG. 11A is a diagram representing a top view of the wire routing device depicted in FIG. 11.

FIG. 15 is a diagram representing a three-dimensional view of a temporary fastener mounted to a C-frame.

FIG. 15A is a diagram representing a top view of the subassembly depicted in FIG. 15.

FIG. 17 is a diagram representing a three-dimensional view of a wire routing device having a single post in accordance with one embodiment.

FIG. 17A is a diagram representing a top view of the wire routing device depicted in FIG. 17.

Reference will hereinafter be made to the drawings in which similar elements in different drawings bear the same reference numerals.

DETAILED DESCRIPTION

Figure 1:
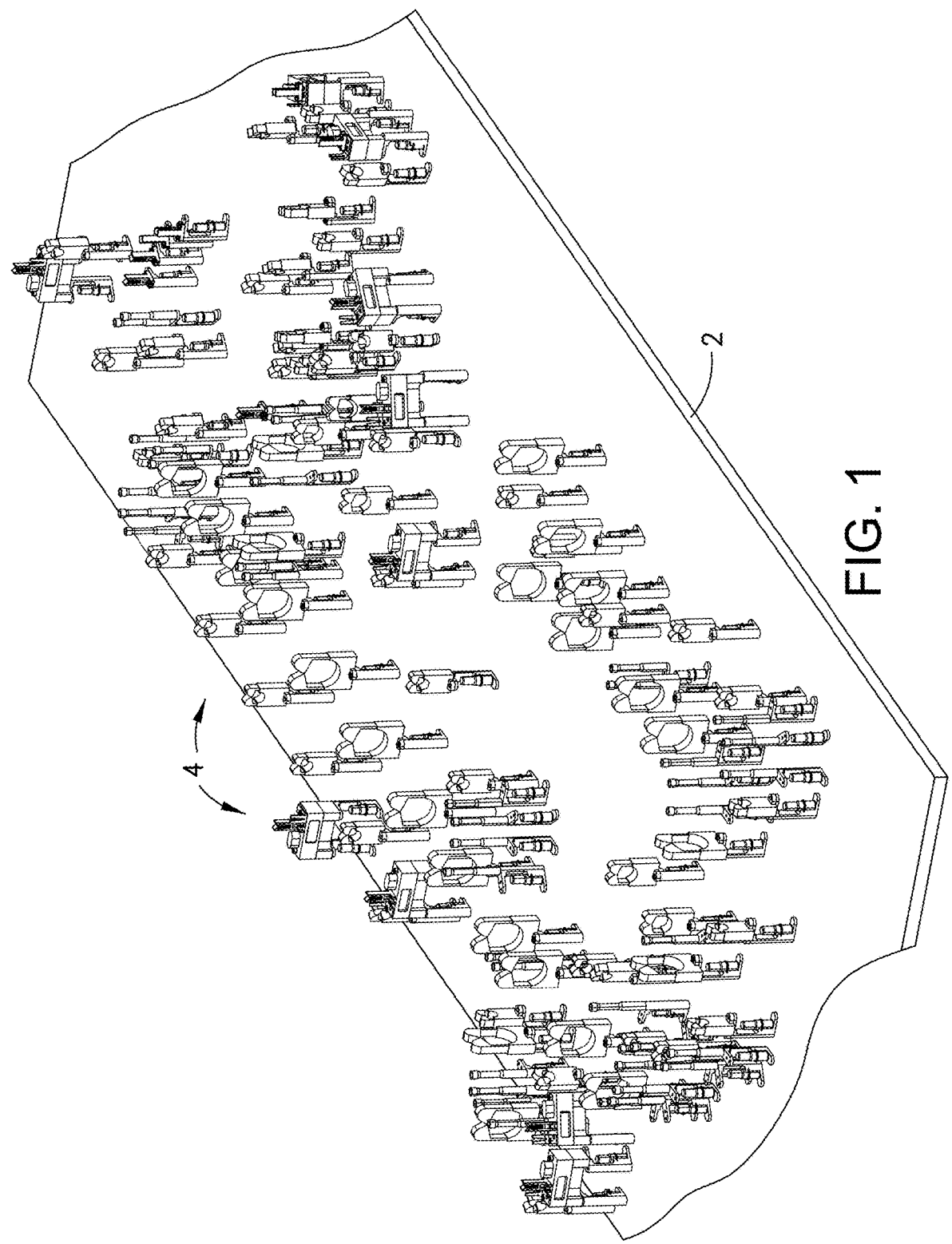
FIG. 1 is a diagram representing a three-dimensional view of a multiplicity of devices attached to a form board by means of temporary fasteners inserted in respective holes in the form board.

For the purpose of illustration, systems and methods for designing and assembling form boards with attached wire routing devices for use in wire bundle assembly will now be described in detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

A robot is a reprogrammable multi-functional manipulator designed to move material, parts, tools, or specialized devices to perform a variety of tasks. Contemporary industrial robots are helping to reduce human drudgery and repetitive stress injuries in manufacturing plants, to improve productivity, and to reduce manufacturing costs. Robots can be trained to perform complex and tedious jobs. Through the use of sensors and adaptive controls, robots can even cope with changing conditions in the workplace.

To assemble a wire bundle, a robot must be able to sense the ends of the wire. With this in mind, it is important that any auxiliary equipment facilitating robotic assembly be able to position the ends of the wire in predictable locations where the robot manipulator may grip the wire. In addition, there is a need for a system with flexible automation to make wire bundles in small lots while allowing ease of reconfiguration to produce a variety of wire bundles.

Robots are used to assemble electrical wire bundles using wire segments cut to length and configured prior to bundling. The robotic assembly of the wire bundle is facilitated through the use of specialized devices or tools which make it easier for the manipulator of the robot to handle the individual wire segments.

A robotic system can be easily reprogrammed to produce a variety of wire bundles, usually in small lots. With robots and associated microprocessors and/or computers, the specifications for a wire bundle can be input into the system manually or with CAD equipment and can be converted to control data to activate robots to assemble the harness. The robot control preferably is achieved through a data generator control program running on a computer with downloaded control data passing to the internal systems controller (CPU or microprocessor) of each unit in the system. In the past, the only significant manual tasks which remained were the lay-out of the proper form board configuration (i.e., positioning the devices to be attached to the form board) and the resupply of materials to the various machines. Manual override of the system or any subsystem is possible.

In accordance with one system, wire is de-reeled, cut, and marked in a wire preparation subsystem using a commercial wire marker. From the wire marker, the cut/marked wire is loaded into a canister in a work bay of a wire reeling subsystem. A robot connecting a wire termination subsystem with the wire reeling subsystem picks up the loaded canister containing the wire segment (with both ends exposed) and configures each end (in a pin, lug, or other termination) as required for the particular harness under construction. The canister is then placed in a bay of a queuing subsystem where it is available to a layup robot in a wire layup subsystem. The layup robot inserts one end of the wire into a connector on a layup form board, and the wire is routed through wire routing devices to control shape. The second end is then inserted into another connector. The empty canister is returned to the queuing subsystem and, subsequently, to the work bay of the wire reeling subsystem, and the process for handling each wire continues until the harness is complete. The layup robot, using a variety of tools, completes all required operations, including tie wrapping.

The embodiments disclosed below involve systems and methods for quickly designing and automatically assembling form boards for use in wire bundle assembly. The system for the assembly of form boards proposed herein is designed to enable the form board to be reconfigured as needed, based on production and manufacturing requirements. The system comprises a form board, installed form board devices, installation tools (robots with end effectors or handheld devices), a vision system, and multiple background algorithms that generate the data required for system operation. The purpose of the system is to define, assemble, disassemble, and reassemble form boards as needed to meet production rates.

FIG. 1 is a diagram representing a three-dimensional view of a form board that has a multiplicity of form board devices 4 attached thereto in a manner that reflects the configuration of a wire bundle to be assembled. As will be described in more detail below, the form board devices 4 may include wire routing devices, wire end holders, and connector supports. As used herein, the term "wire routing device" means a hardware tool that is configured so that, when the wire routing device is fastened to a form board, a portion of the wire routing device will limit movement of a contacting section of a wire in at least one lateral direction which is parallel to the X-Y plane of the form board to which the wire routing device is attached.

The form board 2 is typically mounted to or forms part of a support frame (not shown in FIG. 1). The form board devices 4 are attached to the form board 2 by means of temporary fasteners (not shown in FIG. 1) which are inserted in respective holes (also not shown in FIG. 1) in the form board 2. The form board assembly illustrated in FIG. 1 is universal in its application, i.e., the form board assembly can be employed to fabricate wire bundles of different designs requiring different deployment of a set of form board devices 4 mounted to the form board 2. In alternative situations, two or more form board assemblies may be placed adjacent to each other for the purpose of assembling a wire bundle in accordance with various alternative configurations.

Figure 2:
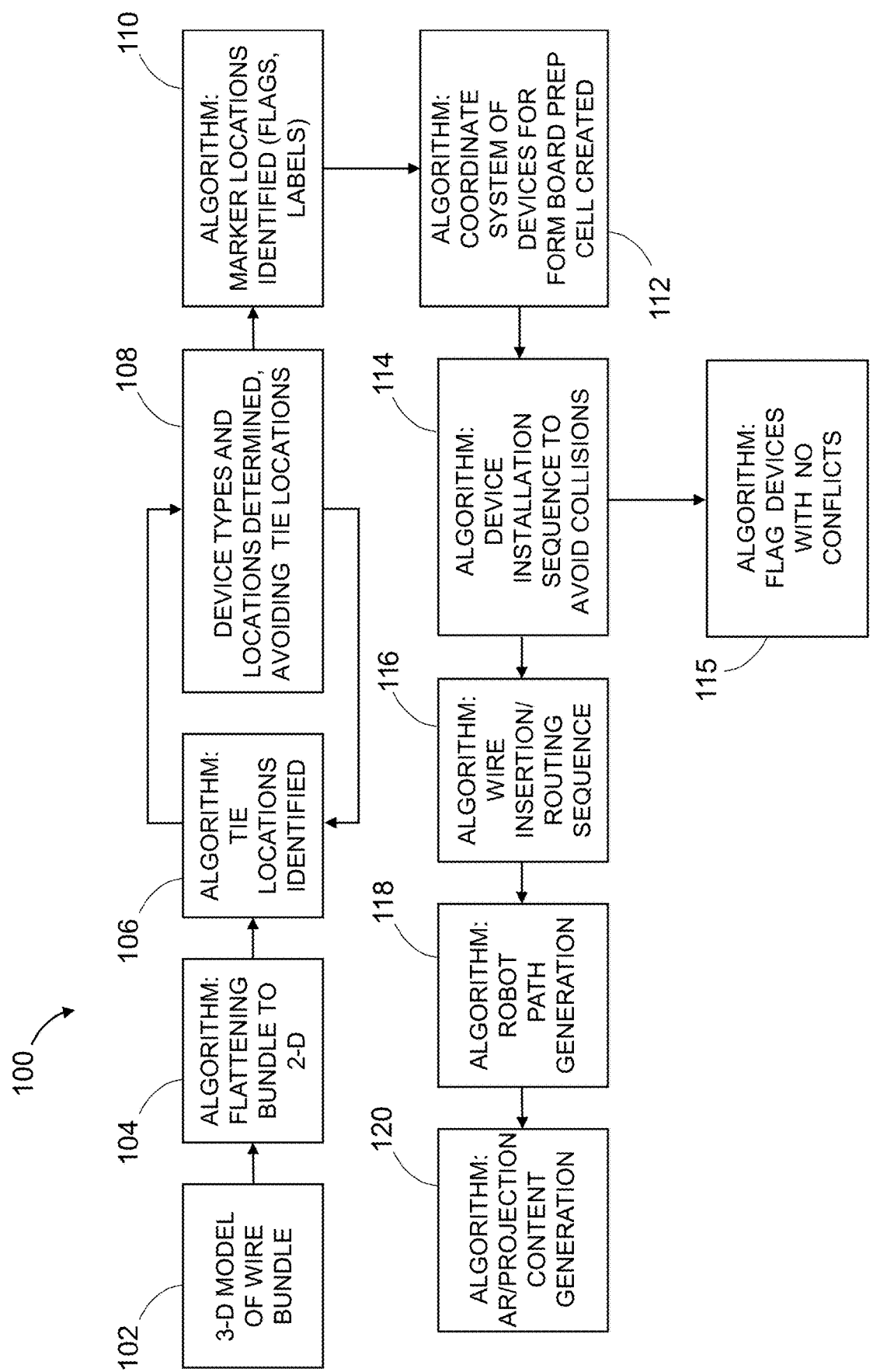
FIG. 2 is a flowchart identifying steps of a method for defining wire bundles in accordance with one embodiment.

FIG. 2 is a flowchart identifying steps of a method 100 for defining wire bundles (also referred to herein as "bundle definition") in accordance with one embodiment. An algorithm is used to flatten the three-dimensional (3-D) model 102 of the wire bundle to be a two-dimensional (2-D) map of an envelope of the wire bundle (operation 104). This is done by transforming first digital data representing the 3-D model of the wire bundle into second digital data representing the 2-D map of the envelope of the wire bundle. Then an algorithm identifies the tie locations (operation 106) and determines the type and location of each form board device needed to form the wire bundle, avoiding positions corresponding to locations of ties and other form board devices (operation 108). These locations are in a coordinate system of the wire bundle envelope. Another algorithm identifies the locations of markers (e.g., flags or labels) (operation 110). A further algorithm then converts the device locations in the coordinate system of the wire bundle into corresponding device locations in a coordinate system of a form board placed in the form board preparation cell, which locations include position coordinates and an associated device angle which digitally locate (position and orientation) each form board device on the form board (operation 112). Another algorithm then determines the order (hereinafter "sequence") in which the form board devices should be installed in order to avoid collisions between the moving pick-and-place end effector and installed form board devices (operation 114). More specifically, this sequence, along with each device's pick angle, prevents the device pick-and-place end effector from colliding with previously installed devices. The form board devices will be placed on the form board in accordance with the determined sequence. Similarly, devices should be removed from the form board in the reverse sequence. A further algorithm flags the wire routing devices with no conflicts (operation 115). Then an algorithm determines the wire insertion/routing sequence (operation 116). Based on the wire insertion/routing sequence, another algorithm generates a robot path for automated routing and insertion of the wires (operation 118). Finally, an algorithm generates content for augmented reality/projection of the locations of the wire routing devices on the form board for guiding an operator during manual insertion of the form board devices (step 120).

The purpose of bundle definition is to create the coordinate system of required devices to be installed on the form board. This step includes algorithms that are used to provide the recommended sequence of device installation. This recommended sequence is used to eliminate the possibility of device collisions and to make sure the installation tool will have access to each device, regardless of the density of device placement.

In accordance with the embodiment depicted in FIG. 2, the method 100 includes automated generation of a 2-D mapping of the form board devices from a 3-D model (operation 112). The flattened wire bundle has an envelope which is fit onto the form board. Wire routing devices are assigned to respective locations on the form board in operation 108. Wire routing devices are selected based on the routing path of the wire segment as well as the outer diameter of the wire bundle at the support location. A layout of the form board devices in the coordinate system of the form board is generated based on the device coordinates and device angles generated in operation 112.

Figure 3:
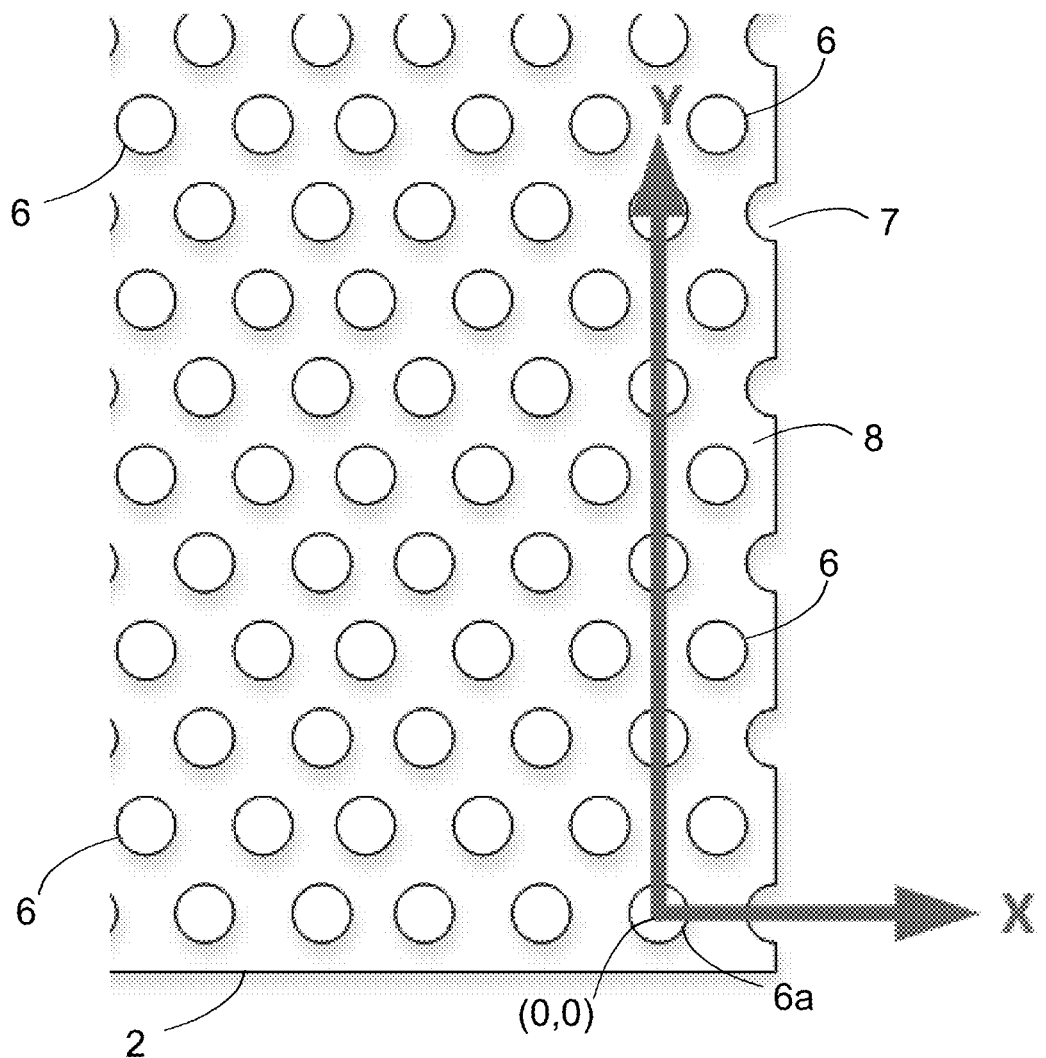
FIG. 3 is a diagram showing one example orientation of a form-board coordinate system.

FIG. 3 is a diagram showing one example orientation of a coordinate system for a form board 2 in accordance with one embodiment. The form board 2 has a multiplicity of holes 6 arranged in a hexagonal pattern. As seen in FIG. 3, the form board 2 may have incomplete holes 7. The form board 2 is preferably rectangular in shape and is constructed to include four edge beams (not shown in FIG. 3) to which a planar plate is secured, for example, by bolts. The plate has a multiplicity of substantially parallel holes 6 formed therein. The holes 6 are typically arranged to form a plurality of parallel rows. In the coordinate system of the form board 2, each hole has a respective position indicated by X and Y coordinates. The edge beams and plate can be made of any structural-type material, either metallic or non-metallic.

As depicted in FIG. 3, the X-axis of the form board coordinate system is parallel to one side of the form board 2, whereas the Y-axis is perpendicular to the X-axis. The origin of the coordinate system is consistently defined across all form boards in the system. The origin point can be located anywhere on the form board. The coordinate position of the center of each hole 6 (in the frame of reference of the form board coordinate system) is known. Such hole coordinates are stored as digital data in a non-transitory tangible computer-readable storage medium. The actual coordinate positions of the form board devices 4 (see FIG. 1) physically attached to the form board 2 correspond to the coordinate positions of the respective holes 6 in which the form board devices 4 are inserted.

Figure 4:
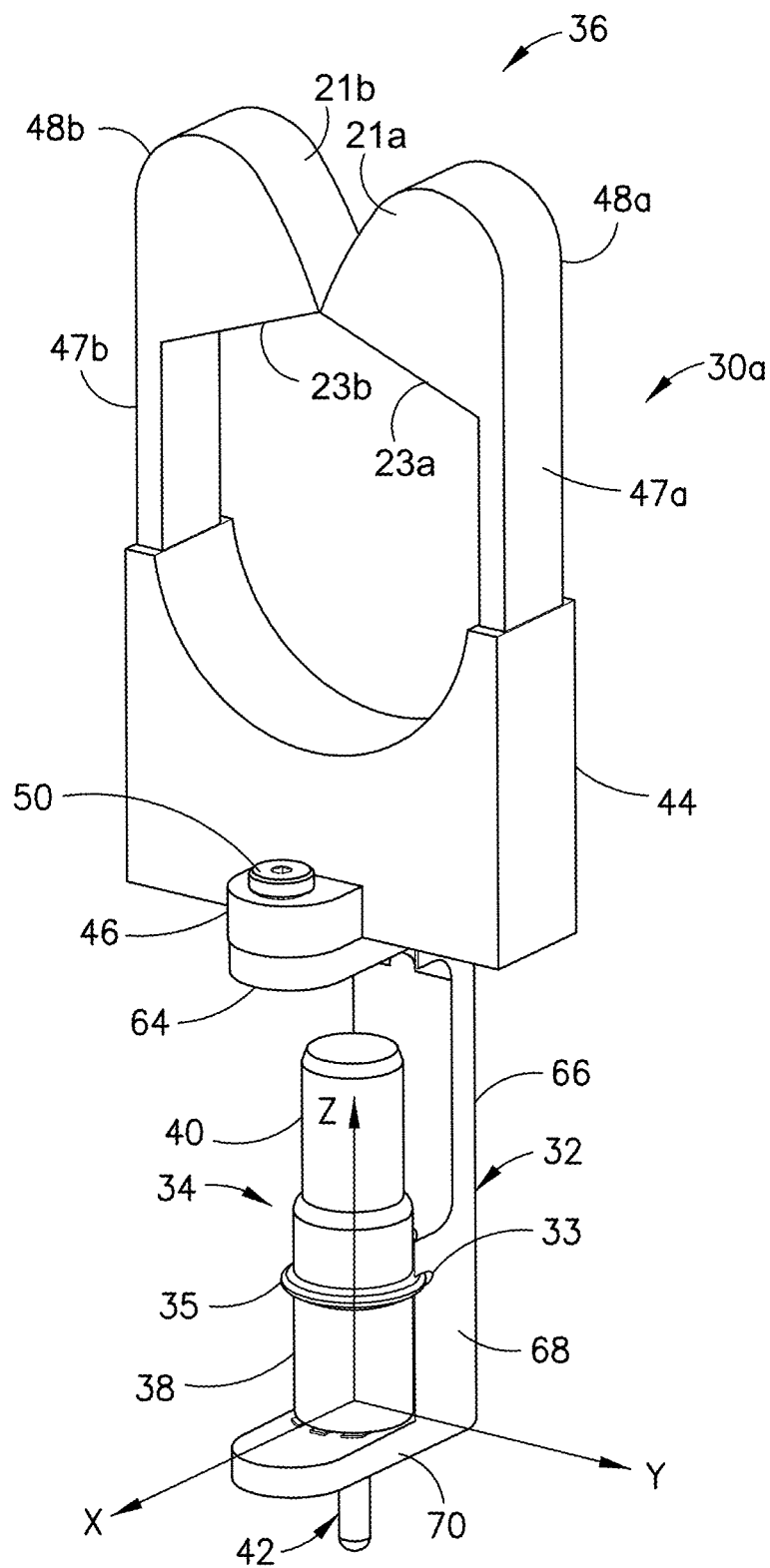
FIG. 4 is a diagram representing a three-dimensional view of a form board device including a temporary fastener and having an example device coordinate system.

Each form board device has its own coordinate system and orientation information. For example, the coordinate system of the wire routing device 30a depicted in FIG. 4 is centered at the centerline of the temporary fastener 34. More specifically, the Z-axis of the coordinate system of the wire routing device 30a depicted in FIG. 4 is coaxial with the centerline of the temporary fastener 34. The X-axis of the coordinate system of the wire routing device 30a is perpendicular to the Z-axis and aligned with the centerline of the lower arm of a C-frame 32. The Y-axis of the coordinate system of the wire routing device 30a is perpendicular to both the Z-axis and X-axis.

As used herein, the term "C-frame" means a relatively stiff channel-shaped bracket having mutually parallel upper and lower arms and does not mean a frame having a C-shaped profile. In accordance with the embodiments disclosed herein, the C-frame further includes a member that connects the upper arm to the lower arm.

FIG. 4 is a diagram representing a three-dimensional view of a wire routing device 30a that includes a C-frame 32 made of rigid material (e.g., aluminum), a temporary fastener 34 fastened to the C-frame 32 and a routing clip 36 (also known as an "elastic retainer"). The temporary fastener 34 is configured to initially fasten to the lower arm 70 of the C-frame 32 and later fasten the C-frame 32 to a form board 2 by interacting with a hole 6. The routing clip 36 is attached to the upper arm 64 of the C-frame 32. The C-frame 32 further includes a fastener retaining block 68 integrally formed with one end of the lower arm 70 and a vertical member 66 having one end integrally formed with one end of the upper arm 64 and another end integrally formed with the fastener retaining block 68.

The temporary fastener 34 includes a cylindrical housing 38 with an annular flange 35 extending around the housing 38. A plunger 40 is slidably coupled to the housing 38. A portion of the plunger 40 projects from one end of the housing 38. A spacer (not visible in FIG. 4, but see spacer 41 in FIGS. 4A and 4B) and a pair of locking pins 42 project from the opposite end of the housing 38. A spring is contained inside the housing 38. The locking pins 42 are connected to the plunger 40 and displace with the plunger 40 when the plunger 40 is pushed further into the housing 38. The spacer 41 is fixed relative to the housing 38. A portion of the annular flange 35 sits in an arc-shaped retaining groove 33 formed in the fastener retaining block 68 of the C-frame 32. To initially load the pin, the spring is depressed, thereby extending the plunger 40 and locking pins 42, while at the same time "toeing-in" the locking pins 42 through the lower hole in the C-frame 32, during which movement the annular flange 35 snap-fits into the retaining groove 33 of C-frame 32. Although not readily discernible in FIG. 4, the locking pins 42 may have respective half-heads 43 (see FIGS. 4A and 4B) which project laterally outward for latching underneath the peripheral surface surrounding one end of the hole in which the temporary fastener 34 is inserted.

Still referring to FIG. 4, the routing clip 36 includes a base 44 having a pair of mounting flanges 46 (only one of which is visible in FIG. 4) fastened to the upper arm of the C-frame 32 by means of screws 50 (or other type of fasteners), a pair of flexible clip arms 47a and 47b configured to bend resiliently away from each other, and a pair of hooks 48a and 48b respectively connected to or integrally formed with the upper ends of the flexible clip arms 47a and 47b and in contact when the routing clip 36 is closed. The routing clip 36 may be opened to receive one or more wires by pushing down on the outer inclined surfaces 21a and 21b of the hooks 48a and 48b, thereby causing the flexible clip arms 47a and 47b to bend outward and away from each other. The wires may then pass through the gap formed between the hooks 48a and 48b. The stressed flexible clip arms 47a and 47b bend inward when the force causing them to bend outward is removed. The routing clip 36 is used to form a cable bundle as the wires are inserted and gathered. A complete bundle can be easily removed from the routing clip 36 by lifting the wire bundle upward, causing the wire bundle to bear against the inner inclined surfaces 23a and 23b of the hooks 48a and 48b, thereby again causing the flexible clip arms 47a and 47b to bend outward and away from each other. In the implementation depicted in FIG. 4, the outer inclined surfaces 21a and 21b have curved profiles and the inner inclined surfaces 23a and 23b have linear profiles.

Figure 4A:
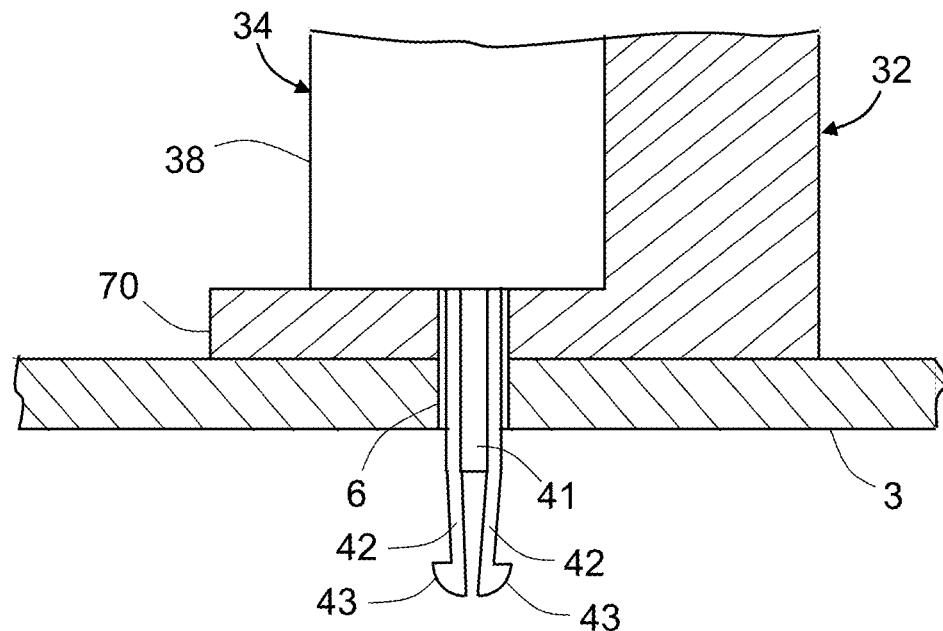
FIG. 4A is a diagram representing a fragmentary side view of the temporary fastener depicted in FIG. 4, showing the fastening mechanism extending through the perforated plate of a form board in an unclamped position.

A pick-and-place end effector of a robot carries the wire routing device 30a to a position above a target location (including a target position and a target orientation) on a form board. Then the pick-and-place end effector depresses the plunger 40 further into the housing 38, causing the distal ends of locking pins 42 to extend further away from the housing 38 and beyond the spacer 41. As the locking pins 42 are extended beyond the spacer 41, the locking pins 42 come together at their distal ends. The locking pins 42 can then be inserted into a hole 6 in the perforated plate 8 of the form board. FIG. 4A is a diagram representing a fragmentary side view of the temporary fastener 34 depicted in FIG. 4, showing the fastening mechanism extending through the perforated plate 8 in an unclamped position.

Figure 4B:
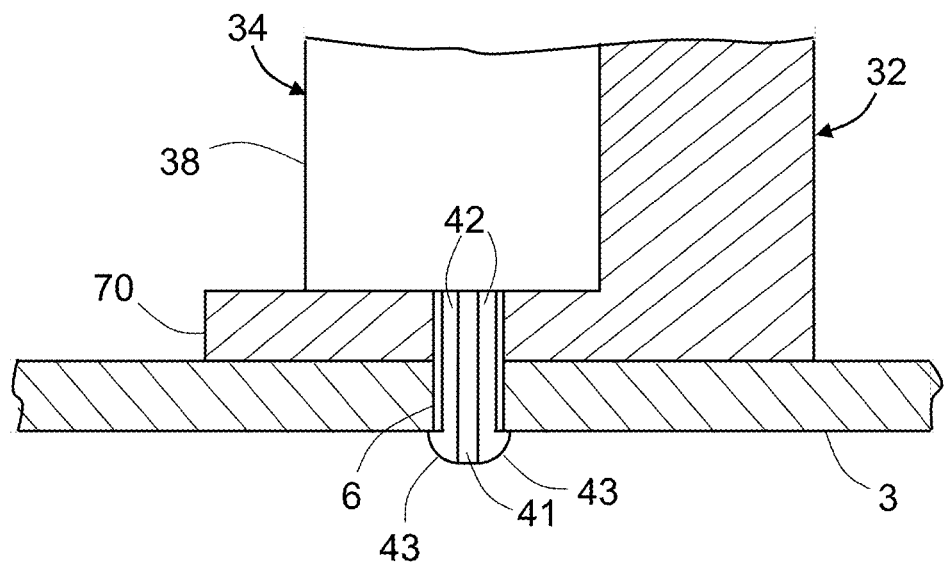
FIG. 4B is a diagram representing a fragmentary side view of the temporary fastener depicted in FIG. 4A, showing the fastening mechanism in a clamped position for securing the form board device to the form board.

FIG. 4B is a diagram representing a fragmentary side view of the temporary fastener depicted in FIG. 4A, showing the fastening mechanism in a clamped position for securing the wire routing device 30a to the perforated plate 8 of the form board. After the locking pins 42 have been inserted in the hole, the end effector releases the plunger 40, causing the distal ends of locking pins 42 to retract back toward the housing 38. The distal ends of the locking pins 42 are again separated from each other by the spacer 41 (which is stationary) as the locking pins 42 retract. As the distal ends of the locking pins 42 separate, the distal ends of the locking pins 42 engage and latch against the opposite side of the perforated plate 8, thereby locking wire routing device 30a to the form board 2. The spring (not shown in the drawings) inside housing 38 pulls the locking pins 42 toward the housing 38, pulling the lower arm 70 of the C-frame 32 tightly against the perforated plate 8. In the state depicted in FIG. 4B, the distal ends of the locking pins 42 are separated by the spacer and unable to pass through the hole 6. In this way, the temporary fastener 34 depicted in FIG. 4 functions as a temporary rivet capable of holding the wire routing device 30a on the form board 2 during a subsequent wire routing operation.

Figure 5:
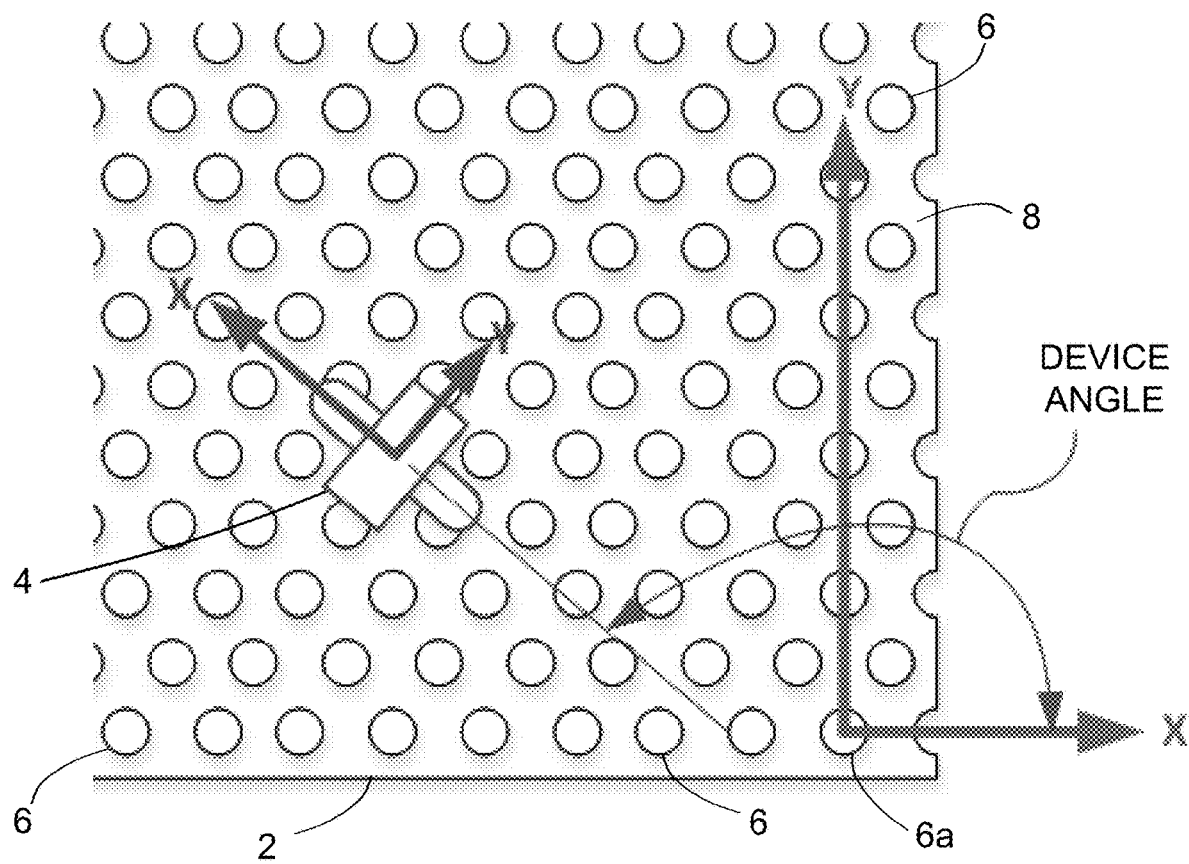
FIG. 5 is a diagram representing a plan view of a form board having a form board device placed thereon with a device angle measured with respect to an X-axis of the form board coordinate system.

Each wire routing device, when placed in the coordinate system of the form board 2, also has an orientation, referred to hereinafter as the "device angle". The device angle is defined as the angle from the X-axis of a wire routing device 30 to the X-axis of the form board 2, as shown in FIG. 5.

Figure 6:
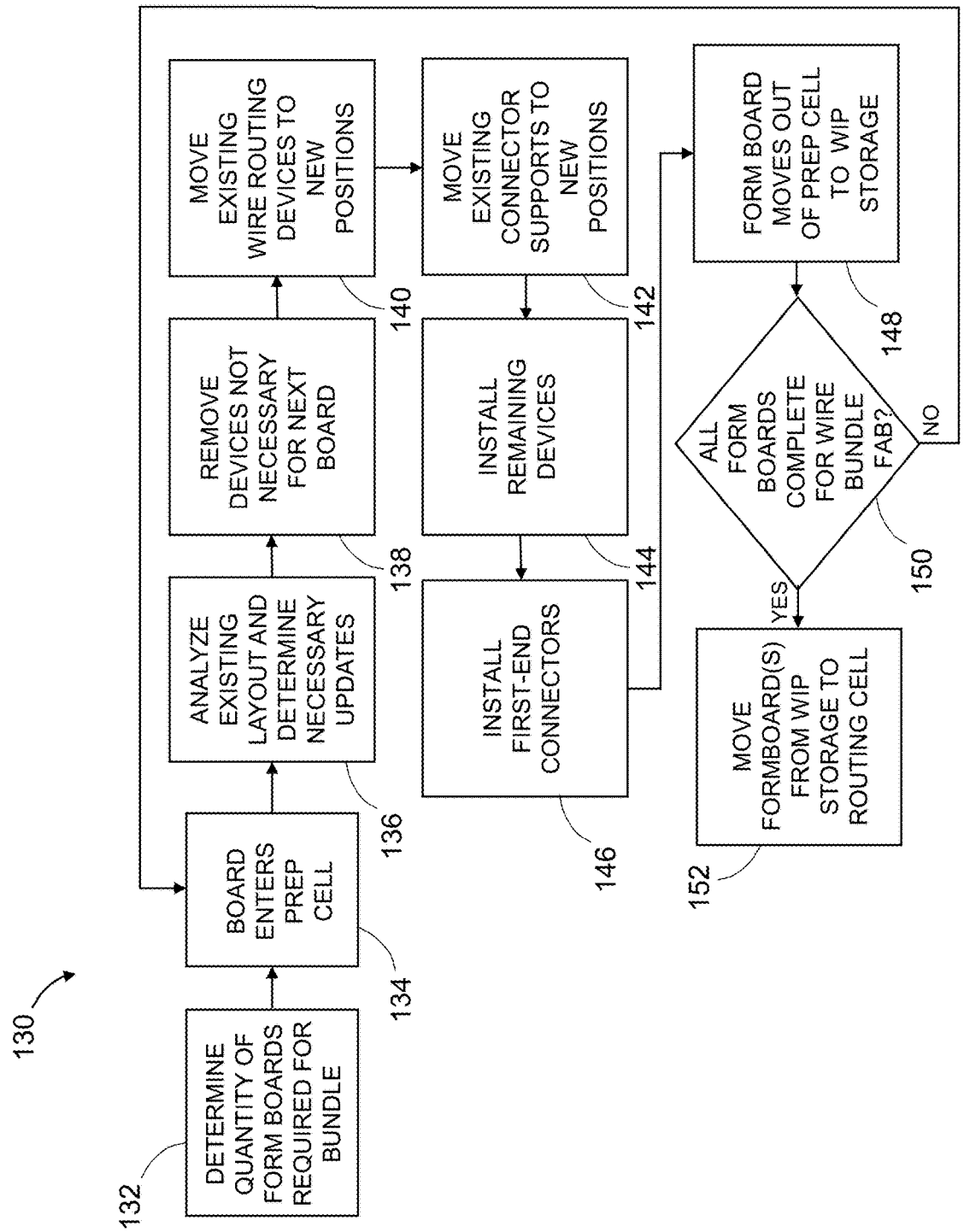
FIG. 6 is a flowchart identifying steps of a method for processing form boards in a form-board preparation cell in accordance with one embodiment.

FIG. 6 is a flowchart identifying steps of a method 130 for processing form boards in a form-board preparation cell in accordance with one embodiment. Initially the number of form boards required for a planned wire bundle is determined based on bundle parameters (step 132), such as bundle size and form. This determination is completed during the bundle definition process. The form board preparation cell collects this information based on the wire bundle job file it will use to create the form board 2. These form boards are then prepared individually and joined later to be used in a wire routing work cell. The form board 2 then enters the form board preparation cell (step 134). Form boards may be moved manually or using a robotic cart or other mechanism.

The form board 2 may be emptied of form board devices 4 either before or after the form board 2 enters the form board preparation cell (not shown in FIG. 6). For the sake of illustration, FIG. 6 assumes that the form board 2 is not empty when it enters the form board preparation cell. Since some or all of the devices attached to the form board 2 in accordance with a previous wire bundling procedure may be attached at locations which are different the locations required by the planned new wire bundling procedure, the next step 136 in the process is to analyze the form board devices 4 attached to the existing form board 2 and determine which updates are necessary. Step 136 may be performed in any one of a variety of ways.

In accordance with a first option, a serial number is assigned to each form board for the purpose of identification. The serial number is tied to a database that indicates which previous wire bundles were attached to or formed on the identified form board. The coordinates of the devices used for a previous wire bundle procedure (and still attached to the identified form board) are stored in a file in a non-transitory tangible computer-readable storage medium. Likewise the coordinates of the devices to be attached to the identified form board for the next planned wire bundle procedure are stored in another file in the non-transitory tangible computer-readable storage medium. A computer system is configured to retrieve both files and then compare the coordinates of the existing layout of wire routing, wire end holding, and connector support devices to the coordinates of the desired layout of devices on the form board. The computer system is further configured to inventory each type of device in both the previous layout and the next layout and make determinations regarding: (a) which currently attached devices should be removed; (b) which currently attached devices should be moved to new locations on the form board; (c) which currently attached devices should remain in place; and (d) which additional devices should be retrieved from inventory and attached to the form board.

In accordance with a second option, a vision system may be used to capture an image of the form board with currently attached devices. A computer system may be configured to retrieve a reference image from a non-transitory tangible computer-readable storage medium and then compare the captured image to the reference image. The images may be processed using object recognition software that identifies the types of devices represented in the images. The computer system may be further configured with a program that generates a first list of devices to be removed, a second list of devices to be moved, a third list of devices to remain in place, and a fourth list of new devices to be attached to the form board.

In accordance with a third option, respective visual markers (such as barcodes or matrix barcodes) may be assigned to each type of device being used. Each device of a particular type would have a barcode of a type that identifies the device type. The identifier will be recognized by a vision system or a sensor system. An inventory of each type of device and its coordinates will be fed to a computer system that is configured to determine which devices to remove or move based on the next wire bundle configuration. Some coordinates may need to be further optimized based on use or previous or future configurations. The vision system would recognize that coordinates may have been changed and provide the user with the option to store the new coordinates in the database as an update or change the coordinates back to the original coordinates.

In accordance with a fourth option, the operator may visually assess the current state of the device layout on the form board and visually compare the current state to the desired state as represented in a drawing, as previously described.

Referring again to FIG. 6, after the state of the current layout of form board devices 4 attached to the form board 2 has been analyzed (step 136), currently attached devices not needed for the next wire bundle procedure are removed (step 138). Next, currently attached wire routing devices designated for re-use at new locations are removed from their current locations and moved to new locations on the form board 2 (step 140). Likewise existing connector support devices designated for re-use at new locations are removed from their current locations and moved to new locations on the form board 2 (step 142). Then the remaining wire routing and connector support devices needed to complete the new layout are retrieved from inventory and installed on the form board 2 (step 144). Lastly first-end connectors are installed on their respective connector support devices (step 146). These wire connectors receive the ends of the wires of the wire bundle, which ends may be inserted by means of a robot or manually.

After all of the wire routing and connector support devices have been installed at their proper locations (in the correct position with a correct orientation), the form board 2 is moved out of the form board preparation cell to a work-in-process storage area or room (step 148). The form board 2 may be moved manually or robotically as previously described. A determination is then made whether all form boards have been completed for the particular wire bundle to be fabricated or not (step 150). If a determination is made in step 150 that all form boards have been completed, the form boards are moved from work-in-process storage to the routing cell (step 152). If a determination is made in step 150 that all form boards have not been completed, then the method 130 returns to step 134, during which the next form board required for the planned wire bundle configuration is moved into the form board preparation cell.

In accordance with one proposed implementation, the form board 2 is made from a rectangular ⅛-inch-thick perforated sheet with ⅛-inch-diameter holes spaced approximately 3/16 inch (4.7625 mm) apart in a hexagonal pattern. Thus, the vertical spacing between rows is approximately 3/16 (inch)×sin 60°=0.1623798 inch or 4.124446 mm. The sheet is made of aluminum and optionally is coated with a high-friction material. The perforated sheet may be bonded to the top face of a honeycomb core while a second sheet is bonded to the bottom face of the honeycomb core to form a stiff panel.

Referring again to FIG. 3, the origin of the form board coordinate system is at the center of the lower-rightmost hole 6a that has a complete row of complete holes 6 to its left and a complete column of complete holes 6 above it. Depending on trimming of the perforated sheet material, partial rows and columns are possible. If any partials, prioritize placement tolerance to closest lower hole before closest left hole. The X-axis extends to the right from hole 6a (as indicated by arrow X in FIG. 3, whereas the Y-axis extends upward from hole 6a (as indicated by arrow Y in FIG. 3). This coordinate system is oriented similar to the form board computer-aided drawing coordinate system. Dimensions are expressed in millimeters within the automation system.

Figure 7:
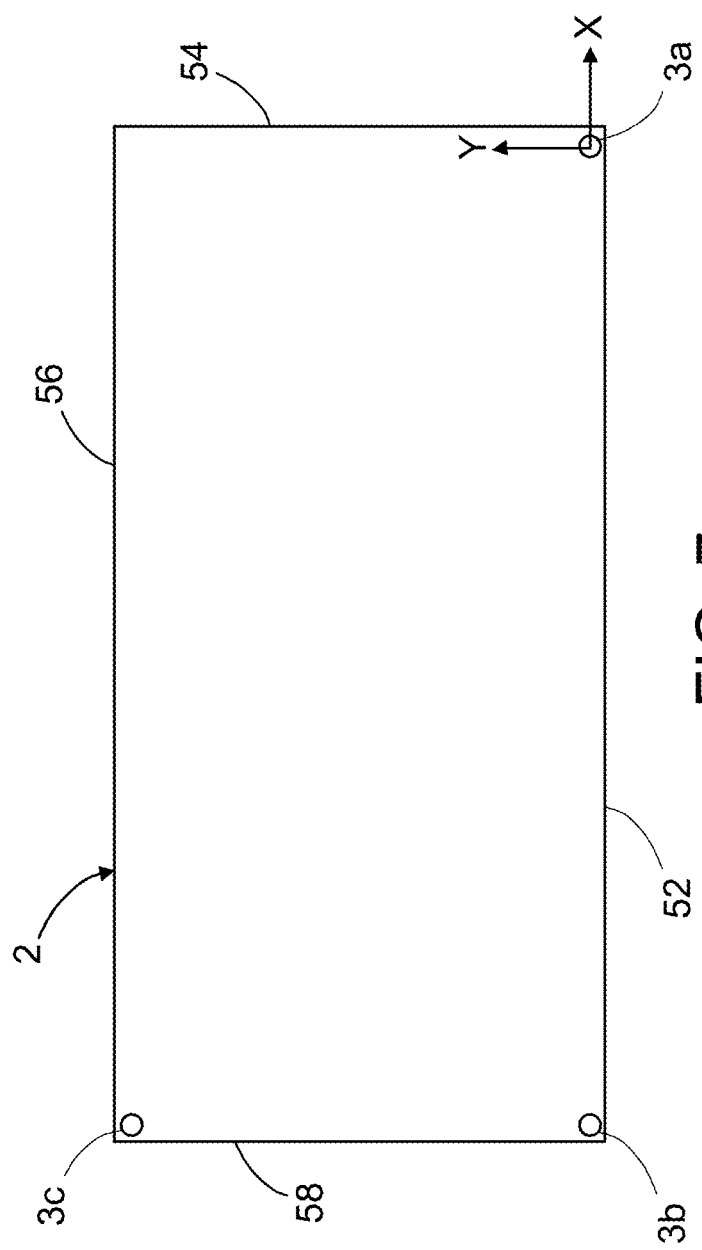
FIG. 7 is a diagram representing a plan view of a form board having markers positioned at three corners of the form board.

The form board described above is typically manufactured using a hole punching process that is not precisely held over the entire surface of the sheet from corner to corner. However, examination of multiple 4 ft×8 ft sheets showed that corner-to-corner hole position variation is within one hole diameter. Thus, a calibration process may be used to register the form board 2 to the robotic processing coordinate systems. In accordance with one embodiment, the features and process described in the following paragraphs are used each time a form board 2 is used within a robotic work cell:

FIG. 7 is a diagram representing a plan view of a rectangular form board 2 having a long lower edge 52, a short right edge 54, a long upper edge 56 and a short left edge 58. To assist in the calibration process, three corner markers 3a-3c are positioned at respective corners of the form board 2. In accordance with one proposed implementation, the three corner markers 3a-3c have an easily distinguishable color, such as yellow. For different form board sizes, the corner markers 3a-3c are respectively inserted within holes located at the hole positions shown in the table below.

| Board | Hole counts from lower right hole to upper left hole | |
|---|---|---|
| Size | X-axis | Y-axis |
| 4' × 8' | 507 holes = ~2414.59 mm | 292 hole rows = ~1204.34 mm |
| 3' × 8' | 507 holes = ~2414.59 mm | 215 hole rows = ~886.75 mm |
| 2' × 3' | 184 holes = ~876.30 mm | 138 hole rows = ~569.17 mm |

If a perforated sheet with different hole spacing is used, the resulting hole dimensions would also be different.

In accordance with one embodiment, each of the corner markers 3a-3c is a yellow plastic peg bonded within the sheet metal hole. This peg is cut flush with the surface of the form board 2. Each new form board will be evaluated to ensure that the upper-leftmost hole specified in the table above is positioned within 3 mm of the coordinates specified in the table.

During form board preparation, the form board 2 is physically positioned and fixed in the robot working area by indexing the form board's lower edge 52 to two fixed positioning features in the work area and by indexing the form board's right edge 54 to one fixed positioning feature in the work area. A robot (not shown in the drawings) uses a robot-mounted vision system to find the three yellow corner markers 3a-3c. If a paper form board drawing is on the form board 2, the drawing's corners may be trimmed as necessary to allow complete visibility of the yellow pegs.

The computer system that controls the robot then compares the marker position in robot coordinates to the theoretical position in the table above to determine the position of the form board's field of holes 6 in the robot coordinate system, and calculates X and Y scaling factors for the form board 2. The corner marker 3a is inserted in hole 6a, the center of which is the origin of the form board coordinate system (X=0, Y=0). The corner marker 3b is used to define the line of the X-axis (in the negative direction). The corner marker 3c is used to scale the board hole pattern in X and Y dimensions. If a paper drawing covers the form board 2, the robot system is then expected to begin processing the board, with no further use of the vision system. If no paper drawing covers the form board 2, the robot system may use a vision system to fine tune the location of each hole 6 just prior to inserting a form board device 4 into the hole.

If the hole pattern is too inconsistent (e.g., wavy) over the surface of form board 2, additional yellow markers can be positioned, for example, approximately every 12 inches, to provide additional intermediate calibration points. The robot system then only needs to interpolate within, for example, each 12×12 inch region.

The calibration results are stored as digital data in a form board configuration file. In accordance with one proposed implementation, a comma-separated values (CSV) file is used to define configurations for each form board configuration dataset. In computing, a CSV file is a delimited text file that uses a comma to separate values. A CSV file stores tabular data (numbers and text) in plain text. Each line of the file is a data record. Each record consists of one or more fields, separated by commas.

The form board configuration file defines the form board size, the types of form board devices 4 to be loaded on the form board 2, along with the locations of the devices. As used herein, the term "location of a form board device" means the position and orientation of the form board device relative to the form board coordinate system. Form board devices 4 are placed on the form board 2 in the sequence recorded in the form board configuration file. This sequence, along with each device's pick angle, prevents the robot end effector from colliding with previously installed devices. Similarly form board devices 4 should be removed from the form board 2 in the reverse sequence.

Figure 8:
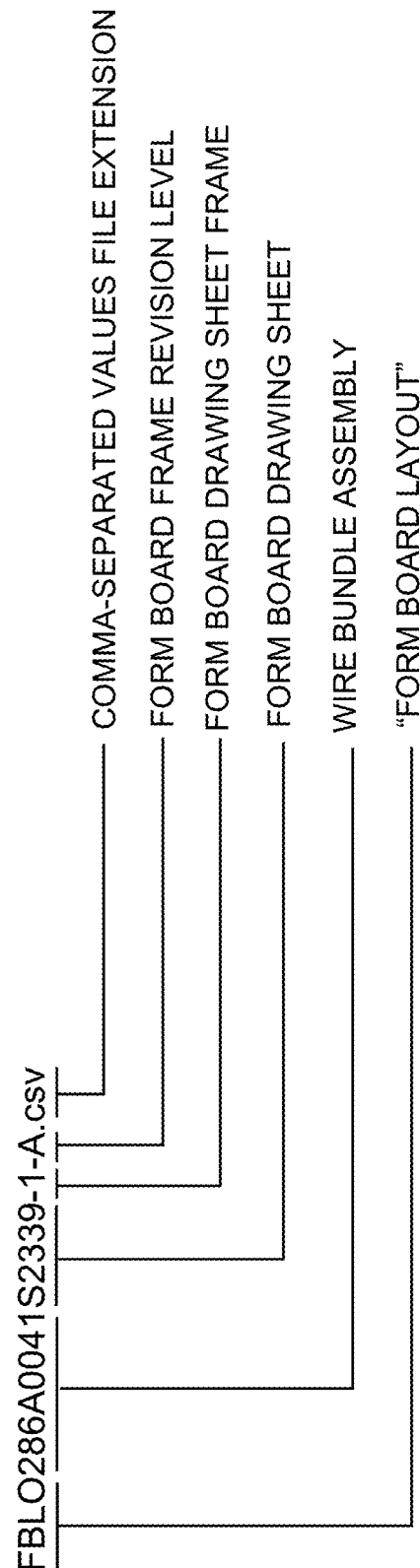
FIG. 8 is a diagram explaining the naming convention for form board configuration files.

In accordance with one example, the naming convention for the form board configuration file is as shown in FIG. 8. The first sequence of alphanumeric symbols (in this example, "FBLO") in the file name identifies the form board layout. The second sequence of alphanumeric symbols (in this example, "286A0041") in the file name identifies the wire bundle assembly. The third sequence of alphanumeric symbols (in this example, "S2339") in the file name identifies the form board drawing sheet. The fourth sequence of alphanumeric symbols (in this example, "−1") in the file name identifies the form board drawing sheet frame. The fifth sequence of alphanumeric symbols (in this example, "−A") in the file name identifies the form board frame revision level. The file extension ".csv" indicates that the data recorded in the file is formatted as comma-separated values.

In accordance with the example described in the immediately preceding paragraph, the first entry in the form board configuration file provides the form board drawing size. For example, the form board drawing sizes may include different sizes designated by different alphanumeric symbols. The remaining entries in the form board configuration file include the following specifications: (a) the type of form board device; (b) the X-Y coordinate position, in millimeters mm rounded to 1/1000 mm, of the hole in which the particular form board device is inserted (the coordinate positions of the form board devices are calculated with 7+ significant figures before rounding); (c) the device angle (orientation) of the form board device in degrees; and (d) the pick angle of 0, −90 or +90 degrees. As shown in FIG. 5, the device angle is defined as the angle from the device's X-axis to the form board's X-axis.

Automation technology is developed for robotically assembling form boards, routing wires, applying plastic wire ties, and cutting branches to final length. Because of high variability in wiring, these automation systems need to be automatically responsive to release and changes in engineering data. Thus, software has been developed that automatically generates robot control files, from engineering data, as described below.

Different wire bundles can be assembled on a reconfigurable form board of the type previously described. To enable rapid reconfiguration of the form board, a computer system is programmed to process engineering data to generate each form board configuration.

Figure 9:
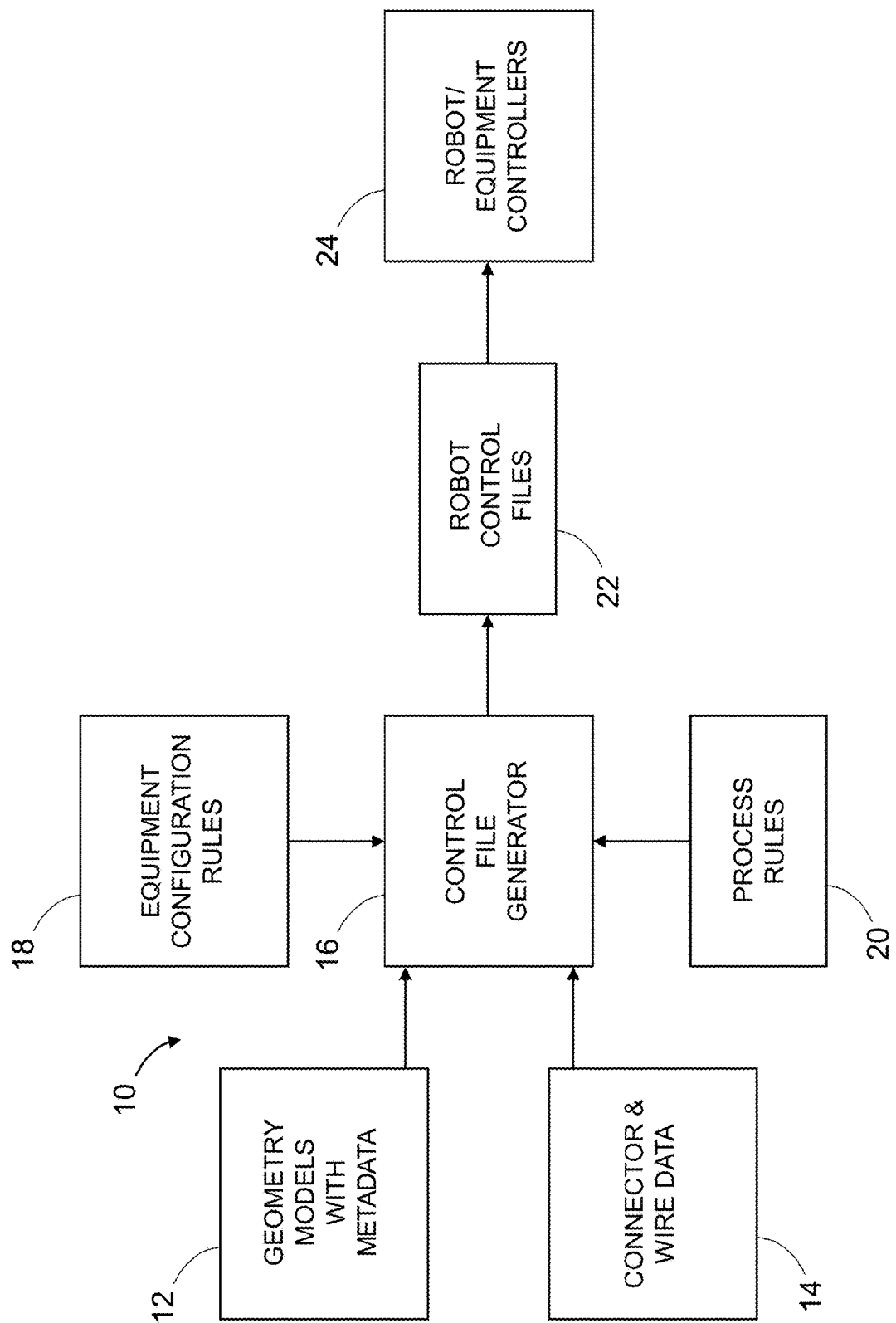
FIG. 9 is a flowchart identifying the sources of engineering data used to program a robot to perform automated placement of form board devices on a form board in accordance with a selected form board reconfiguration.

FIG. 9 is a flowchart identifying the sources of engineering data 10 used to program a robot to perform automated placement of form board devices on a form board in accordance with a selected form board reconfiguration. In accordance with one proposed implementation, the control file generator 16 is a computer system configured to generate robot control files 22 (CSV files) using the following sources of engineering data 10: form board geometry (e.g., CATIA) models with metadata 12; tabulated connector and wire data 14; equipment configuration rules 18 (CSV files), and process rules 20 (CSV files). The robot control files 22 (including the control files described in the next seven paragraphs) are sent to the robot/equipment controllers 24.

The form board layout control file is a comma-separated values file that identifies the form board size and lists each device on the form board, including its X-Y location, device angle, and pick angle. Devices are listed in the required assembly sequence. Devices shall be removed in the opposite sequence.

The manual form board preparation control file is a comma-separated values file that provides instructions for any devices that need to be installed manually on the form board. Devices are listed in the required assembly sequence. Devices shall be removed in the opposite sequence.

The wire laydown control file is a comma-separated values file that lists each wire to be assembled on the form board, including its wire type and routing path file name.

The routing path control file is a geometry file that defines the path of the tool center point of the wire-routing end effector (hereinafter "TCP path") for each from/to location on the form board. Separate files are also provided for wires that are to be inserted versus wires that are not to be inserted (because they have different starting points).

The wire tie control file is a comma-separated values file that lists each wire tie location for robotic installation, including the wire tie part number, its approach X-Y-Z position and angle, and its final application X-Y-Z position and angle. Ties are listed in the required assembly sequence.

The branch cut control file is a comma-separated values file that lists each branch cut location for robotic cutting, including the branch diameter, its approach X-Y-Z position and angle, and its final cut X-Y-Z position and angle.

The manual form complete control file is a comma-separated values file, along with a series of JPG image files, which provides final assembly instructions for manual completion of the forming process. Each instruction is provided in the required assembly sequence.

The automation system is comprised of robot end effectors, the form board, devices on the form board, fixtures that will hold the form board within robot work cells and the robot work cells themselves. The algorithms executed by the computer system during generation of the robot control files 22 take into account the geometries of the system components, which geometries are represented by geometry model with metadata 12.

One of the robot/equipment controllers 24 is configured to control the motion of the form board device pick-and-place end effector, so that the form board devices 4 identified in the form board configuration files are retrieved from inventory and placed on the form board 2 at the locations specified in the form board configuration files. In accordance with one proposed implementation, a calibration and camera system is used by the robot to find targeted holes in a form board for placement of form board devices 4. The algorithm targets specific holes in their spaced theoretical coordinate positions, but is configured to anticipate that any given form board device could be misplaced relative to the target hole by a specified margin of error, meaning that the robot end effector may successfully insert the device in the target hole even if the centerline of the temporary fastener of the device is misaligned with the center of the target hole by a distance within the margin of error.

As will be described in more detail below, the form board devices 4 to be placed on the form board 2 may be of various types, including support devices to hold connectors on the form board, wire routing devices to limit lateral displacement of the wires to be routed on the form board, and wire end holders to temporarily hold the ends of wires until later insertion into a connector.

In addition, the automated system proposed herein includes a pick-and-place end effector that is constructed and programmed to install a multiplicity of form board devices in a predetermined sequence. The pick-and-place end effector operates in accordance with instructions received from a robot controller and is configured to pick and place form board devices 4 onto and off from the form board 2 by using the temporary fastener 34 (e.g., see FIG. 4) integrated into each form board device 4. The pick/place end effector can pick each device from one of three angles (0, +90 and −90 degrees).

At the start of a device installation procedure, the pick/place end effector is controlled to move to whichever one of a plurality of storage devices has the correct type of form board device 4 to be installed next on the form board 2. The pick-and-place end effector picks up a device 4 and carries it to the target position on the form board 2. In one embodiment, the pick-and-place end effector has a pair of gripper fingers designed to grip the device 4. The pick-and-place end effector may be integrated onto a robotic arm or gantry with a vision system that recognizes the device 4, thereby enabling the robot arm to be properly aligned when attempting to pick up the device 4. Pick and place vision systems are commercially available off the shelf and could be adapted to grip a particular type of device 4. In the alternative, the pick-and-place end effector may be designed to pick and place different types of devices 4. The pick-and-place end effector is intended to be used as a part of a form board assembly pick-and-place module that has been integrated into a fully automated system.

In addition, the pick-and-place end effector has a mechanism for operating the temporary fastener of the form board device. For the purpose of illustration, the operation of this mechanism will be described with reference to FIG. 4, which depicts a wire routing device 30a having a temporary fastener 34. First, the mechanism depresses the plunger 40 of the temporary fastener 34 while the temporary fastener 34 is aligned with the target hole in the perforated plate of the form board 2. Then the pick-and-place end effector lowers the wire routing device 30a until the extended locking pins 42 pass through the target hole. Release of the spring-loaded plunger 40 causes the locking pins 42 to retract, thereby locking the wire routing device 30a in place. The pick-and-place end effector then releases its grip on the wire routing device 30a and returns to storage to retrieve the next form board device.

The pick-and-place end effector may be adapted for coupling to a robotic arm or a gantry robot. A gantry robot consists of a manipulator mounted onto an overhead system that allows movement across a horizontal plane. Gantry robots are also called Cartesian or linear robots. The robotic arm may be part of a robot having multi-axis movement capabilities. The robot includes one or more positional sensors (not shown) at, or otherwise associated with, each of the pivots that provide positional data (X, Y, and Z in three-dimensional space) to the data acquisition system for accurately locating the form board devices. An example of a robot that could be employed with the pick-and-place end effector is robot Model KR-150 manufactured by Kuka Roboter GmbH (Augsburg, Germany), although any robot or other manipulator capable of controlling the position of the device 4 in the manner disclosed herein. The term "gantry/robot arm" will be used herein to mean a robot of either type having a robot controller configured to move and control the pick-and-place end effector to perform the device pick-and-place operations disclosed herein. The pick-and-place end effector enables the device installation process to be fully automated. By automating this process, risks associated with the current manual process (repeatable quality, ergonomic issues, slower cycle times) are eliminated.

The required form board geometry is documented via a 2-D CATIA (Computer-Aided Three-dimensional Interactive Application) drawing, which is generated from a 3-D wire bundle model using wire bundle development CATIA functions. Wire bundles are designed according to geometric and electrical requirements. The CATIA drawing includes the following key geometry features: intended centerline of the final wire bundle; points at the front face of each wire connector, labeled with the connector's equipment identifier (this label also includes any required connector clocking information); points at the front face of mounting connectors; points at splice locations, labeled with a splice identifier; points at the start and end of each protective sleeve, labeled with a sleeve designator; and points at each colored marker location, labeled with the color of the marker.

The tabulated wire bundle data includes the following data for each wire bundle: bundle data, equipment data, and wire data. The bundle data includes airplane model, bundle number, dash number, and revision level. The equipment data includes connector equipment identifier, connector part number, connector clocking, back shell part number, temperature zone, vibration zone, pressure zone, and hydraulic zone. The wire data includes wire identifier, wire type, wire gauge, wire length, fabrication end, from/to end, and termination information (connector equipment identifier, termination code).

All of the numerical values given in the CATIA drawing (e.g., device positioning dimensions) are assigned parameter names. These names are stored in a design rules file and software tools make them readily editable.

In a typical procedure for preparing a form board, an operator inserts the form board 2 into a form board preparation cell, informs the system of the "old" configuration of the form board 2 (e.g., by scanning a barcode on the form board) and informs the system of the "new" configuration of the form board 2 (e.g., by scanning a barcode on a paper work order). The robot system then removes form board devices 4 from the old configuration using a form board layout control file in reverse, and then installs additional form board devices 4 onto the form board 2 in the new configuration using the form board layout control file. As previously described, the form board layout control files are comma-separated values files which include the form board size and lists the identity of each device on the form board, including its X-Y position, device angle, and pick angle. Devices are listed in an order corresponding to the sequence in which the devices will be installed. Devices are removed in the opposite sequence.

For jobs involving manual installation, not automated installation of form board devices, the control file generator also generates a manual form complete control file. This CSV file, along with a series of JPG image files, provide final assembly instructions for manual installation of form board devices 4 in accordance with a particular wire bundle configuration. Each instruction is provided in the required assembly sequence.

In accordance with some embodiments, the form board devices 4 are configured to be picked up, carried, positioned, operated, and then inserted in a form board 2 using the above-described pick-and-place end effector. FIGS. 10 through 13 are diagrams representing three-dimensional views of respective wire routing devices having elastic routing clips of different sizes.

Figure 10:
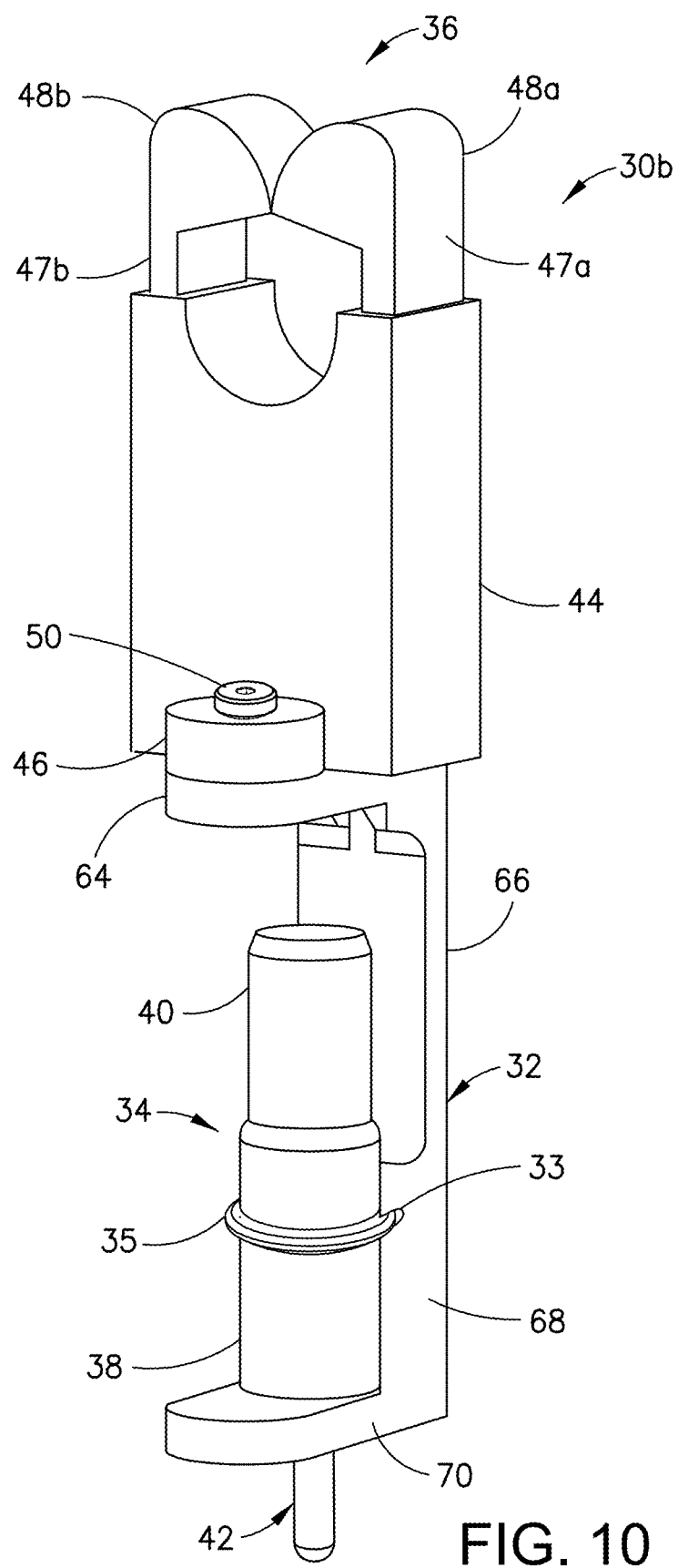
Figure 10A:
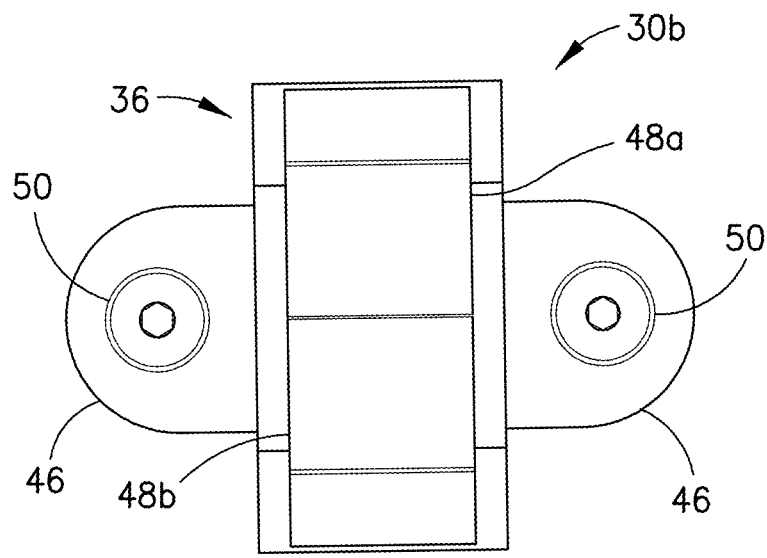
FIG. 10A is a diagram representing a top view of the wire routing device depicted in FIG. 10.
Figure 10B:
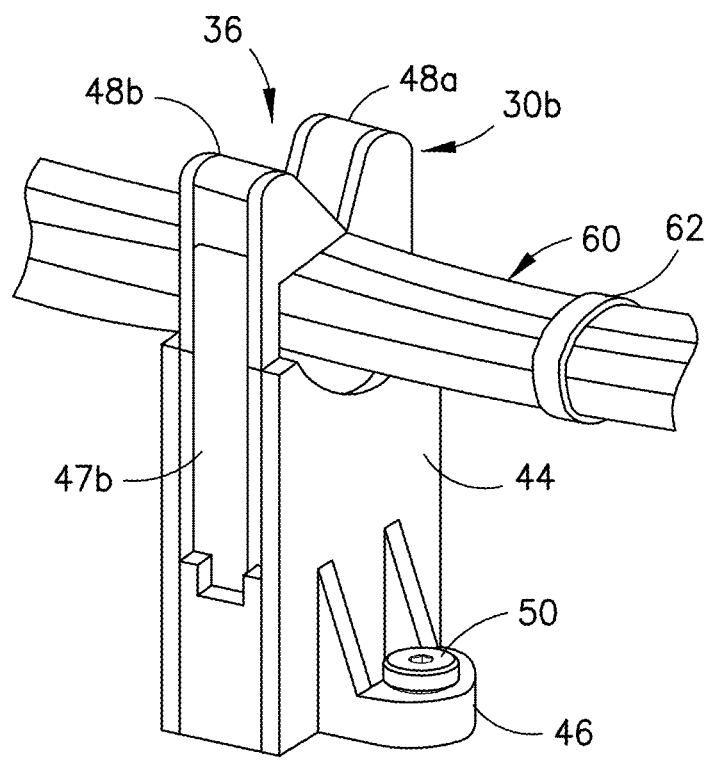
FIG. 10B is a diagram representing a three-dimensional view of the wire routing device depicted in FIG. 10 having a wire bundle passed through the routing clip.

FIG. 10 shows a wire routing device 30b comprising a small-sized routing clip 36 designed to form wire bundles having a diameter of no more than 0.5 inch. The description of wire routing device 30a set forth above with reference to FIG. 4 is equally applicable to the wire routing device 30a shown in FIG. 10. Similar elements depicted in FIGS. 4 and 10 bear the same reference numerals. FIG. 10A is a top view of wire routing device 30b depicted in FIG. 10. Unlike in FIG. 10, both mounting flanges 46 and both screws 50 are visible in FIG. 10A. FIG. 10B shows a wire bundle 60 comprising a multiplicity of wires surrounded by a plastic tie 62.

FIG. 11 shows a wire routing device 30c comprising a medium-sized routing clip 36 designed to form wire bundles having a diameter of no more than 0.75 inch. The description of wire routing device 30a set forth above with reference to FIG. 4 is equally applicable to the wire routing device 30c shown in FIG. 11. FIG. 11A is a top view of the wire routing device 30c depicted in FIG. 11.

Figure 12:
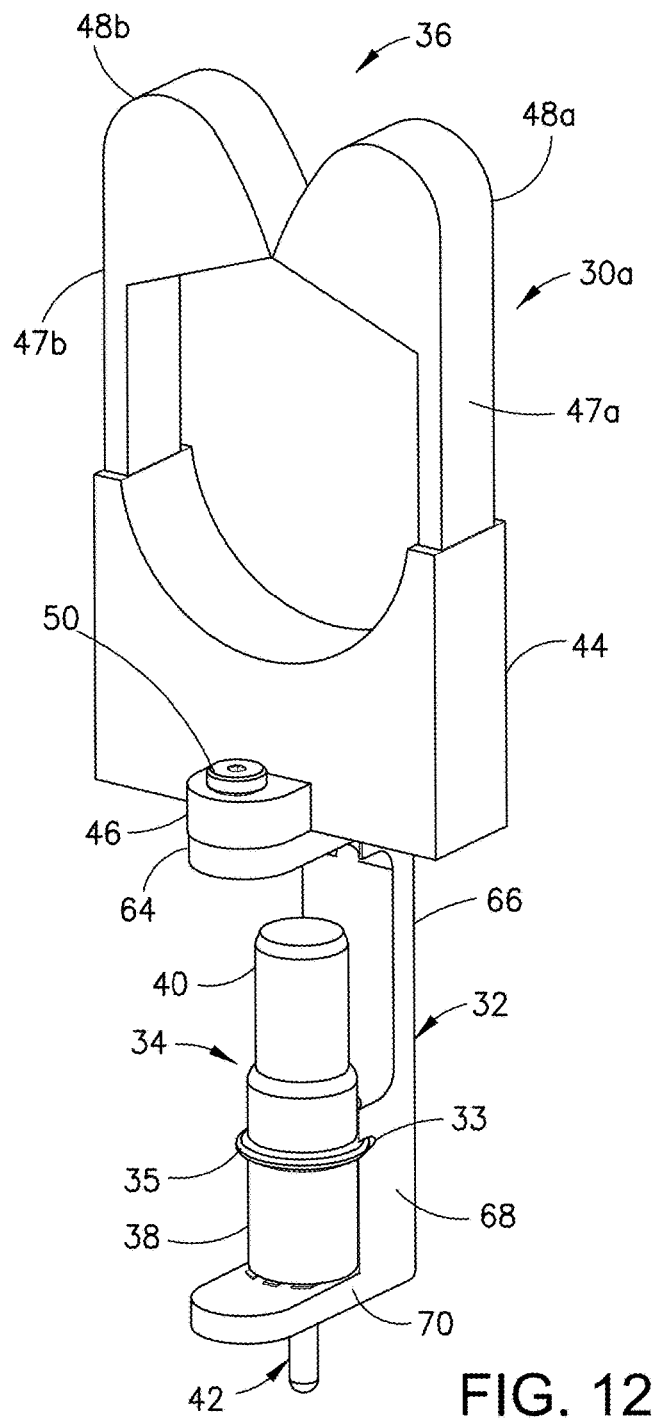
Figure 12A:
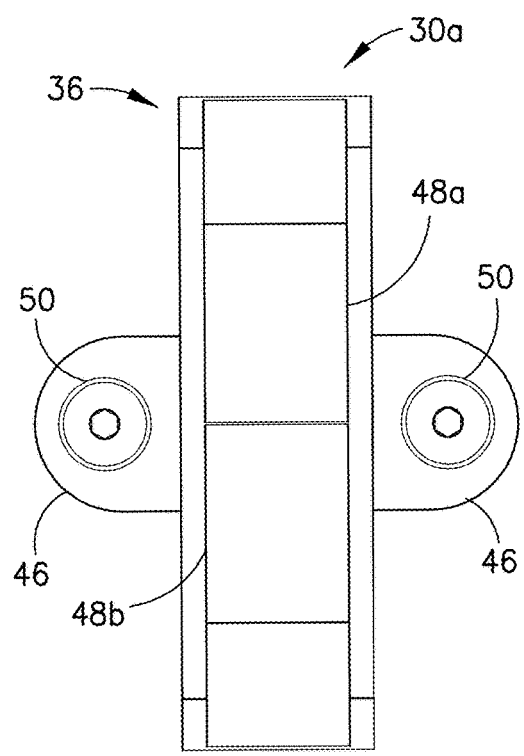
FIG. 12A is a diagram representing a top view of the wire routing device depicted in FIG. 12.

FIG. 12 shows a wire routing device 30a (previously shown in FIG. 4) comprising a large-sized routing clip 36 designed to form wire bundles having a diameter of no more than 1.25 inch. FIG. 12A is a top view of wire routing device 30a depicted in FIGS. 4 and 12.

Figure 13:
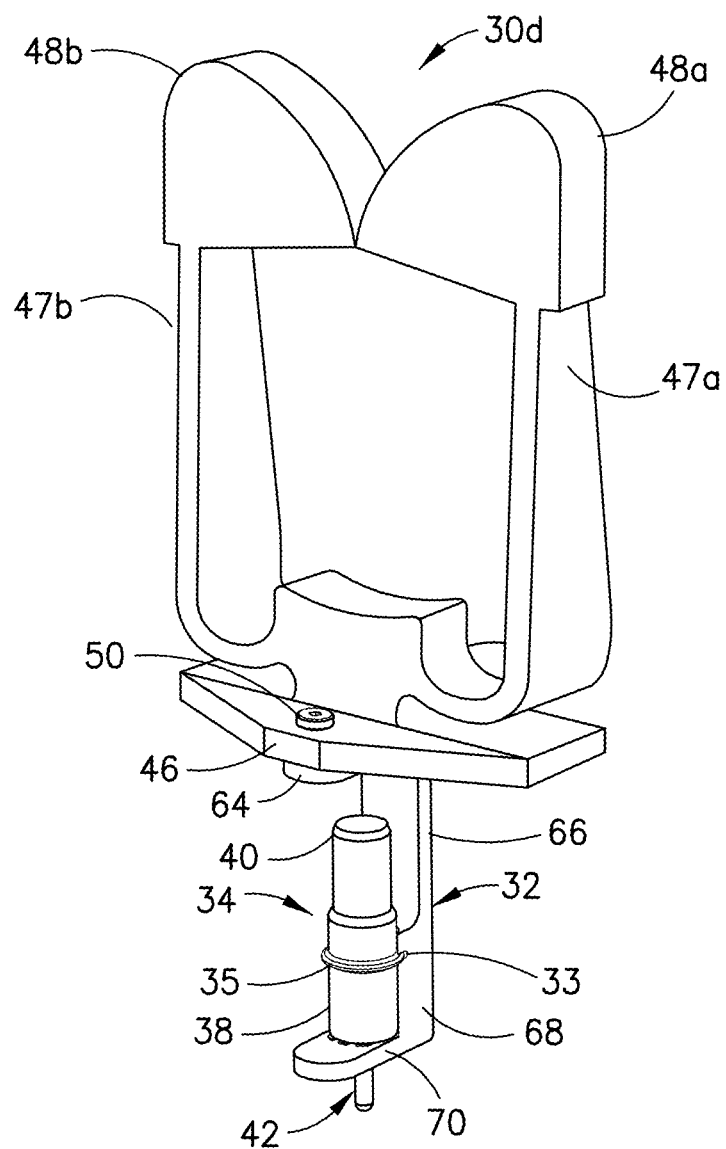
Figure 13A:
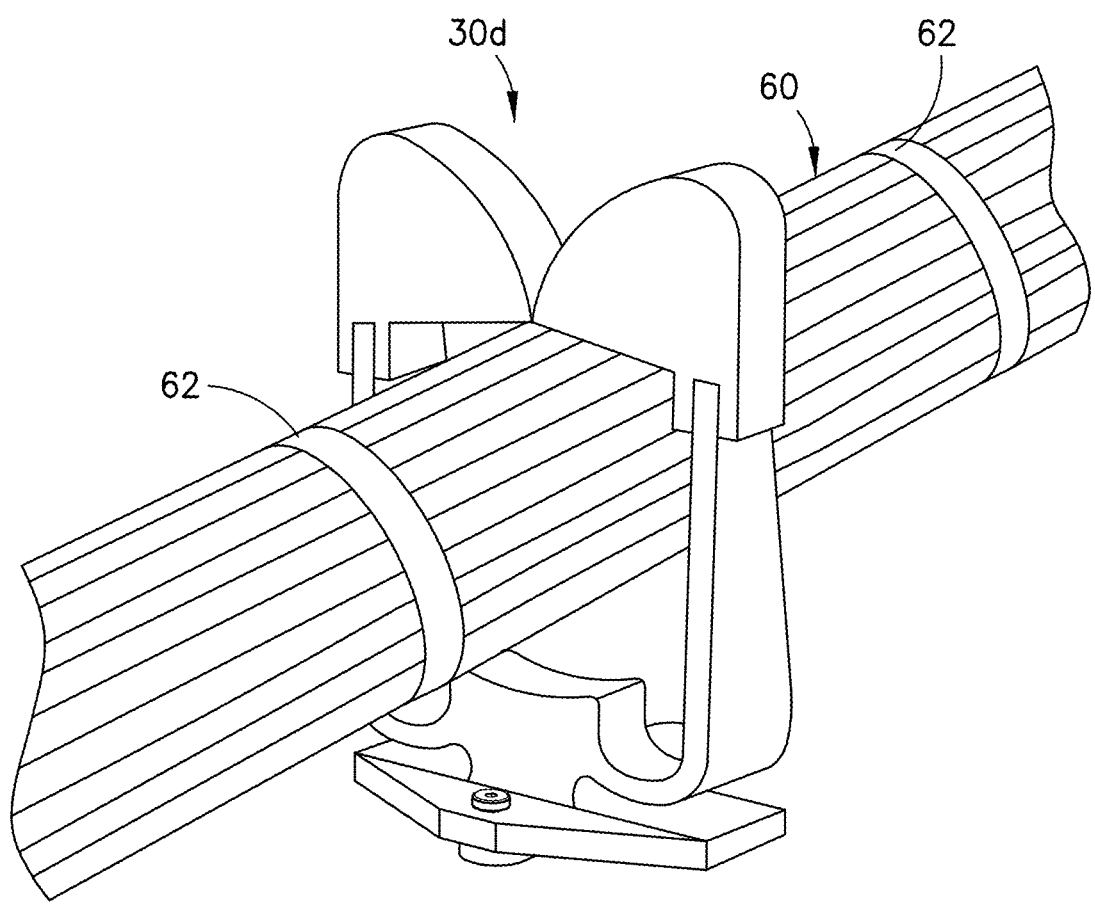
FIG. 13A is a diagram representing a three-dimensional view of the wire routing device depicted in FIG. 13 having a wire bundle passed through the routing clip.

FIG. 13 shows a wire routing device 30d comprising an extra-large-sized routing clip 36 designed to form wire bundles having a diameter of no more than 2.00 inch. The description of wire routing device 30a set forth above with reference to FIG. 4 is equally applicable to the wire routing device 30d shown in FIG. 13. FIG. 13A shows a wire bundle 60 comprising a multiplicity of wires surrounded by two plastic ties 62.

Figure 14:
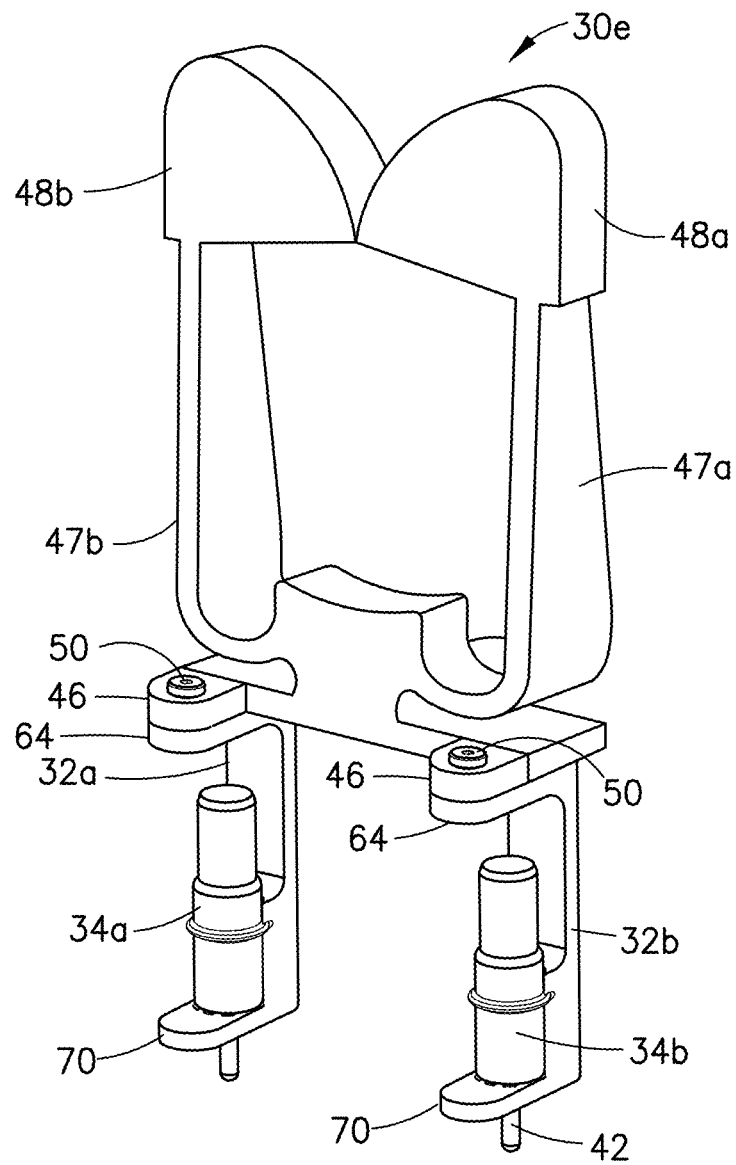
FIG. 14 is a diagram representing a three-dimensional view of a wire routing device having a routing clip equal in size to the routing clip of the wire routing device depicted in FIG. 13, but having two temporary fasteners.

FIG. 14 shows a wire routing device 30e which is similar to the wire routing device 30d depicted in FIG. 13, except that extra-large-sized routing clip 36 of wire routing device 30e is supported by two C-frames 32a and 32b and attached to a form board by two temporary fasteners 34a and 34c respectively mounted to C-frames 32a and 32b.

FIG. 15 is a diagram representing a three-dimensional view of a temporary fastener 34 mounted to a C-frame 32 in accordance with one proposed implementation. The temporary fastener 34 is configured to fasten the wire routing device 30a to a form board 2 by interacting with a hole 6. The temporary fastener 34 is attached to the lower arm 70 of the C-frame 32; the routing clip 36 (not shown) is attached to the upper arm 64 of the C-frame 32. The C-frame 32 further includes fastener retaining block 68 and vertical member 66 previously described. FIG. 15A is a diagram representing a top view of the subassembly depicted in FIG. 15. The upper arm 64 of the C-frame 32 has three threaded bores 74a-74c, which are used to fasten various devices (such as routing clips, posts, and wire end holders) to the C-frame 32. In the example depicted in FIG. 15A, the center of the threaded bore 74b is a first distance from the center of the threaded bore 74a and a second distance from the center of the threaded bore 74c. The second distance is greater than the first distance. In alternative embodiments, the first and second distances may be equal.

Figure 16:
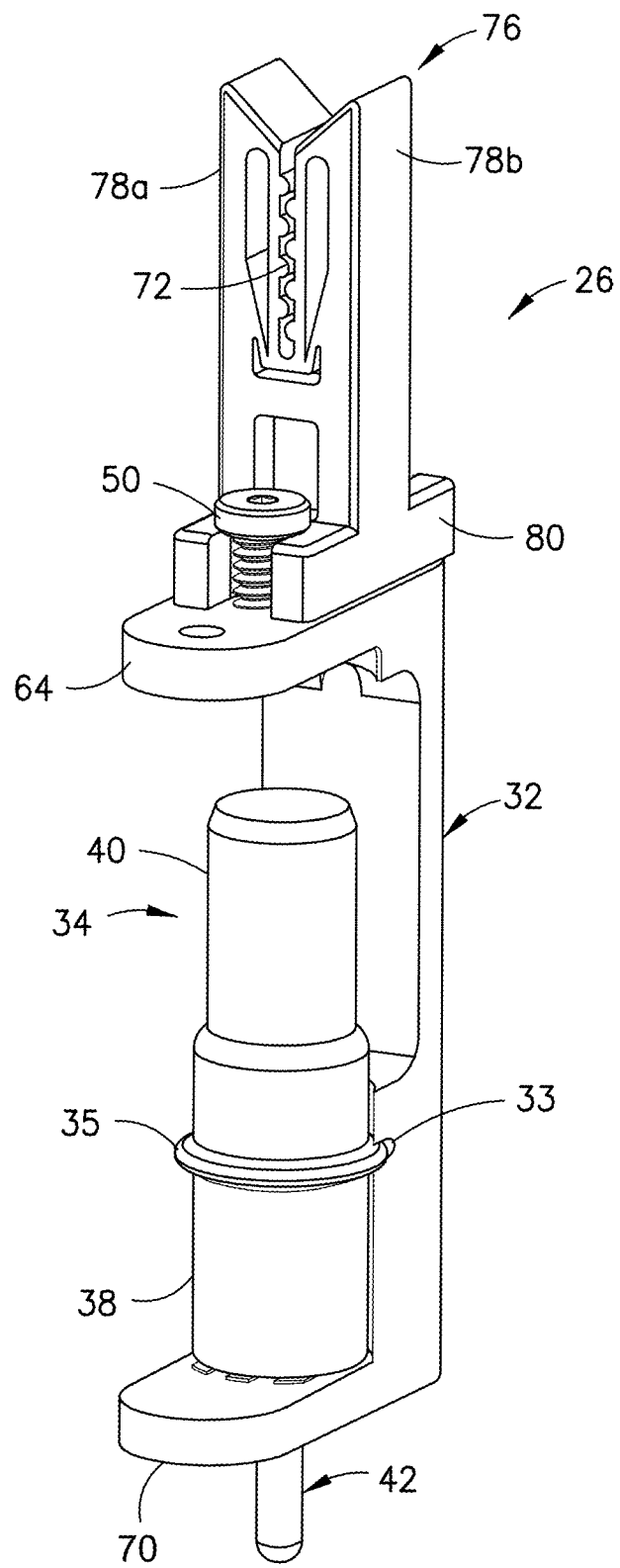
FIG. 16 is a diagram representing a three-dimensional view of a wire end holder in accordance with one embodiment.
Figure 16A:
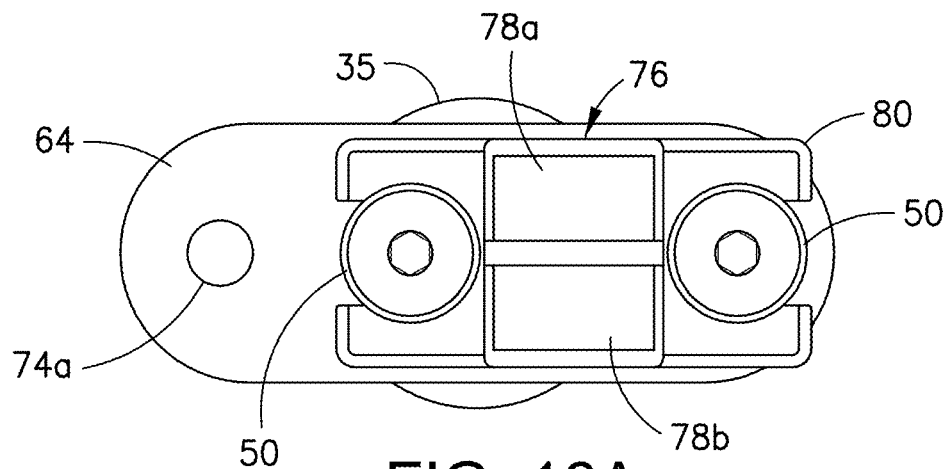
FIG. 16A is a diagram representing a top view of the wire end holder depicted in FIG. 16.
Figure 16B:
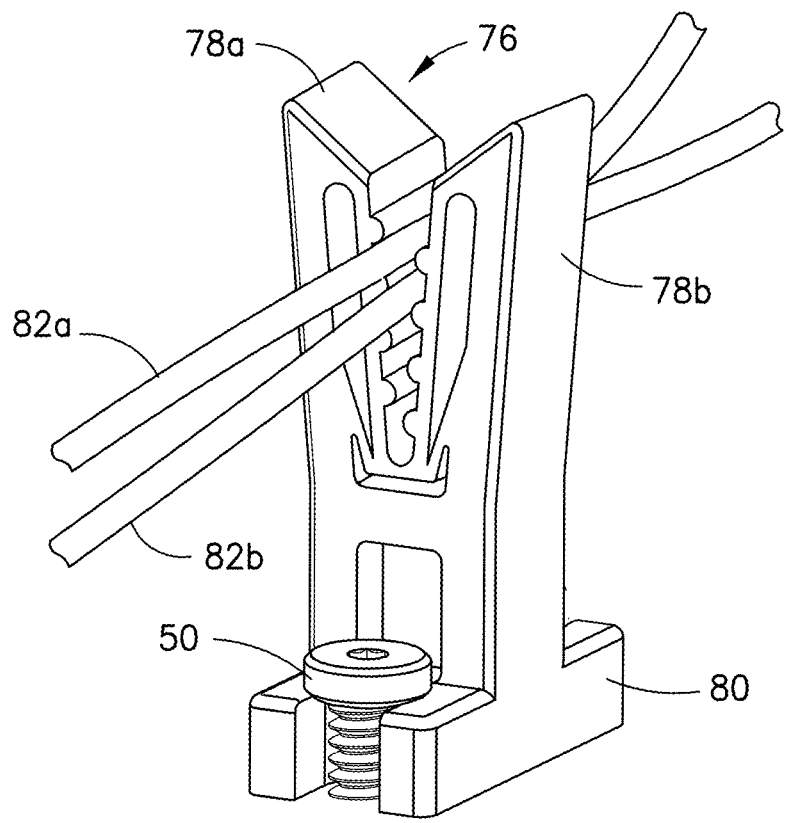
FIG. 16B is a diagram representing a three-dimensional view of the wire routing device depicted in FIG. 16 end portions of two wires.

FIG. 16 shows a three-dimensional view of a wire end holder 26 in accordance with one embodiment. The wire end holder 26 includes a C-frame 32, a temporary fastener 34 mounted to the lower arm 70 of the C-frame 32 and a wire clip 76 fastened to the upper arm 64 of the C-frame 32. The respective structures and respective functions of the C-frame 32 and temporary fastener 34 have been described above with reference to FIG. 4. The wire clip 76 includes a base 80 which is fastened to the upper arm 64 of the C-frame 32 by a pair of screws 50 (only one screw 50 is visible in FIG. 16). The wire clip 76 further includes a pair of prongs 78a and 78b having mutually confronting toothed surfaces 72 which interengage when the wire clip is closed and separate to form a gap when the wire clip is opened. In one proposed implementation, the base 80 and prongs 78a and 78b are integrally formed from a plastic material. The plastic material may be sufficiently flexible such that the prongs 78a and 78b separate when pushed apart by an object and then resiliently return to their respective normal positions when the object is removed. Thus, when the end(s) of one or more wires are inserted into the gap while the wire end holder 26 is temporarily fastened to a form board, the prongs 78a and 78b will maintain the position of the ends of the wires. Many commercially available off-the-shelf options are available. For example, wire end holder 26 may be a wire clip commercially available from Panduit Corp., Tinley Park, Ill. The material of the prongs 78a and 78b should be sufficient to hold the wires stationary. If an open-clip design is used (similar to what is shown in FIG. 16), the prongs 78a and 78b must have sufficient flexibility to allow the wire-routing end effector to push a wire into the wire clip 76. FIG. 16A shows a top view of the wire end holder 26 depicted in FIG. 16. FIG. 16B shows a three-dimensional view of a wire end holder 26 gripping respective end portions of two wires 82a and 82b.

FIG. 17 shows a wire routing device 30f having a single-post configuration 81 in accordance with one embodiment. The wire routing device 30f includes a C-frame 32, a temporary fastener 34 mounted to the lower arm 70 of the C-frame 32 and a post 84a having one end fastened to the upper arm 64 of C-frame 32 and extending vertically upward. In the example shown in FIG. 17, the post 84a has a circular cross section along its entire length with a varying diameter. FIG. 17A is a top view of the wire routing device 30f depicted in FIG. 17. The wire routing device 30f may be located on a form board 2 so that the post 84a is positioned at a place where the planned wire bundle configuration calls for one or more wires to bend, thus changing direction.

Figures 18, 18A:
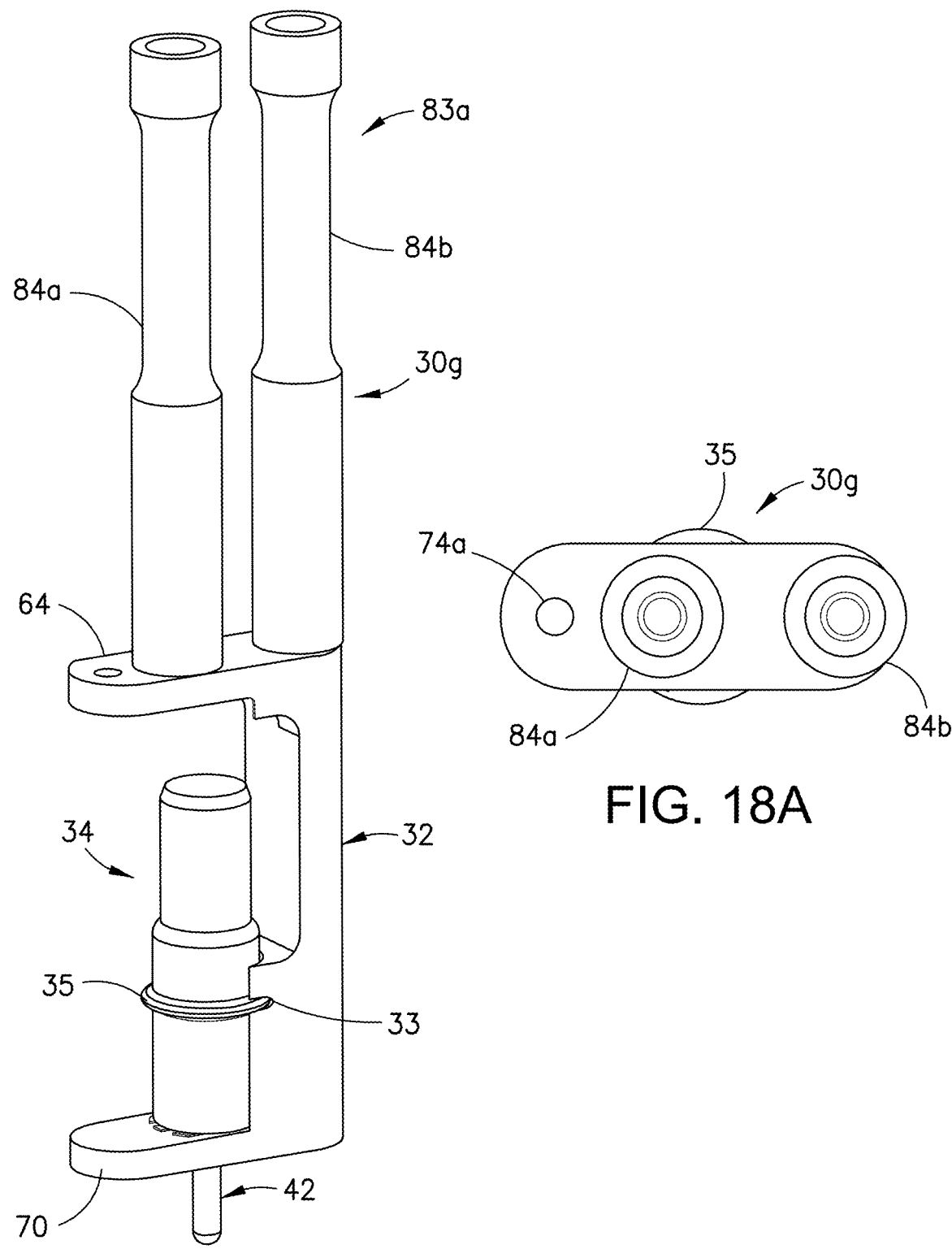
FIG. 18 is a diagram representing a three-dimensional view of a wire routing device having two posts separated by a gap having a first gap size in accordance with one embodiment.
FIG. 18A is a diagram representing a top view of the wire routing device depicted in FIG. 18.

FIG. 18 shows a double-post wire routing device 30g having a double-post configuration 83a in accordance with one embodiment. The wire routing device 30g includes a C-frame 32, a temporary fastener 34 mounted to the lower arm 70 of the C-frame 32 and two posts 84a and 84b separated by a first distance at the height where wires placed therebetween will be positioned during a wire bundle assembly procedure. Each of posts 84a and 84b has one end fastened to the upper arm 64 of C-frame 32 and extends vertically upward. In the example shown in FIG. 18, each of the posts 84a and 84b has a circular cross section along its entire length with a varying diameter. FIG. 18A is a top view of the wire routing device 30g depicted in FIG. 18.

Figures 19, 19A:
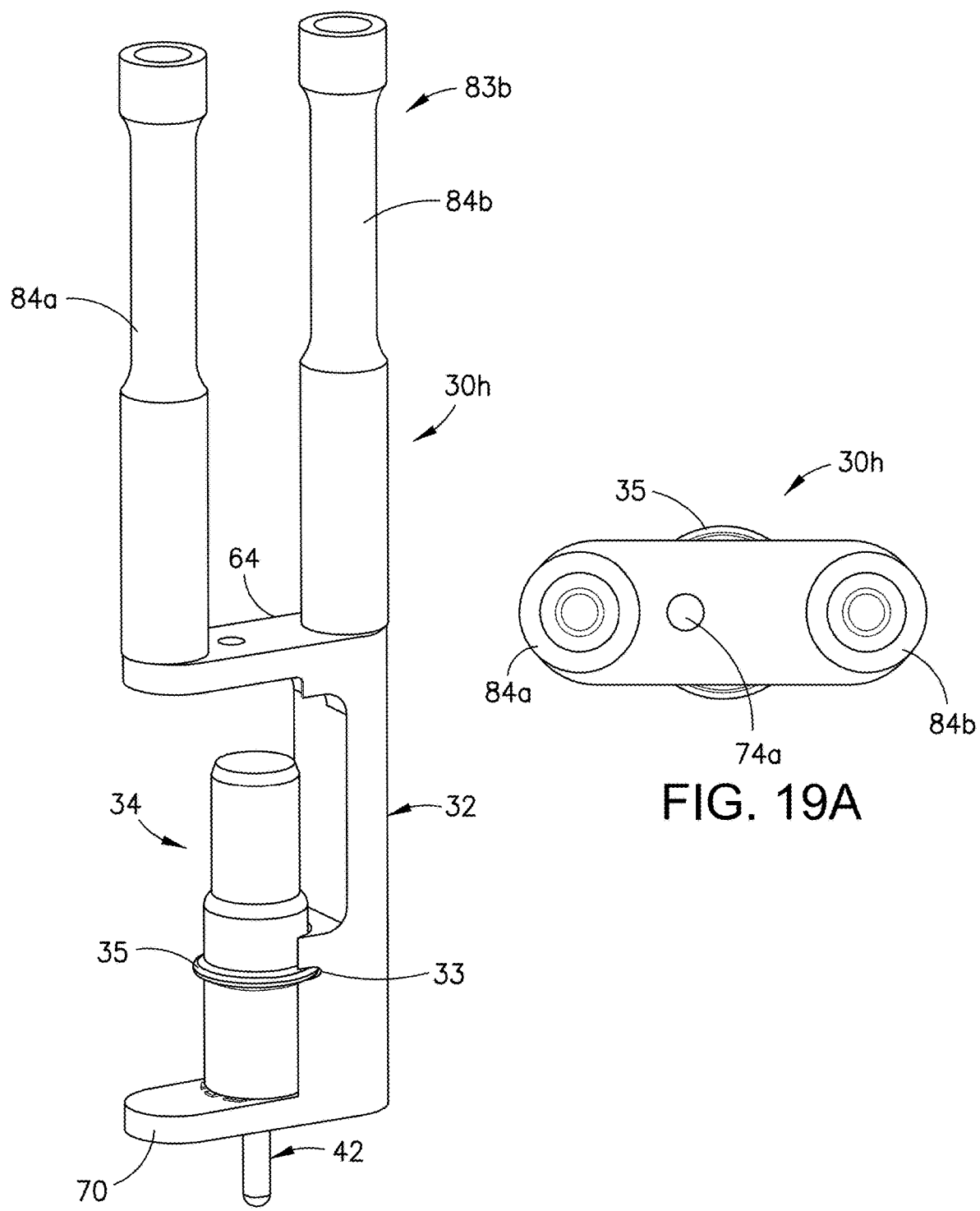
FIG. 19 is a diagram representing a three-dimensional view of a wire routing device having two posts separated by a gap having a second gap size greater than the first gap size in accordance with another embodiment.
FIG. 19A is a diagram representing a top view of the wire routing device depicted in FIG. 19.

FIG. 19 shows a double-post wire routing device 30h having a double-post configuration 83b in accordance with another embodiment. The wire routing device 30h includes a C-frame 32, a temporary fastener 34 mounted to the lower arm 70 of the C-frame 32 and two posts 84a and 84b separated by a second distance (greater than the first distance separating posts 84a and 84b of wire routing device 30g depicted in FIG. 18) at the height where wires placed therebetween will be positioned during a wire bundle assembly procedure. FIG. 19A is a top view of the wire routing device 30h depicted in FIG. 19.

Figure 20:
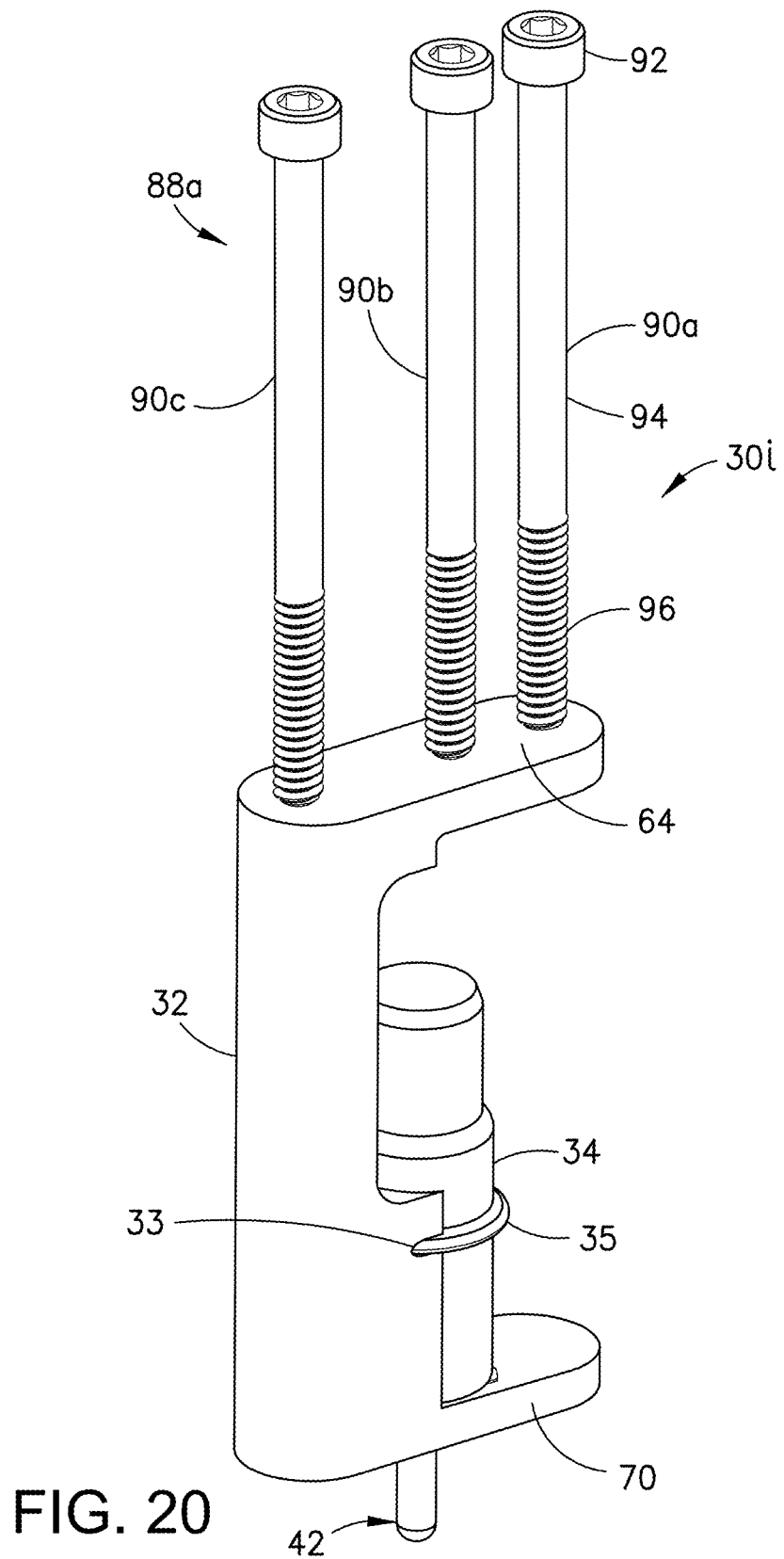
FIG. 20 is a diagram representing a three-dimensional view of a wire routing device having three posts in accordance with one embodiment in which the posts are aligned.

FIG. 20 shows a wire routing device 30i having a multi-post configuration 88a in accordance with another embodiment. (As used herein, "multi-post" means three or more posts.) The wire routing device 30i includes a C-frame 32, a temporary fastener 34 mounted to the lower arm 70 of the C-frame 32 and three mutually parallel posts 90a-90c respectively screwed into the threaded bores 74a-74c formed in the upper arm 64 of the C-frame 32 (depicted in FIG. 15A). Each post 90a-90c has a head 92, a shank 94 and a threaded end 96. This configuration effectively provides two gates for wires to pass through: one gate between posts 90a and 90b having a first width and another gate between posts 94b and 94c having a second width greater than the first width. In accordance with one embodiment, the axes of the posts 90a-90c are coplanar.

Figure 21:
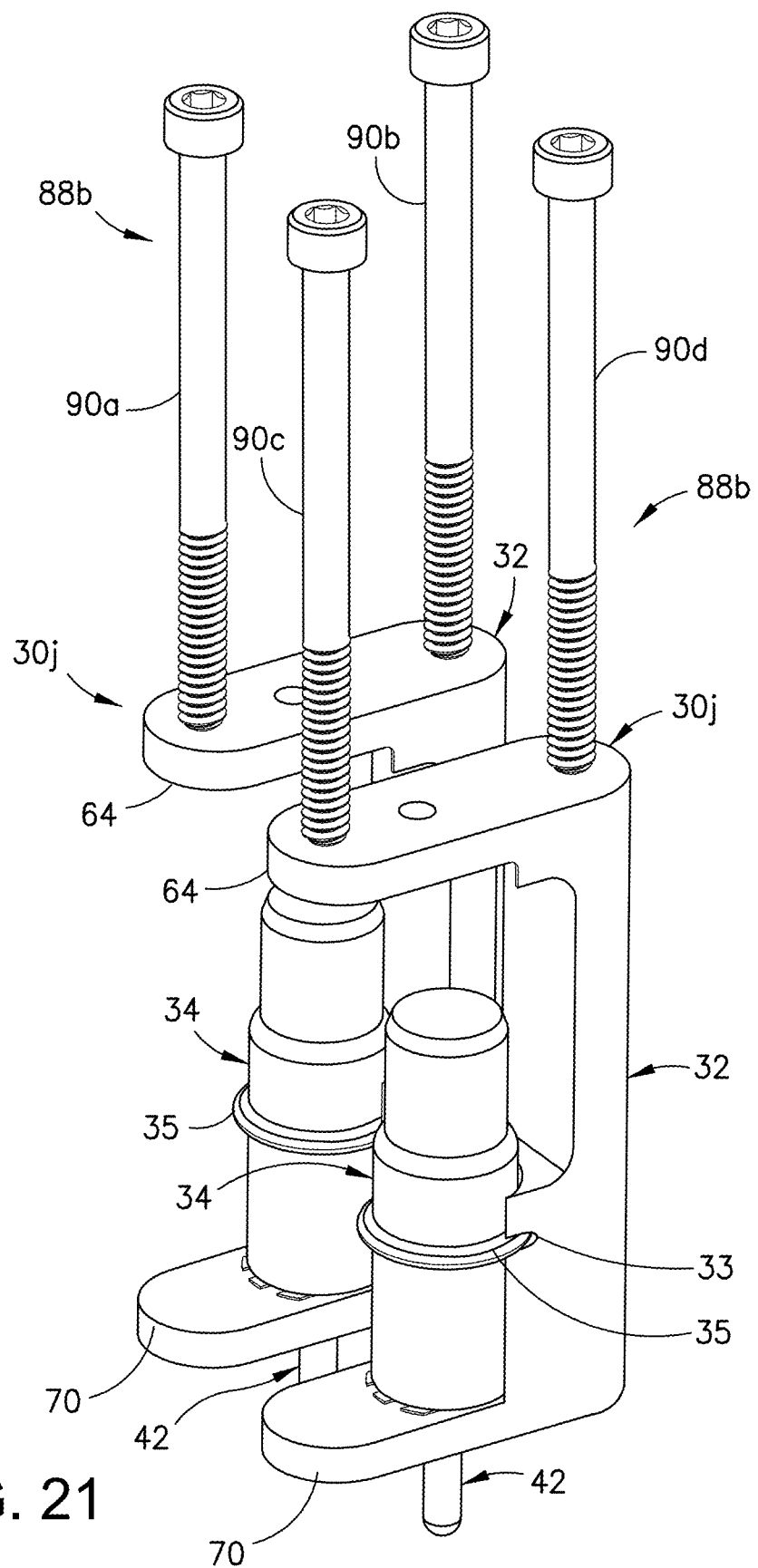
FIG. 21 is a diagram representing a three-dimensional view of two wire routing devices arranged side by side in a four-post configuration, each wire routing device having two posts.

FIG. 21 shows a pair of wire routing devices 30j that may be arranged side by side on a form board in a multi-post configuration 88b in accordance with another embodiment. Each wire routing device 30j includes a C-frame 32 and a temporary fastener 34 mounted to the lower arm 70 of the C-frame 32, as previously described. One wire routing device 30j has two posts 90a and 90b, while the other wire routing device has two posts 90c and 90d. When the two wire routing devices 30j are placed side by side separated by a distance as shown in FIG. 21, the multi-post configuration 88b creates respective gates in series: one gate between posts 90a and 90b and another gate between posts 90c and 90d. These gates arranged in series enable wires to pass through both gates. In one proposed implementation, the axes of the posts 90a and 90b are separated by a distance, the axes of the posts 90a and 90b are separated the same distance, and the two wire routing devices 30j are fastened to a form board at respective locations so that the four axes of posts 90a-90d are positioned at the four vertices of a rectangle.

Figure 22:
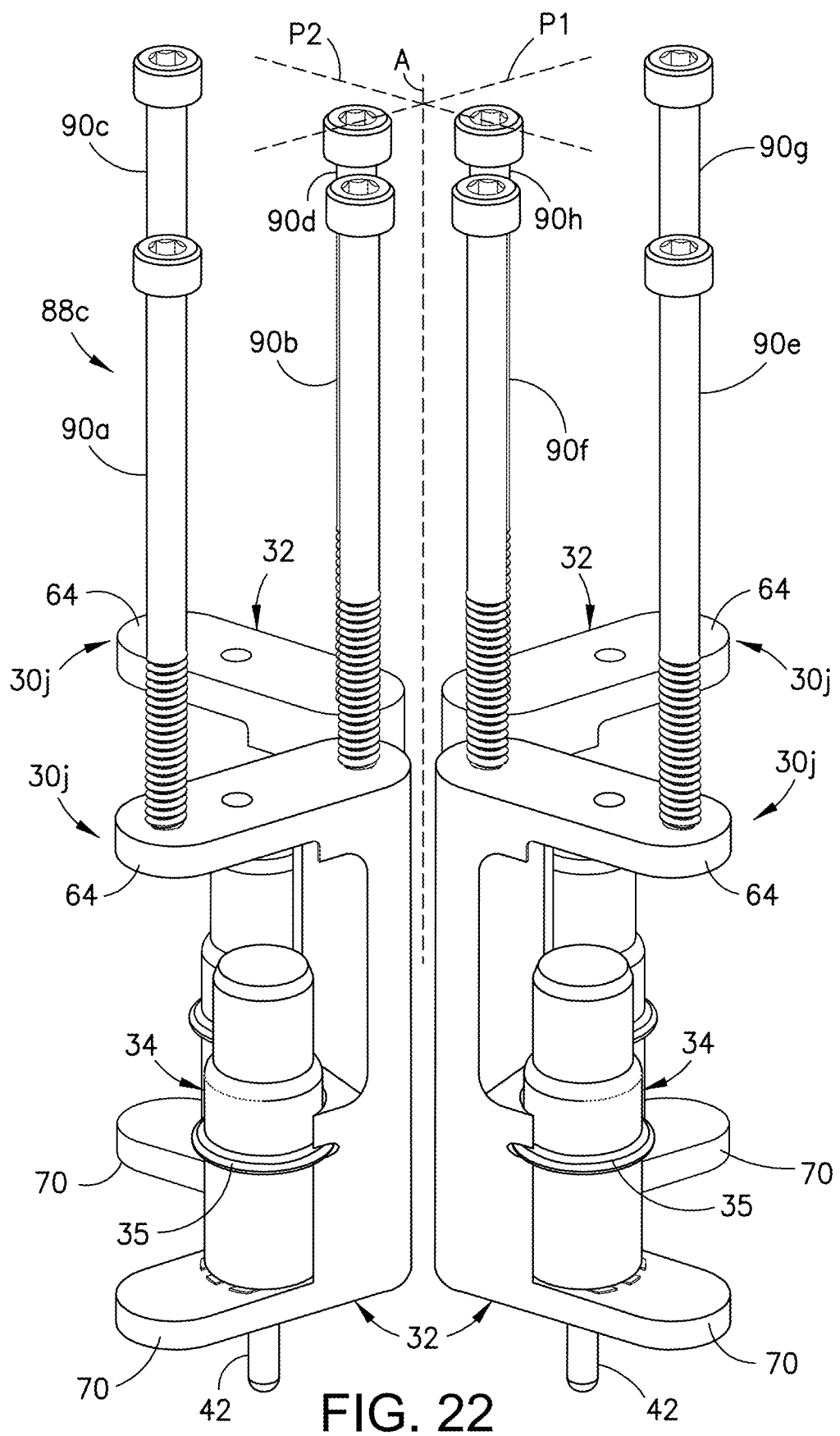
FIG. 22 is a diagram representing a three-dimensional view of four wire routing devices arranged in an eight-post configuration, each wire routing device having two posts.

FIG. 22 shows four wire routing devices 30j that may be arranged on a form board in a multi-post configuration 88c in accordance with another embodiment. The four wire routing devices 30j are arranged such that two devices are aligned with a vertical plane P1 and the other two devices are aligned with a vertical plane P2 perpendicular to vertical plane P1. (As used herein, the term "vertical" means perpendicular to the X-Y plane of the form board.). The four wire routing devices 30j are distributed at right angles relative to the vertical axis A where vertical planes P1 and P2 intersect. Each wire routing device 30j includes a C-frame 32 and a temporary fastener 34 mounted to the lower arm 70 of the C-frame 32, as previously described. The first device has two posts 90a and 90b with respective axes separated by a first distance; the second device has two posts 90c and 90d with respective axes separated by the first distance; the third device has two posts 90e and 90f with respective axes separated by the first distance; and the fourth device has two posts 90g and 90h with respective axes separated by the first distance. In accordance with one embodiment, the axes of the posts 90b, 90d, 90f and 90h may be positioned at the vertices of a square having sides of length. In one proposed implementation, the length of each side of the square equals a second distance less than the first distance. In the example depicted in FIG. 22, the axes of posts 90a, 90b, 90h, and 90g lie in vertical plane P1, while the axes of posts 90c, 90d, 90f, and 90e lie in vertical plane P2. The result is that the gate between posts 90a and 90b and the gate between posts 90g and 90h lie in vertical plane P1, while the gate between posts 90c and 90d and the gate between posts 90e and 90f lie in vertical plane P2. In accordance with other embodiments, the vertical planes P1 and P2 are not mutually perpendicular. Nor do the distances separating the axes of the posts of each wire routing device 30j need to be the same. In accordance with yet other embodiments, the axes of the posts 90b, 90d, 90f, and 90h may be positioned at the vertices of a quadrilateral that is not a square.

Figure 23:
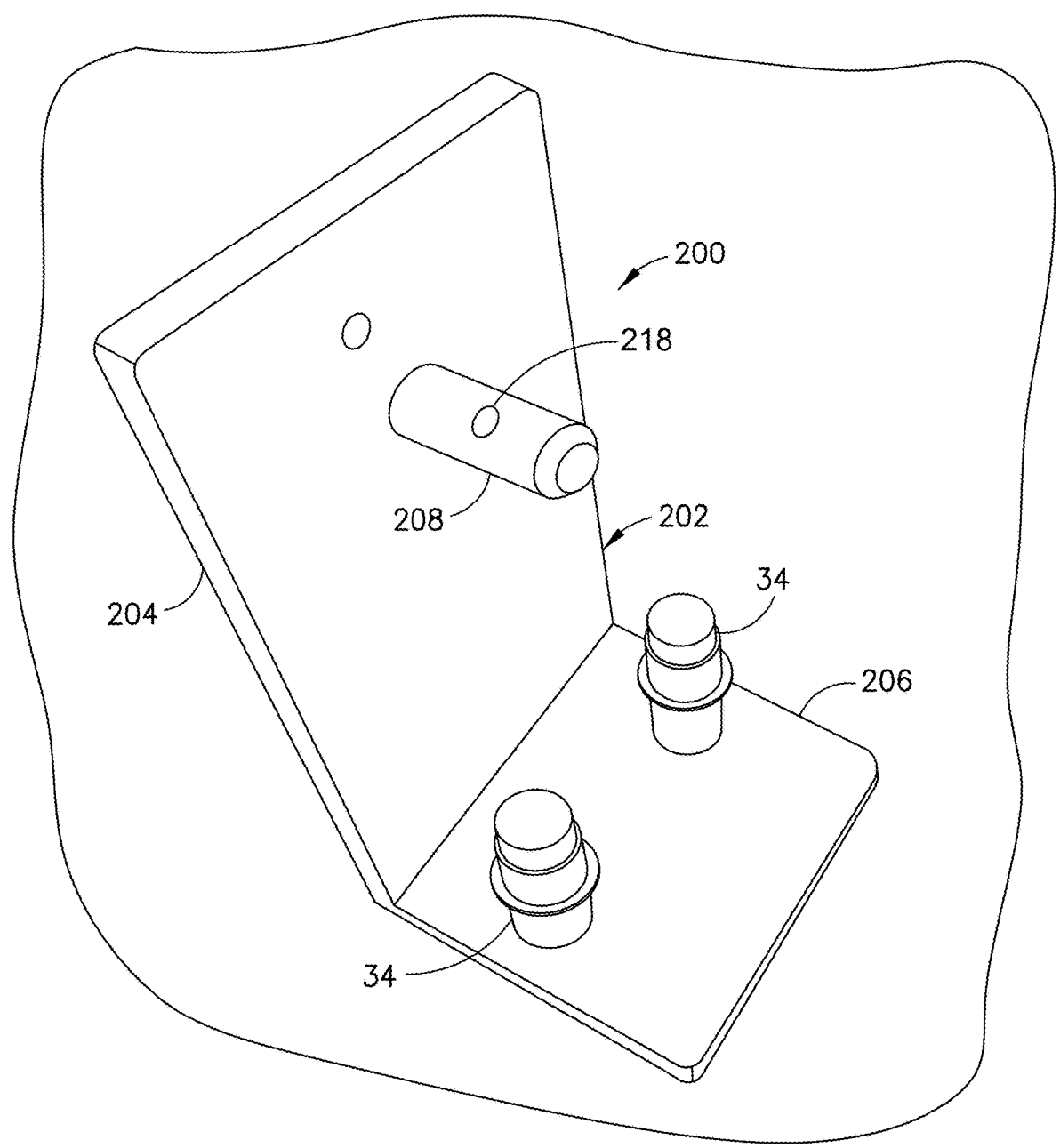
FIG. 23 is a diagram representing a three-dimensional view of a connector support device configured for robotic installation on a form board using a pair of temporary fasteners in accordance with one embodiment.

FIG. 23 is a diagram representing a three-dimensional view of a connector support device 200 configured for robotic installation on a form board in accordance with one embodiment. The connector support device 200 includes an L-shaped frame 202 having a base plate 206 and a vertical plate 204 perpendicular to the base plate 206. The connector support device 200 further includes two temporary fasteners 34 fastened to the base plate 206 and a detent pin 208 which is installed in a hole in the vertical plate 204. The detent pin 208 is a quick-release alignment pin with a solid shank and spring-loaded locking balls 218 (only one of which is visible in FIG. 23). The base plate 206 and vertical plate 204 may be integrally formed or welded together. The base plate 206 has two holes which receive the respective temporary fasteners 34. During form board preparation, the pick-and-place end effector carries the connector support device 200 to a position above a target location on a perforated plate of a form board (not shown in FIGS. 23-30 to avoid cluttering the diagrams with holes). Then the pick-and-place end effector of the robot concurrently depresses the plungers 40 of the two temporary fasteners 34 and moves the connector support device 200 toward a target location on the form board. The extended locking pins 42 of the two temporary fasteners 34 are respectively inserted into respective holes 6 in the perforated plate 8 of the form board 2. When the connector support device 200 is flush against the form board at the target location, the plungers 40 of the two temporary fasteners 34 are concurrently released, thereby clamping the connector support device 200 to the perforated plate 8 of the form board 2.

Figure 24:
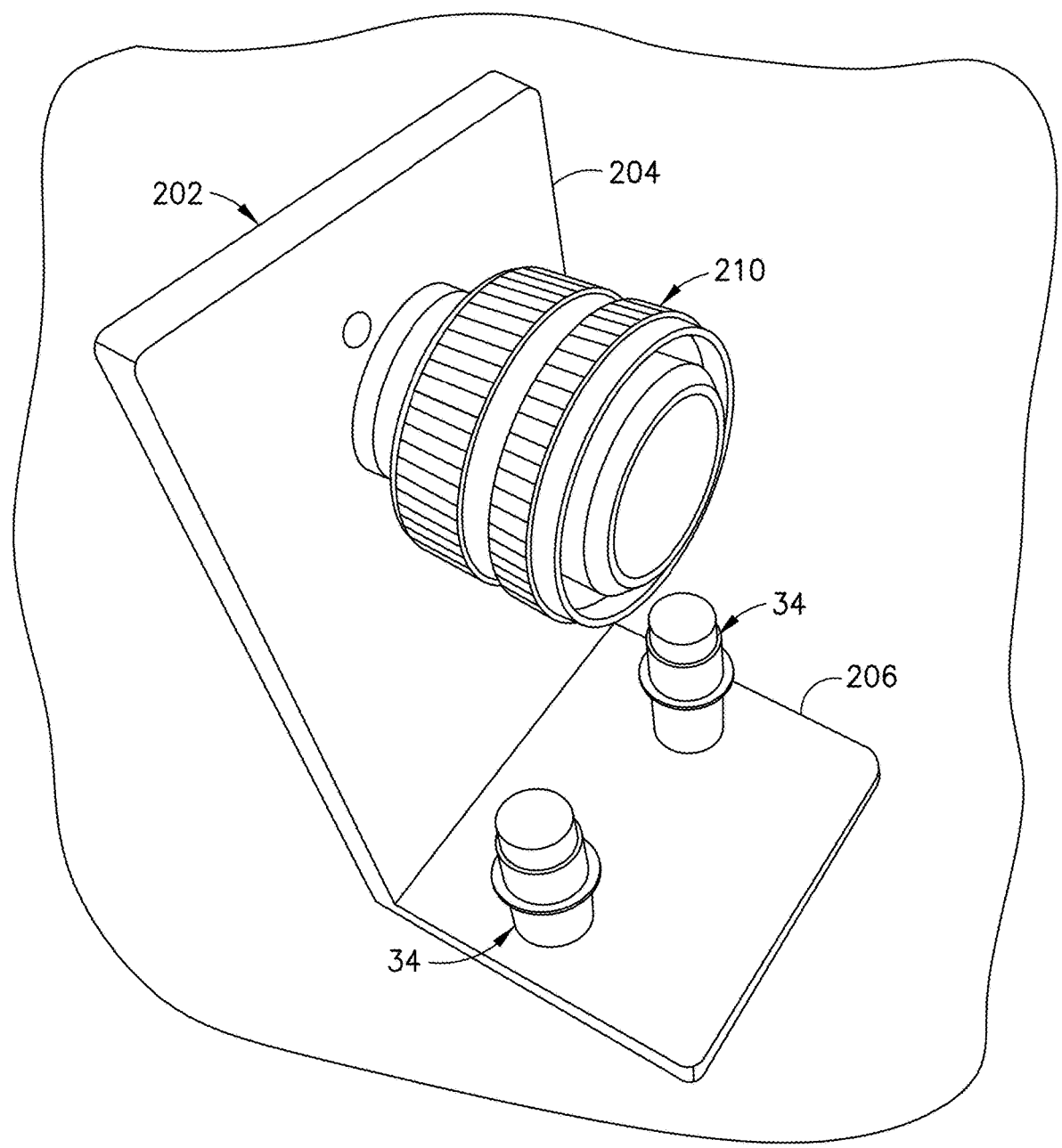
FIG. 24 is a diagram representing a three-dimensional view of a mounting connector mounted to the connector support device depicted in FIG. 23.

FIG. 24 shows a mounting connector 210 which has been slid onto the detent pin 208 (not visible in FIG. 24) by a connector installation end effector. The locking balls 218 on detent pin 208 (see FIG. 23) hold the mounting connector 210 on the detent pin 208 by spring force (not positive locking) until the mounting connector 210 is pulled off with sufficient force. Thus, the mounting connector 210 may be easily installed on and later removed by a robot equipped with an insertion end effector, the robot being programmed to respectively push the mounting connector 210 onto or pull the mounting connector 210 off of the detent pin 208. The connector installation end effector then retrieves a wire connector 212 (not visible in FIG. 24) and couples it to the mounting connector 210.

Figure 25:
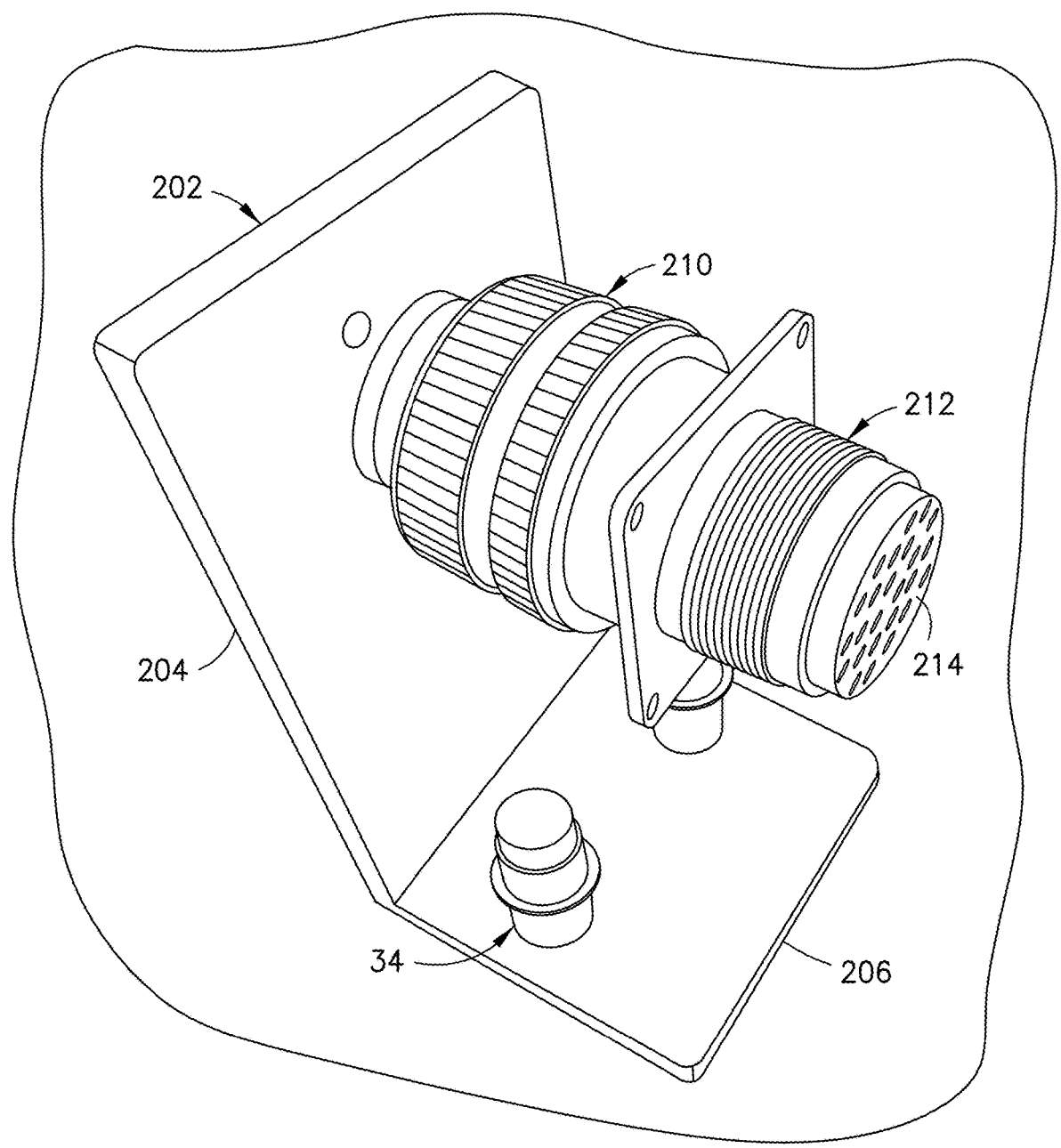
FIG. 25 is a diagram representing a three-dimensional view of a wire connector coupled to the mounting connector depicted in FIG. 24.

FIG. 25 shows the wire connector 212 coupled to the supported mounting connector 210. Typically, the wire connector 212 includes a mating shell which is mechanically coupled to the mounting connector 210. The wire connector 212 also includes a contact-receiving insert 214 having a multiplicity of spaced holes. The contact-receiving insert 214 is typically made of dielectric material. For a particular wire bundle configuration, the respective contacts of wires to be terminated at wire connector 212 are inserted into respective holes in contact-receiving insert 214 by a contact insertion end effector attached to the end of a robotic arm.

Figure 26:
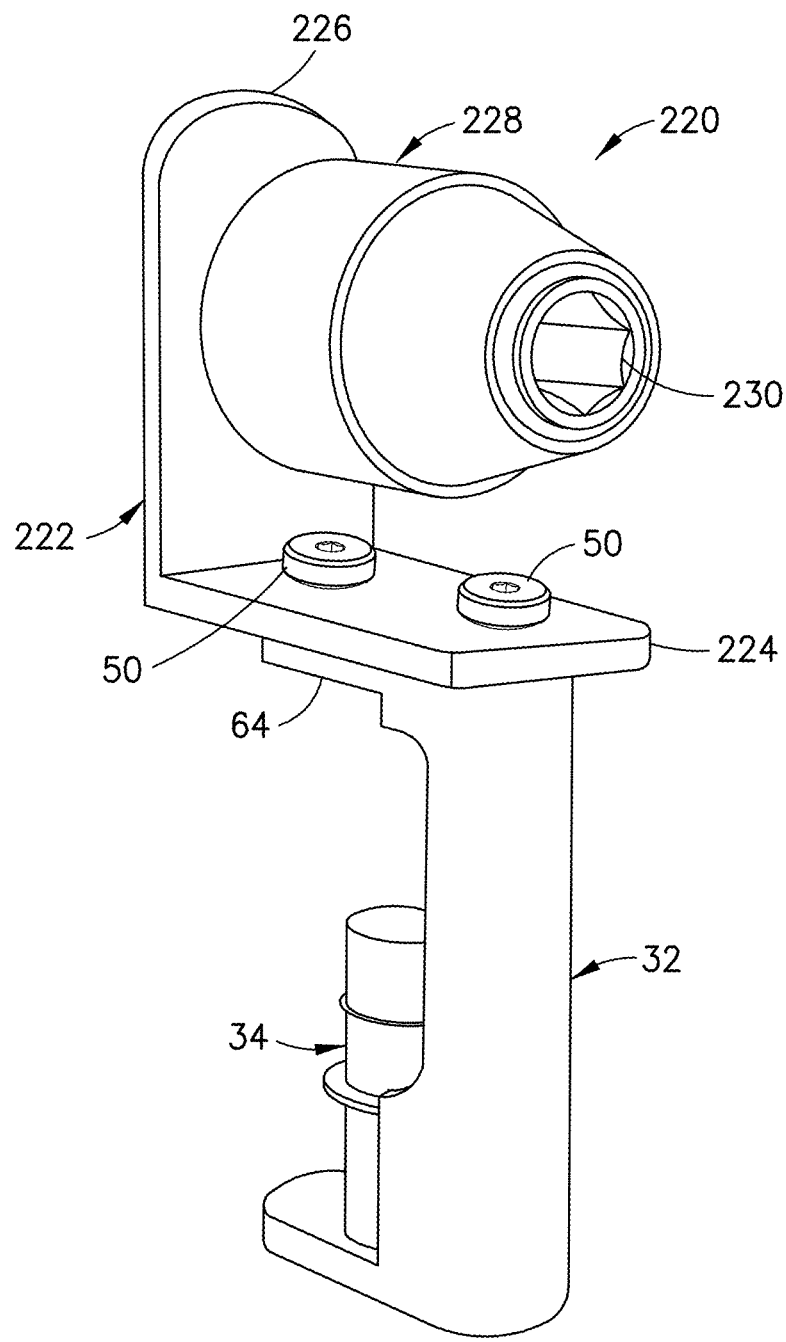
FIG. 26 is a diagram representing a three-dimensional view of a connector support device configured for robotic installation on a form board using a single temporary fastener in accordance with another embodiment.

FIG. 26 is a diagram representing a three-dimensional view of a connector support device 220 configured to be installable on a form board by a robot in accordance with another embodiment. The connector support device 220 includes a C-frame 32 and a temporary fastener 34 mounted to the C-frame 32, as previously described. The connector support device 220 includes an L-shaped frame 222 having a base plate 224 and a vertical plate 226 perpendicular to base plate 224. The base plate 224 and vertical plate 226 may be integrally formed or separate plates joined by welding. The base plate 224 is attached to the upper arm 64 of C-frame 32 by a pair of screws 50. A chuck 228 is attached to the vertical plate 226 so that the axis of the chuck 228 is generally horizontal (i.e., generally parallel to the X-Y plane of the form board). The chuck 228 has a receptacle 230 with an opening having a geometric shape that matches the cross-sectional profile of the tool or bit to be inserted during a robotic connector insertion operation.

Figure 27:
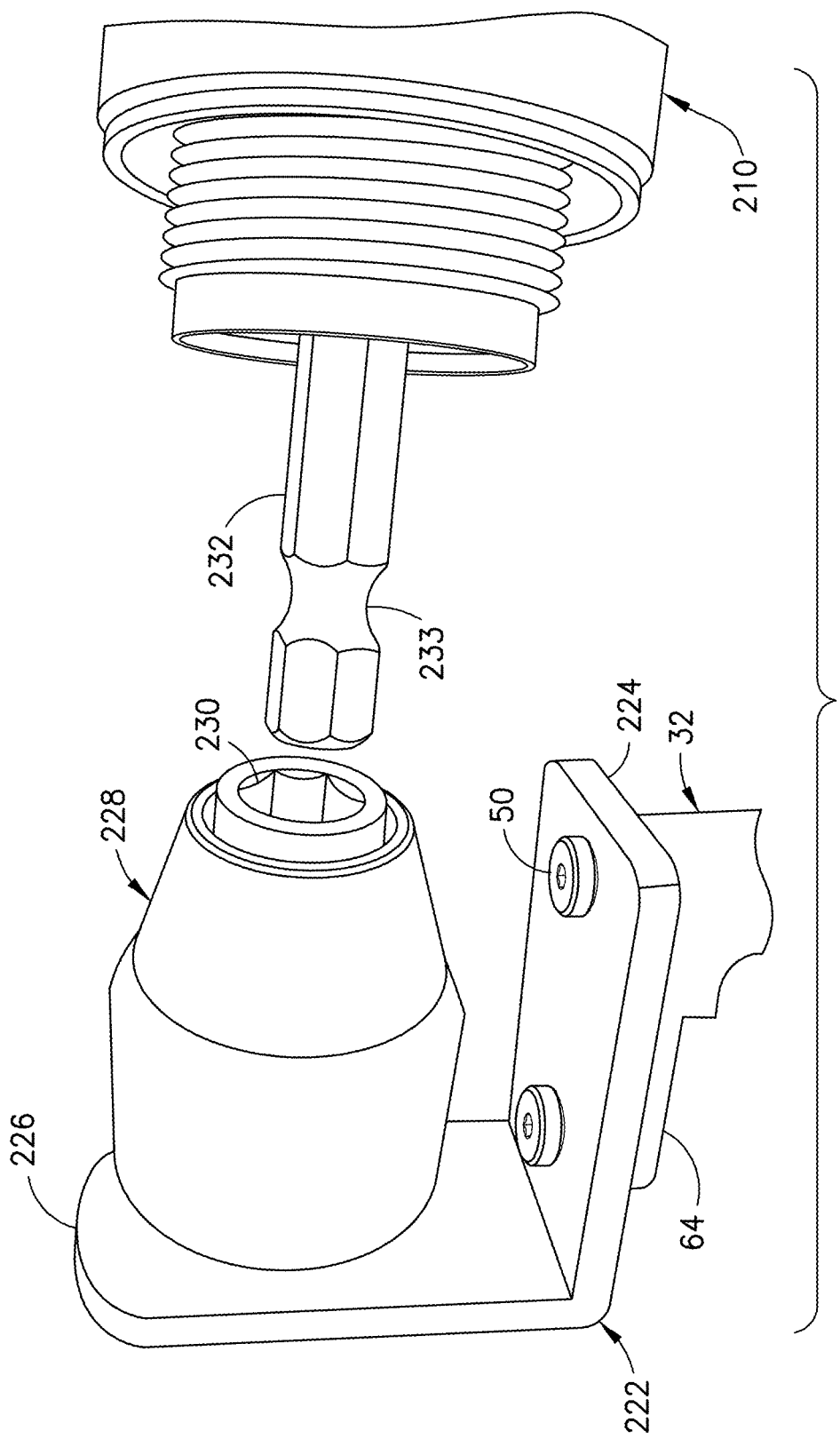
FIG. 27 is a diagram representing a three-dimensional view of a bit-mounted mounting connector in the process of being coupled to the connector support device depicted in FIG. 26.
Figure 28:
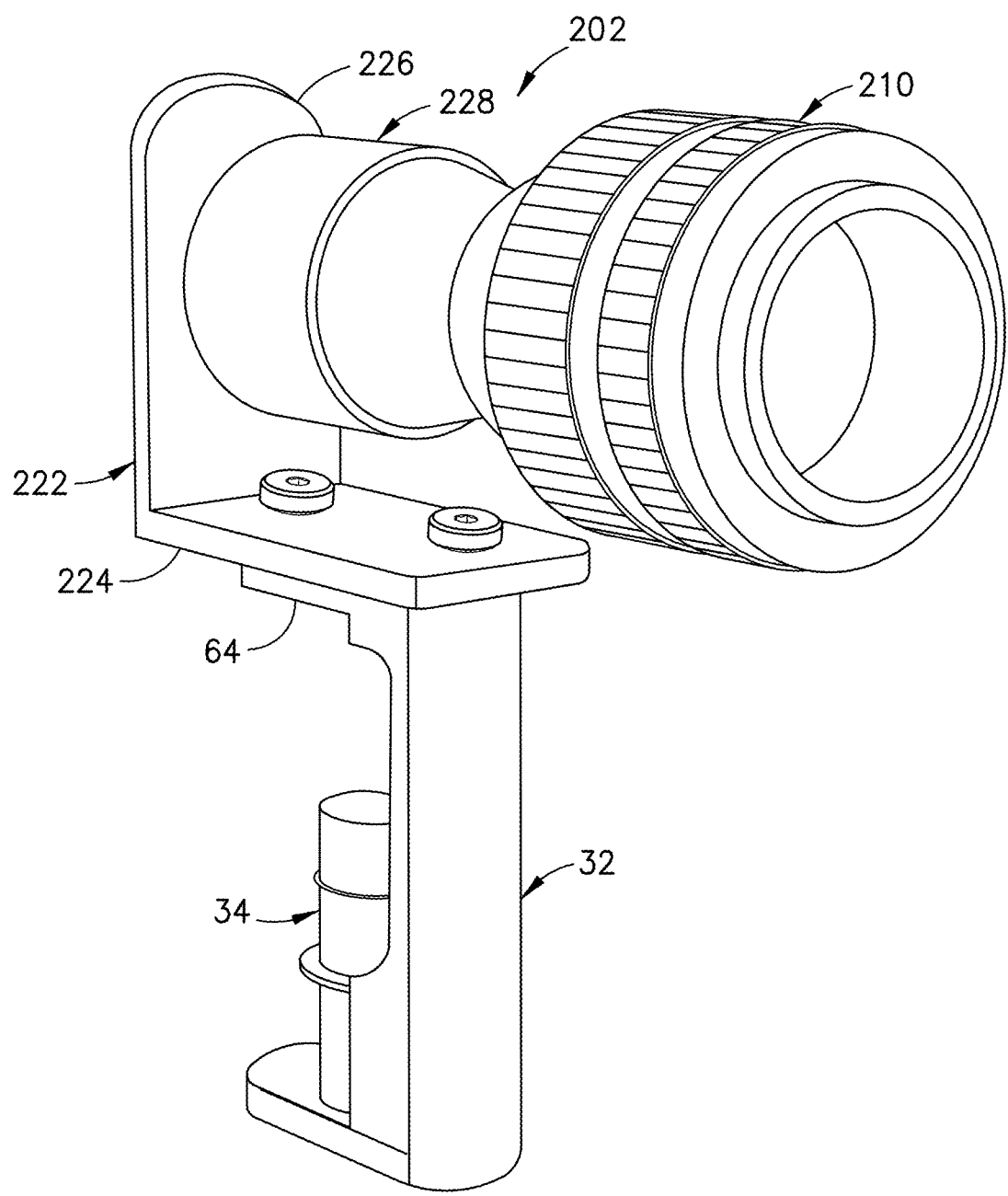
FIG. 28 is a diagram representing a three-dimensional view of a bit-mounted mounting connector fully coupled to the connector support device depicted in FIG. 26.

FIG. 27 shows a mounting connector 210 mounted on a bit 232 at an instant in time prior to entry of bit 232 into receptacle 230. The bit 232 has an annular groove 233 that is contoured to provide seats for a plurality of spring-loaded locking balls (not visible in FIG. 27) incorporated inside the chuck 228. The bit 232 will be inserted into the receptacle 230 of chuck 228 until the spring-loaded locking balls inside the chuck 228 sit in the annular groove 233. The locking balls maintain the axial position of the mounting connector 210 until a sufficient force is exerted to pull the bit 232 out of the receptacle 230. FIG. 28 shows the mounting connector 210 fully coupled to the chuck 228 of the connector support device 220.

Figure 29:
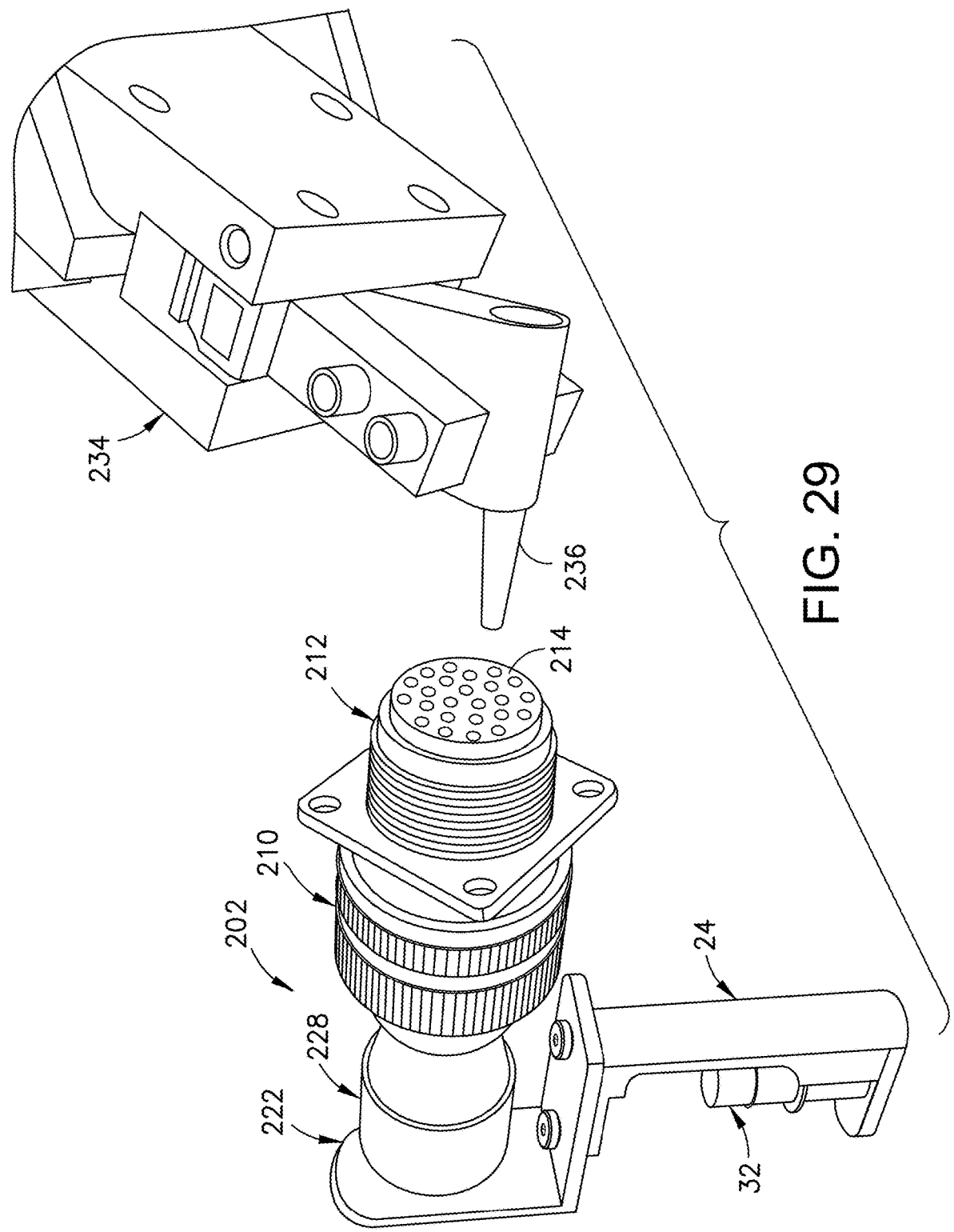
FIGS. 29 and 30 are diagrams representing respective three-dimensional views from different viewpoints of an assembly consisting of a wire connector coupled to the supported mounting connector depicted in FIG. 28.
Figure 30:
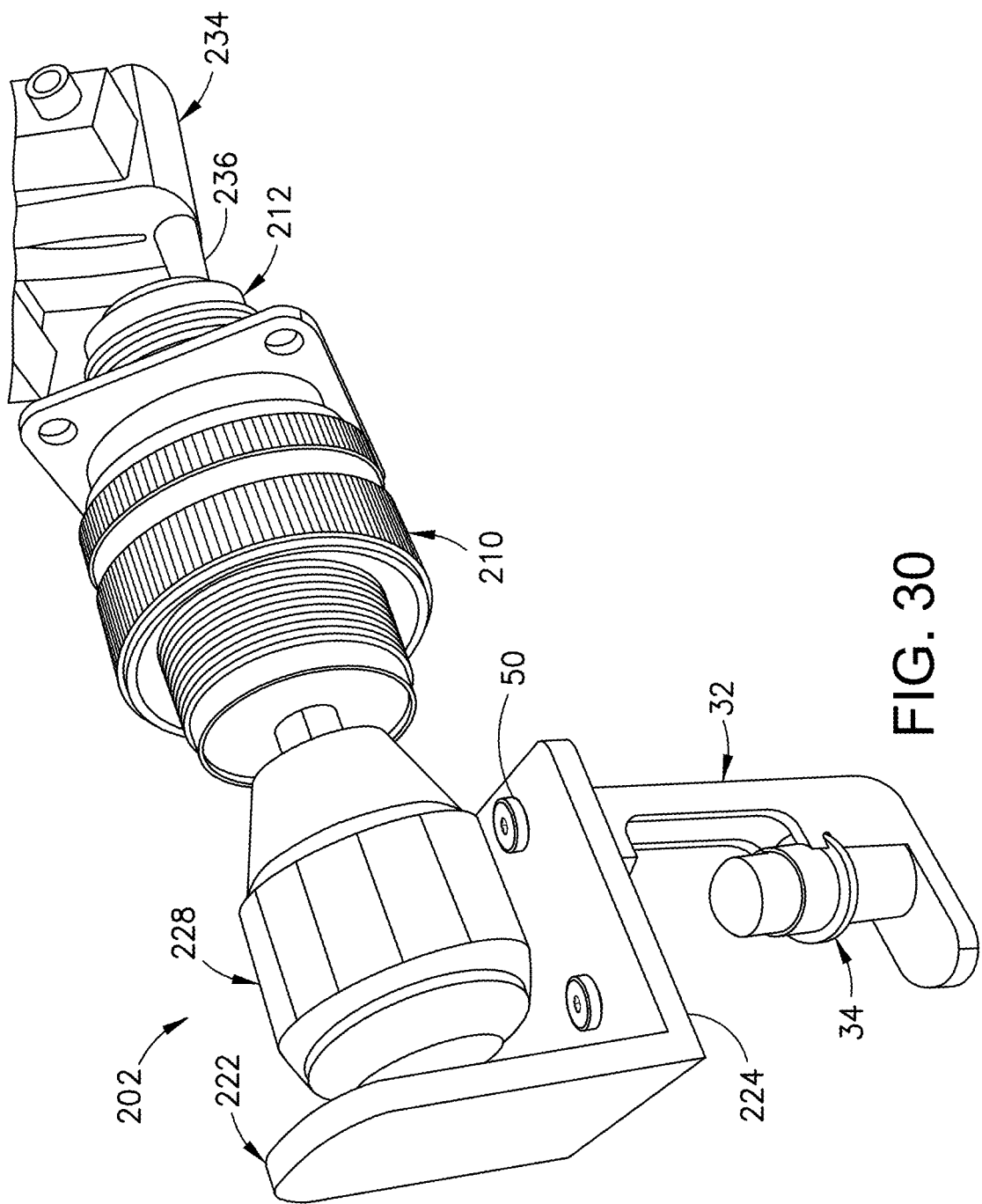

FIGS. 29 and 30 show respective three-dimensional views from different viewpoints of an assembly consisting of a wire connector 212 coupled to a mounting connector 210, which mounting connector 210 is in turn supported by the connector support device 220. The wire connector 212 may be robotically coupled to the mounting connector 210 using the same end effector (not shown in FIGS. 29 and 30) that was used to couple the mounting connector 210 to the connector support device 220. During a subsequent wire bundle assembly process, the respective contacts of wires to be terminated at wire connector 212 are inserted into respective holes in contact-receiving insert 214 by a contact insertion end effector 234 having a contact insertion tip 236. The contact insertion tip 236 may be configured to contact one end of a contact while providing clearance for the wire that is terminated by the contact. The contact insertion end effector 234 includes mechanisms for displacing the contact insertion tip along a linear path that is collinear with the axis of the hole in which the contact is to be inserted.

Because the connector support devices depicted in FIGS. 23 and 26 support wire connectors that receive the first ends of wires to be inserted at the start of routing of that wire, such connector support devices are referred to herein as "first-end connector support devices." A connector support is selected based on the connector part number and placed at the connector reference point such that the front face of wire connector is at the connector reference point. Each connector support device has an optimum position that may not align with a hole location on the form board. Snapping the connector support devices moves the device from an optimum position to an adjacent hole. This allows the device to be installed on the form board in an actual hole location. When snapping the device to the form board hole pattern, the technician should err on the side of making the branch longer, not shorter.

Figure 31:
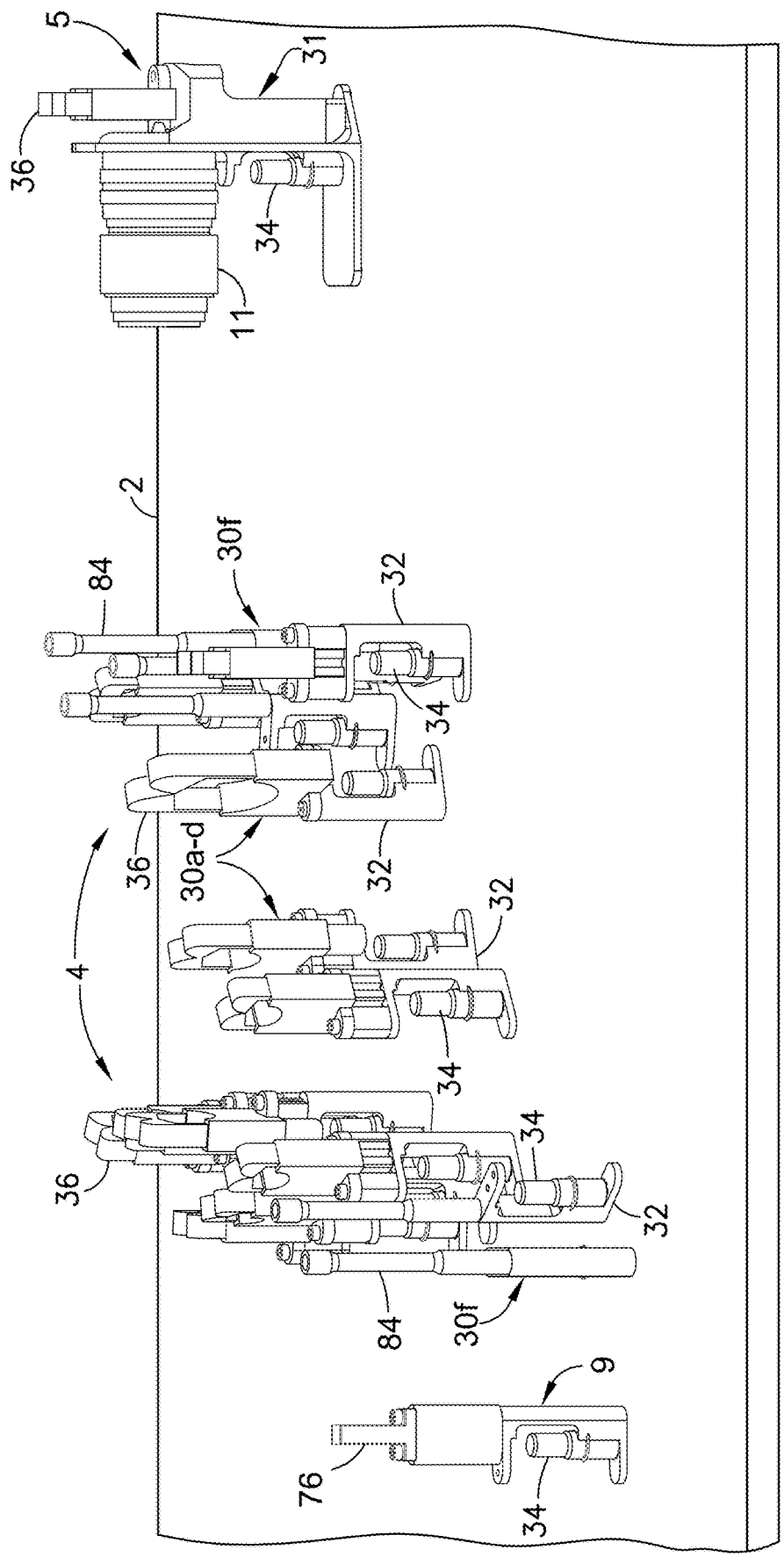
FIG. 31 is a diagram representing a three-dimensional view of a multiplicity of form board devices (including a first-end connector support device, wire routing devices, and a wire end holder) attached to a form board by means of temporary fasteners inserted in respective holes in the form board.

FIG. 31 is a diagram representing a three-dimensional view of a form board 2 that has a multiplicity of form board devices 4 fastened thereto in a manner that reflects the configuration of a wire bundle to be assembled. In the exemplary configuration depicted in FIG. 31, the form board devices 4 include a first-end connector support device 5 that supports a first-end wire connector 11, a wire end holding device 9, a multiplicity of single-post wire routing devices 30f and a multiplicity of elastic retainer wire routing devices 30a-30d.

The wire end holding device 9 and wire routing devices 30a-30d and 30f each include a C-frame 32 and a temporary fastener 34 which is coupled to a lower arm of the C-frame 32. The first-end connector support device 5 includes an L-frame 31 and a temporary fastener 34 which is coupled to a base plate of the L-frame 31. In addition, the wire end holding device 9 includes a wire clip 76, each single-post wire routing device 30f includes a respective post 84 and each elastic retainer wire routing device 30a-30d includes a respective routing clip 36.

The form board devices 4 are attached to the form board by means of temporary fasteners 34 which are inserted in respective holes (not shown in FIG. 31) in the form board 2. The form board assembly illustrated in FIG. 31 is universal in its application, i.e., the form board assembly can be employed to fabricate wire bundles of different designs requiring different deployment of a set of form board devices 4 mounted to the form board 2. In alternative situations, two or more form board assemblies may be placed adjacent to each other for the purpose of assembling a wire bundle in accordance with various alternative configurations.

Figure 32:
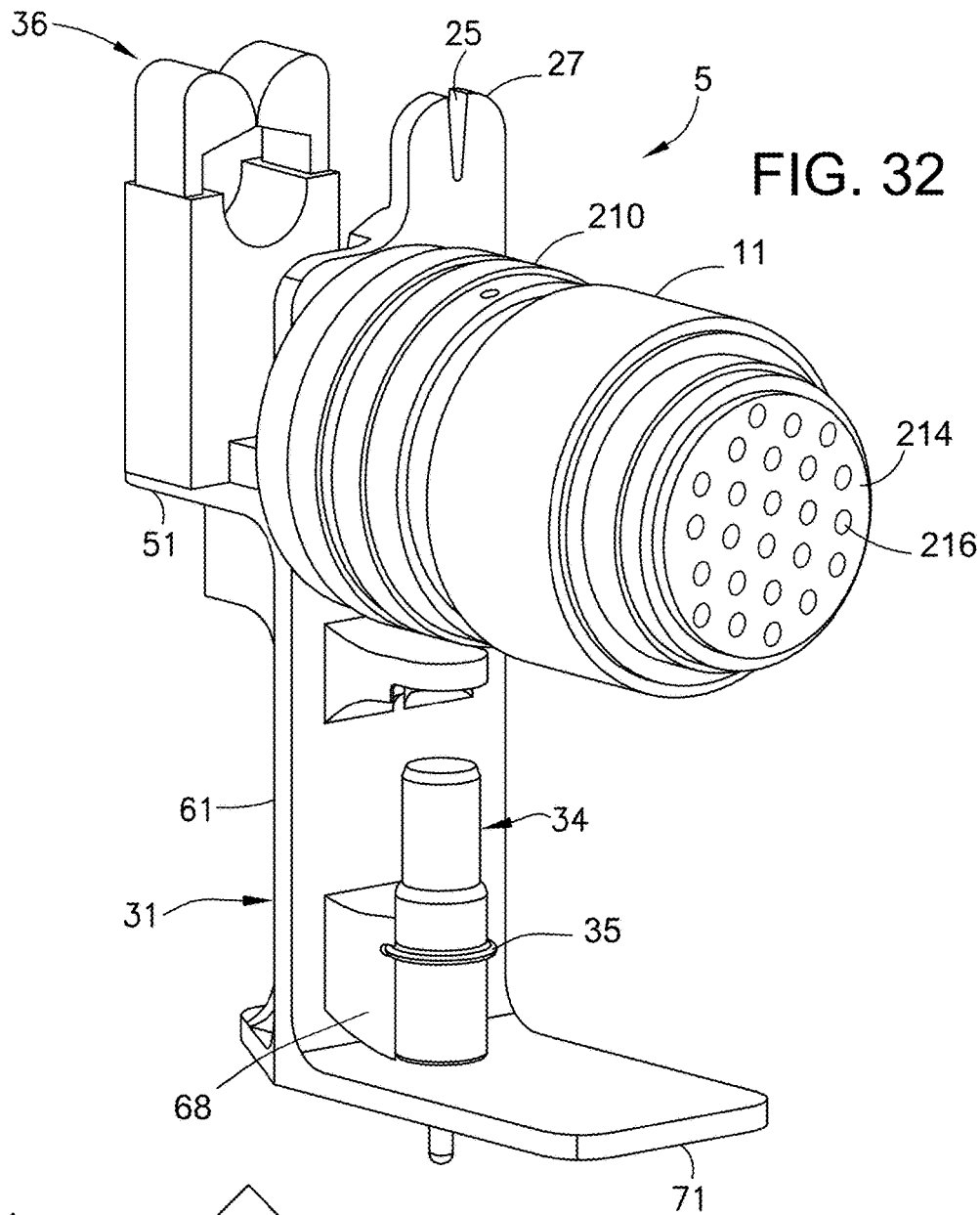
FIG. 32 is a diagram representing a three-dimensional view of a first-end connector support device configured for robotic installation on a form board using a temporary fastener in accordance with one embodiment.

FIG. 32 is a diagram representing a three-dimensional view of a first-end connector support device 5 configured for robotic installation on a form board using a temporary fastener 34 in accordance with one embodiment. The connector support device 5 includes an L-frame 31 having a base plate 71 and a vertical plate 61 perpendicular to the base plate 71. The connector support device 5 further includes a temporary fastener 34 fastened to the base plate 71 and a detent pin (not visible in FIG. 32, but see detent pin 208 in FIG. 23) which is installed in a hole in the vertical plate 61. The detent pin is a quick-release alignment pin with a solid shank and spring-loaded locking balls. The base plate 71 and vertical plate 61 may be integrally formed or welded together. The base plate 71 has one hole (not visible in FIG. 32) which receives locking pins of the temporary fastener 34.

FIG. 31 shows a first-end wire connector 11 supported by the first-end connector support device 5 in an elevated position (relative to the form board 2) with its axis horizontal. More specifically, the first-end wire connector 11 has been slid onto the aforementioned detent pin. The locking balls on the detent pin hold the first-end wire connector 11 on the detent pin by spring force (not positive locking) until the first-end wire connector 11 is pulled off with sufficient force. Thus, the first-end wire connector 11 may be easily installed on and later removed by a robot.

Referring again to FIG. 32, the first-end wire connector 11 also includes a contact-receiving insert 214 having a multiplicity of spaced holes 216. The contact-receiving insert 214 is typically made of dielectric material. For a particular wire bundle configuration, the respective contacts of wires to be terminated at first-end wire connector 11 are inserted into respective holes 216 in contact-receiving insert 214 by a contact-insertion end effector (not shown in the drawings) attached to the end of a manipulator arm. Prior to contact insertion, however, the wire-routing end effector (not shown in the drawings) moves the first end of the wire until a contact crimped on the wire is hooked behind a notch 25 formed in a notched projection 27 of the vertical plate 61.

Figure 32A:
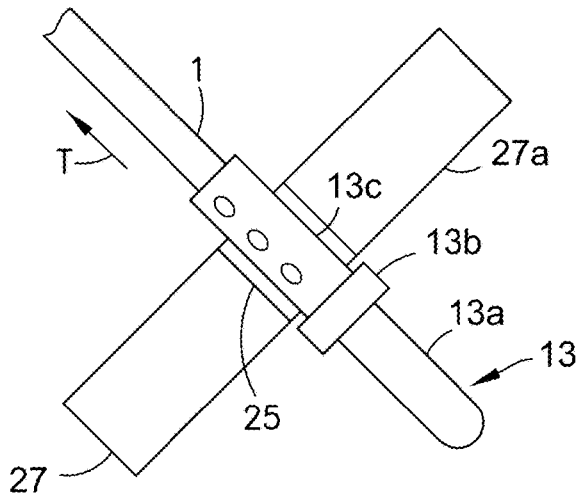
FIG. 32A is a diagram representing a top view of a wire contact hooked behind a notch in a notched plate of the first-end connector support device depicted in FIG. 32.

FIG. 32A is a diagram representing a top view of a wire contact 13 hooked behind a notch 25 in the notched projection 27 of the first-end connector support device 5 depicted in FIG. 32. An unjacketed end portion of the wire 1 has a pin-type contact 13 (made of metal) crimped thereon. The pin-type contact 13 includes a contact pin 13a, a locking tab or shoulder 13b (which will be retained by a retainer mechanism inside a hole in the first-end wire connector 11), and a crimp barrel 13c having indentations where the crimp barrel 13c has been crimped onto the unjacketed end portion of the wire 1. In the example depicted in FIG. 32A, the crimp barrel 13c is placed at the bottom of the notch 25 (where the notch is most narrow), while the locking tab or shoulder 13b is hooked or latched behind the notched projection 27. More specifically, when the wire-routing end effector later applies a tension on the wire 1 (indicated by arrow T in FIG. 32A), a surface of locking tab or shoulder 13b bears against a surface 27a of the notched projection 27 on at least opposite sides of notch 25, thereby retaining the first end of the wire 1 in a position wherein the wire 1 is accessible for gripping by the aforementioned contact-insertion end effector. During the next stage of the automated wire bundle assembly process, the contact-insertion end effector grips the wire 1, lifts the first end of wire 1 up and out of the notch 25 and then performs maneuvers which insert (e.g., push) the contact 13 into a targeted hole 216 in the contact-receiving insert 214.

Referring again to FIG. 32, the first-end connector support device 5 further includes a routing clip 36 which is attached to a horizontal platform 51 integrally formed with and projecting from the vertical plate 61 in a direction opposite to the direction in which base plate 71 is projecting. Some of the wire ends are unterminated and/or require other processing before loading into the connector, so they are held temporarily by the routing clip 36. Other wires held by the routing clip 36 are to be installed on other form board devices nearby.

If the first-end wire connector 11 has one to three un-insertable wires and/or second end wires, a wire end holder (e.g., notched projection 27) is placed on either side of the connector support device. If the first-end wire connector 11 has four or more un-insertable wires and/or second end wires, an elastic retainer (e.g., routing clip 36) is placed on either side of the connector support device. The locations for these four configurations (elastic retainer versus wire end holder and left versus right) are provided in the CAD model for each connector support device.

Each connector support device includes a "wire insertion envelope" that may be used by the insertion end effector to insert wires into the wire connector. When a wire connector contains robot-insertable wires, this envelope is used in collision checks.

First-end wire connectors 11 may have two starting route paths: one for wires to be inserted and one for wires not to be inserted. Wires to be inserted will follow a path that clips the contact on the end of the wire into a temporary "contact clip" that is part of the connector support device. Wires that are not to be inserted will follow a path that clips the end of the wire into a temporary wire clip that may be part of the connector support device. Both of these paths run to a common "routing continuation point," and both paths are provided within the CAD model for that connector support device. If the temporary "wire end holder" is not part of the connector support device, then its location is specified within the CAD model for that connector support device.

In the case of second-end wires routed to first-end wire connectors, these wires shall route through the elastic retainer or wire end holder and be trimmed 25-30 mm beyond it. These routing paths originate from the routing continuation point.

As previously mentioned, the form board configuration file defines the form board size, the types of form board devices 4 to be loaded on the form board 2, along with the position and orientation of each device. Form board devices 4 are placed on the form board 2 in the sequence recorded in the form board configuration file. Similarly form board devices 4 should be removed from the form board 2 in the reverse sequence.

The required form board geometry is documented via a 2-D mapping of form board device locations relative to a wire bundle envelope, which 2-D mapping is generated from a 3-D wire bundle model using wire bundle development CATIA functions. The wire bundles are designed according to geometric and electrical requirements. The 2-D mapping includes the wire bundle envelope, the intended centerline of the wire bundle, and the form board devices to be used to ensure that routed wires are retained within the wire bundle envelope.

The 2-D mapping of wire routing devices may be generated by importing and adapting a selected template having a predefined geometric pattern corresponding to a "basic" wire routing recipe commonly seen in form boards or corresponding to an "exception" required to handle more complex wire routing recipes. The basic routing recipes include straight runs, curves, simple breakouts, cross breakouts, fan breakouts, end fans, splices, second end branch termination, and first-end connector holders. Straight runs are routing that is along a straight line on the form board, between breakouts. Curves are routing along a curved line on the form board. This may include a sharp corner where the radius is zero. Simple breakouts include a single breakout of a branch normal to or at an angle from a trunk. Cross breakouts include two breakouts normal to or at an angle from a trunk, where breakouts are on opposite sides of the trunk. Fan breakouts include more than one breakout from a trunk, all on one side of the trunk. End fans include a branch that breaks out into multiple directions from a single point. Splices include a breakout area used to break out wires for splicing. Exceptions include scenarios where basic recipes are combined, overlapped, or very close together. When the software recognizes geometry not covered by the above scenarios, the software is configured to indicate that manual intervention is required and provides a graphical user interface to allow a person to adjust the form board layout.

Straight runs between routing recipes are evaluated after all routing recipes have been evaluated. For every unsupported straight run 150 mm or more in length, evenly spaced elastic retainers are added along the straight run to ensure that no more than 150 mm of wire is unsupported. For the purpose of illustration, various 2-D mappings of wire routing devices that maintain wires within a specified wire bundle envelope will now be briefly described with reference to FIGS. 33A-33C and 34-37.

Figures 33A, 33B, 33C:
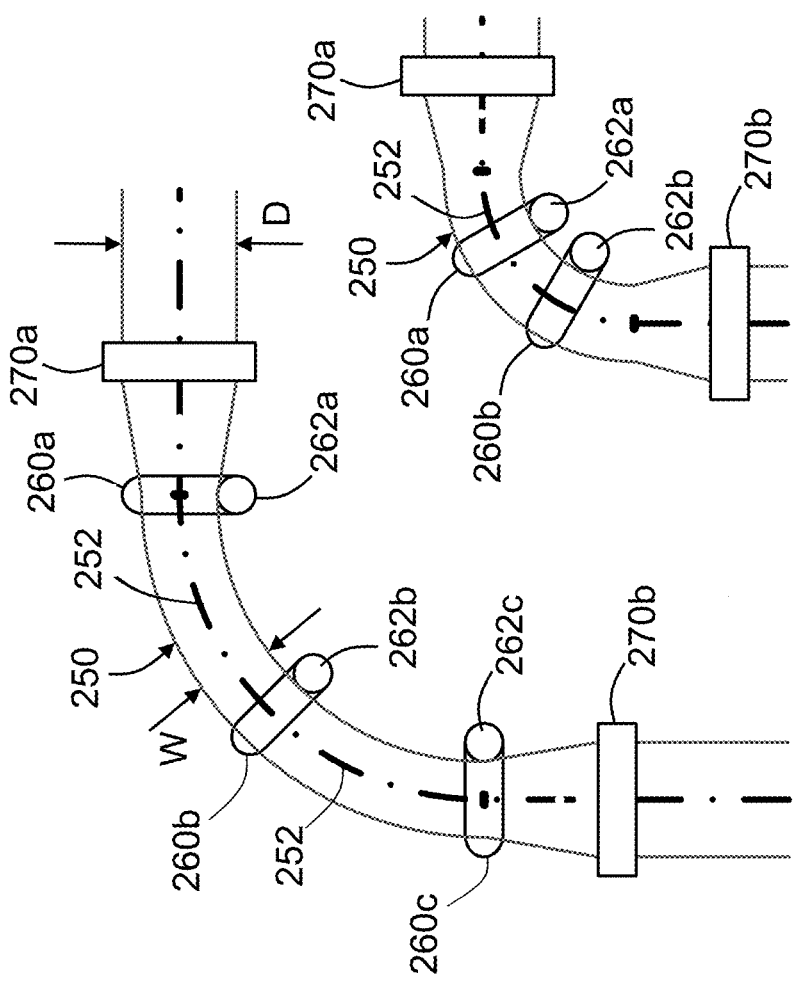
FIGS. 33A–33C are diagrams representing 2-D mappings of respective sets of wire routing devices to be installed on a form board in accordance with respective curved wire bundle configurations.

FIGS. 33A-33C are diagrams representing 2-D mappings of respective sets of wire routing devices to be installed on a form board in accordance with wire bundle configurations that will have a curved wire bundle envelope 250 upon completion of wire routing. The approximate center line 252 of the wire bundle envelope 250 is indicated by a curved bold dash-dot chain in FIGS. 33A-33C. Each form board configuration depicted in FIGS. 33A-33C includes elastic retainer wire routing devices 270a and 270b in the form of routing clips (a.k.a. elastic retainers) sized appropriately for the branch diameter D. The elastic retainer wire routing devices 270a and 270b are placed beyond the respective ends of the curve. In addition, the wire bundle configurations depicted in FIGS. 33A-33C further include one or more single-post wire routing devices (such as single-post wire routing device 30f depicted in FIG. 17) having a single post.

In accordance with one proposed implementation in which the curved segment of the wire bundle has an arc length less than 25 mm, one single-post wire routing device 260a having a single post 262a is selected and placed on the form board (as seen in FIG. 33C) at a location where single-post wire routing device 260a would support the wires at the middle of the curved segment of the wire bundle. In accordance with another proposed implementation in which the curved segment of the wire bundle has an arc length from 25 to 50 mm, two single-post wire routing device 260a and 260b having single posts 262a and 262b respectively are selected and placed to support the wires one-third of the arc length from each end of the arc (as seen in FIG. 33B). In accordance with a third proposed implementation in which the curved segment of the wire bundle has an arc length of 50 mm or greater, three (or more) single-post wire routing device 260a-260c having single posts 262a-262c respectively are selected and evenly distributed along the arc no more than 50 mm apart (as seen in FIG. 33A). The wire bundle envelope 250 tapers from a diameter D at the elastic retainer wire routing devices 270a and 270b to a width W as the branch wraps around the posts 262a-262c.

In all cases, the single posts 262a-262c are placed on the inside of the curve at a distance W/2 from the centerline 252 of the wire bundle envelope 250, where W is the expected width of the wire bundle branch after it has wrapped around the posts 262a-262c. Also, the posts 262a-262c should be placed so that the horizontal arms of the C-frame of the single-post wire routing devices 260a-260c would be perpendicular to the curve and under the bundle routing path (as shown in FIGS. 33A-33C). Alternatively, the C-frame may be placed perpendicular to the curve and away from the bundle routing path.

Figure 34:
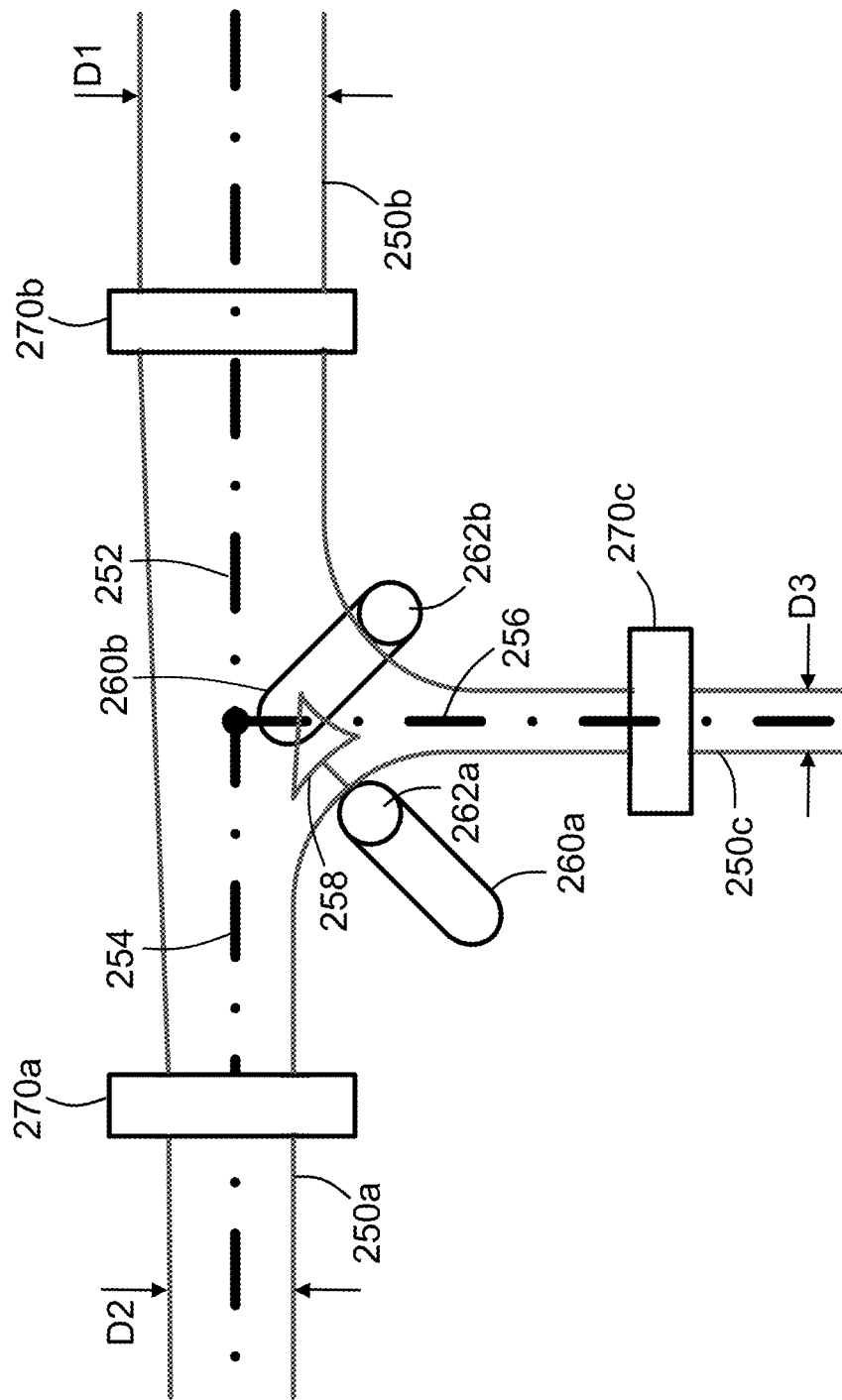
FIGS. 34 and 35 are diagrams representing 2-D mappings of respective sets of wire routing devices to be installed on a form board in accordance with respective wire bundle configurations having a single breakout normal to a trunk.

FIG. 34 is a diagram representing a 2-D mapping of a set of wire routing devices to be installed on a form board in accordance with one wire bundle configuration having a single branch (represented by wire bundle envelope portion 250c having a diameter D3) that breaks out normal to a trunk (represented by wire bundle envelope portion 250a having a diameter D2 and wire bundle envelope portion 250b having a diameter D1). The approximate center lines 252, 254, and 256 of the wire bundle envelope portions 250b, 250a, and 250c respectively are indicated by respective curved bold dash-dot chains in FIG. 34. The form board configuration depicted in FIG. 34 includes three elastic retainer wire routing devices 270a, 270b, and 270c in the form of routing clips (a.k.a. elastic retainers) sized appropriately for the respective diameters D2, D1, and D3. The elastic retainer wire routing devices 270a and 270b are positioned to retain respective portions of the trunk, while the elastic retainer wire routing device 270c is positioned to retain a portion of the branch.

In addition, the wire bundle configuration depicted in FIG. 34 further includes two single-post wire routing devices 260a and 260b (such as single-post wire routing device 30f depicted in FIG. 17) having a single post. The post 262a of single-post wire routing device 260a is positioned to contact the wires that break out from the portion of the trunk represented by wire bundle envelope portion 250a to the branch represented by wire bundle envelope portion 250c at the center of the arc formed by those wires, thereby limiting movement of those curved wires radially inward relative to that arc. Similarly, the post 262b of single-post wire routing device 260b is positioned to contact the wires that break out from the portion of the trunk represented by wire bundle envelope portion 250b to the branch represented by wire bundle envelope portion 250c at the center of the arc formed by those wires, thereby limiting movement of those curved wires radially inward relative to that arc.

In both cases, the single posts 262a and 262b are placed on the inside of the respective curves so that the horizontal arms of the C-frame of the single-post wire routing devices 260a and 260b would be perpendicular to the curve. In the example depicted in FIG. 34, the C-frame of single-post wire routing device 260b is placed under the bundle routing path, whereas the C-frame of single-post wire routing device 260a is placed perpendicular to the curved wires in contact with post 262a and away from the bundle routing path to avoid a collision with the C-frame of single-post wire routing device 260b.

Figure 35:
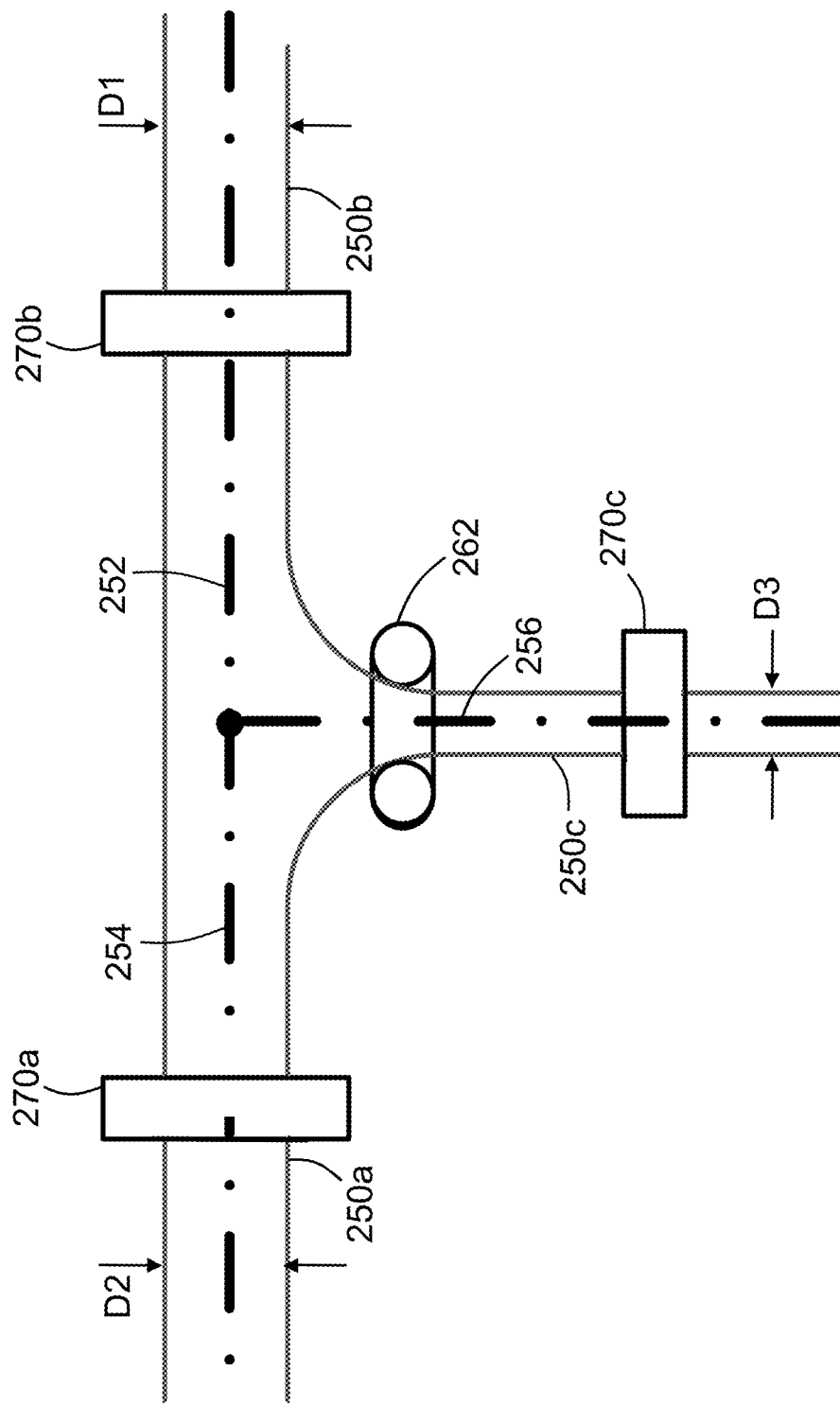

FIG. 35 is a diagram representing a 2-D mapping of a set of wire routing devices to be installed on a form board in accordance with another wire bundle configuration having a single branch (represented by wire bundle envelope portion 250c having a diameter D3) that breaks out normal to a trunk (represented by wire bundle envelope portion 250a having a diameter D2 and wire bundle envelope portion 250b having a diameter D1). Instead of using two single-post wire routing devices 260a and 260b each having a single post (as depicted in FIG. 34) to retain the wires branching off of the trunk, the configuration shown in FIG. 35 uses a single double-post wire routing device 262 having two posts to retain the wires branching off of the trunk at a 90-degree angle. The simplified layout depicted in FIG. 35 may be used when the breakout diameter D3 is less than 10 mm and when wires from the breakout run to both sides of the trunk.

Figure 36:
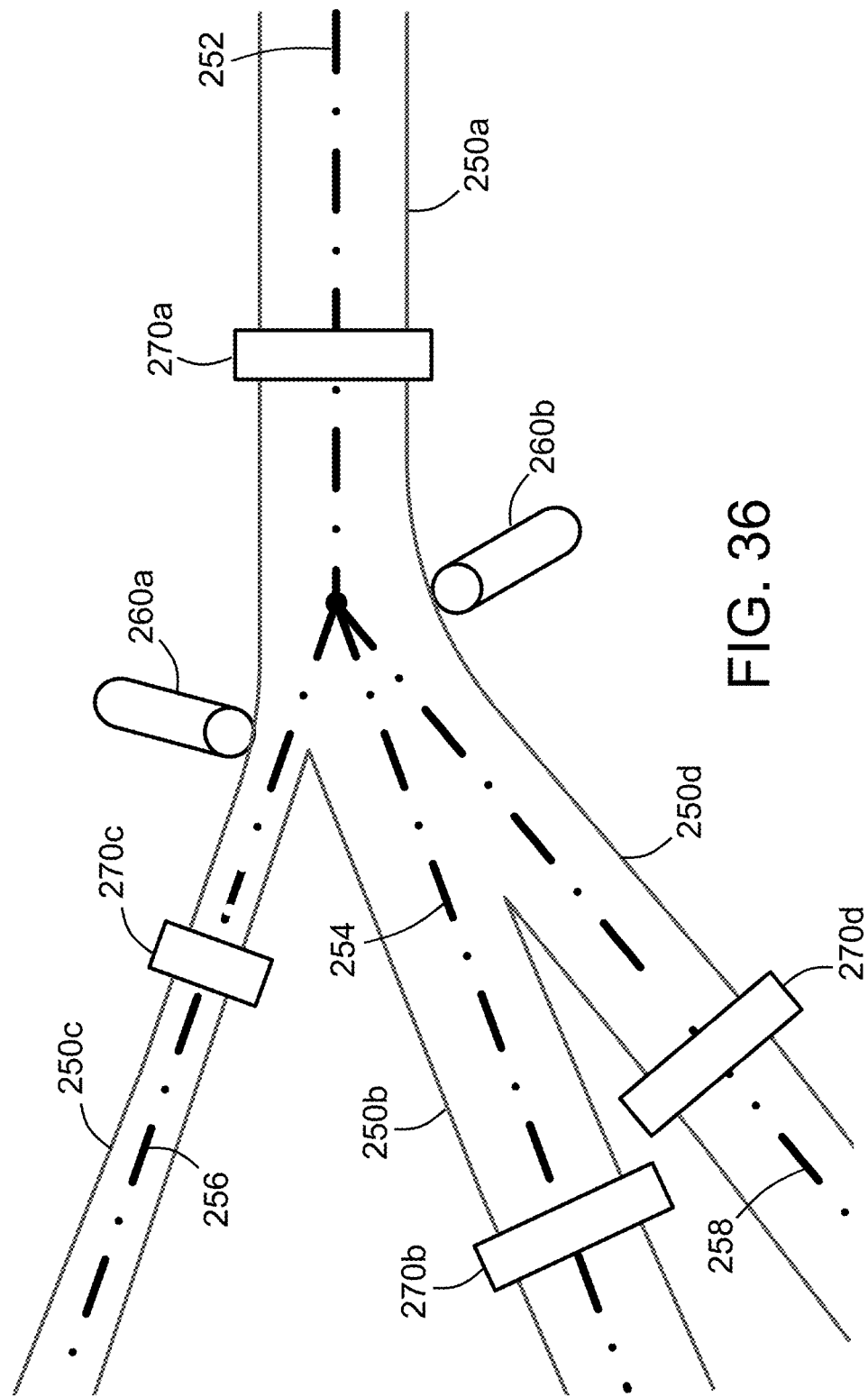
FIGS. 36 and 37 are diagrams representing 2-D mappings of respective sets of wire routing devices to be installed on a form board in accordance with respective wire bundle configurations having an end fan at a trunk end.

FIG. 36 is a diagram representing a 2-D mapping of a set of wire routing devices to be installed on a form board in accordance with one wire bundle configuration having an end fan at a trunk end. An "end fan" occurs when a trunk ends by dividing into two or more breakouts off its end, and no wires continue in the same direction of the trunk.

In the example depicted in FIG. 36, the wire bundle configuration has three branches (represented by wire bundle envelope portions 250b-250d that fan out from a trunk (represented by wire bundle envelope portion 250a). The approximate center lines 252, 254, 256, and 258 of the respective wire bundle envelope portions 250a-250d are indicated by respective curved bold dash-dot chains in FIG. 36. The form board configuration depicted in FIG. 36 includes four elastic retainer wire routing devices 270a-270d in the form of routing clips (a.k.a. elastic retainers) sized appropriately for the respective diameters of the trunk and three branches. The elastic retainer wire routing device 270a is positioned to retain the trunk (represented on the map by wire bundle envelope portion 250a); the elastic retainer wire routing device 270b is positioned to retain a portion of the central branch (represented by wire bundle envelope portion 250b); the elastic retainer wire routing device 270c is positioned to retain a portion of the right branch (represented by wire bundle envelope portion 250c); and the elastic retainer wire routing device 270d is positioned to retain a portion of the left branch (represented by wire bundle envelope portion 250d).

In addition, the wire bundle configuration depicted in FIG. 36 further includes two single-post wire routing devices 260a and 260b (such as wire routing device 30f depicted in FIG. 17) having a single post. The post 262a of single-post wire routing device 260a is positioned to contact the wires that break out to form the right branch at the center of the arc formed by those wires, thereby limiting movement of those curved wires radially inward relative to that arc. Similarly, the post 262b of single-post wire routing device 260b is positioned to contact the wires that break out to form the left branch at the center of the arc formed by those wires, thereby limiting movement of those curved wires radially inward relative to that arc.

In both cases, the single posts 262a and 262b are placed on the inside of the respective curves so that the horizontal arms of the C-frame of the single-post wire routing devices 260a and 260b would be perpendicular to the curve. In the example depicted in FIG. 36, the C-frames of single-post wire routing devices 260a and 260b are placed outside of the bundle routing path.

Figure 37:
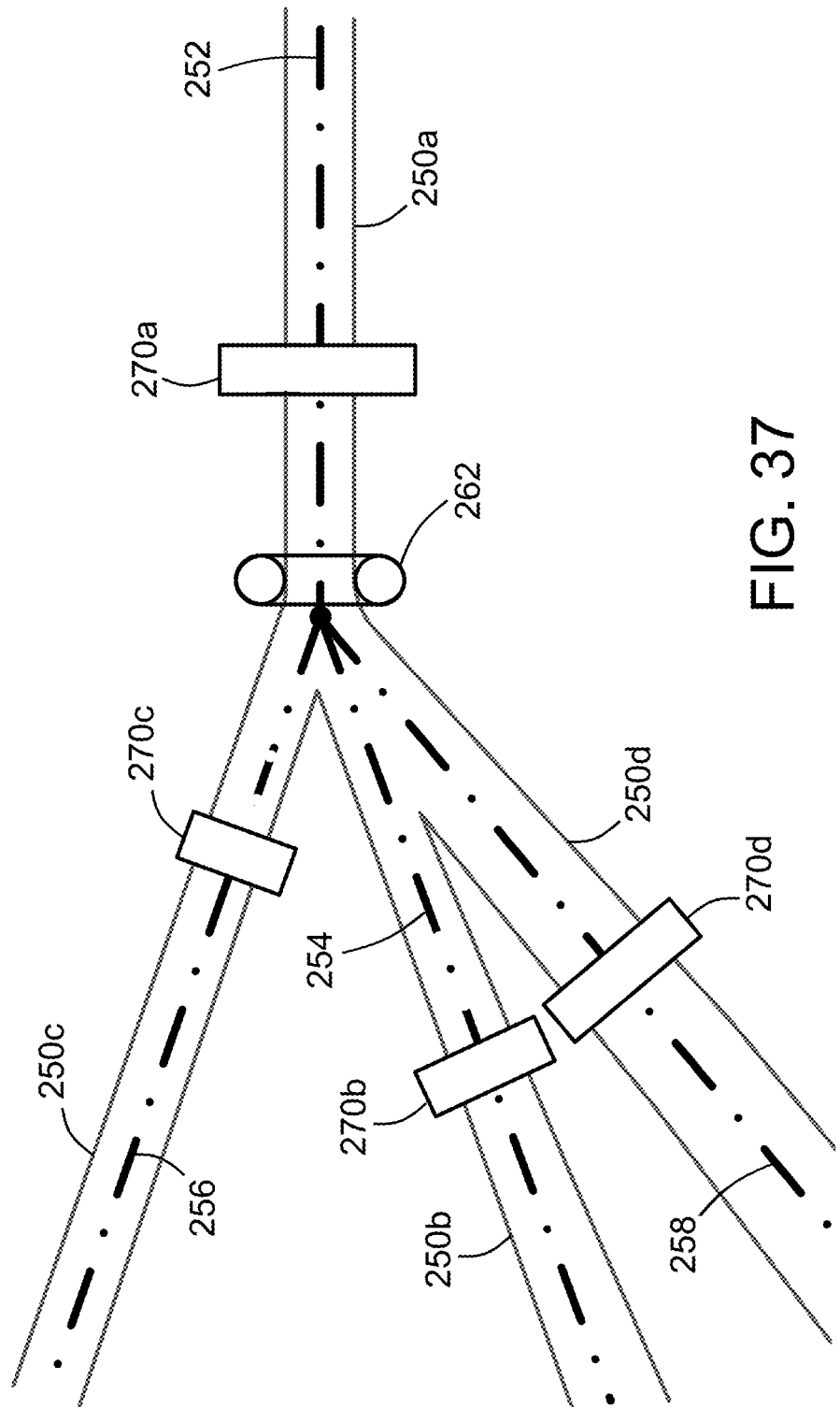

FIG. 37 is a diagram representing a 2-D mapping of a set of wire routing devices to be installed on a form board in accordance with another wire bundle configuration having an end fan at a trunk end which is the same as the end fan depicted in FIG. 36. Instead of using two single-post wire routing devices 260a and 260b each having a single post (as depicted in FIG. 36) to retain the wires branching left and right off of the trunk, the configuration shown in FIG. 37 uses a single double-post wire routing device 262 having two posts to retain the wires branching off of the trunk left and right. The simplified layout depicted in FIG. 37 may be used when the trunk diameter is less than 10 mm and when wires fan out to the left and right of the trunk.

Figure 38A:
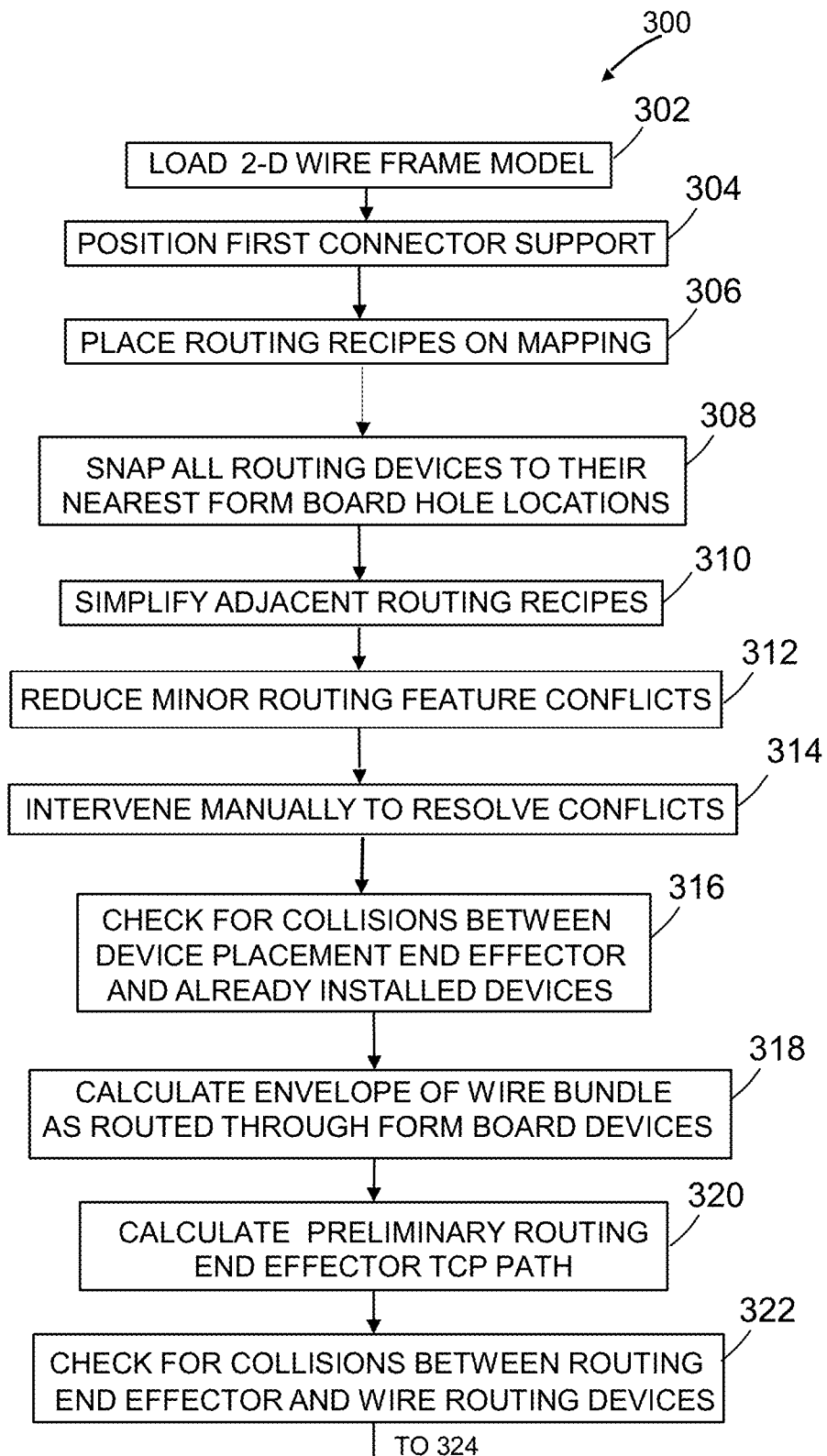
FIGS. 38A and 38B form a flowchart identifying steps of a method for laying out form board routing devices and for generating routing end effector tool paths in accordance with one exemplary workflow.
Figure 38B:
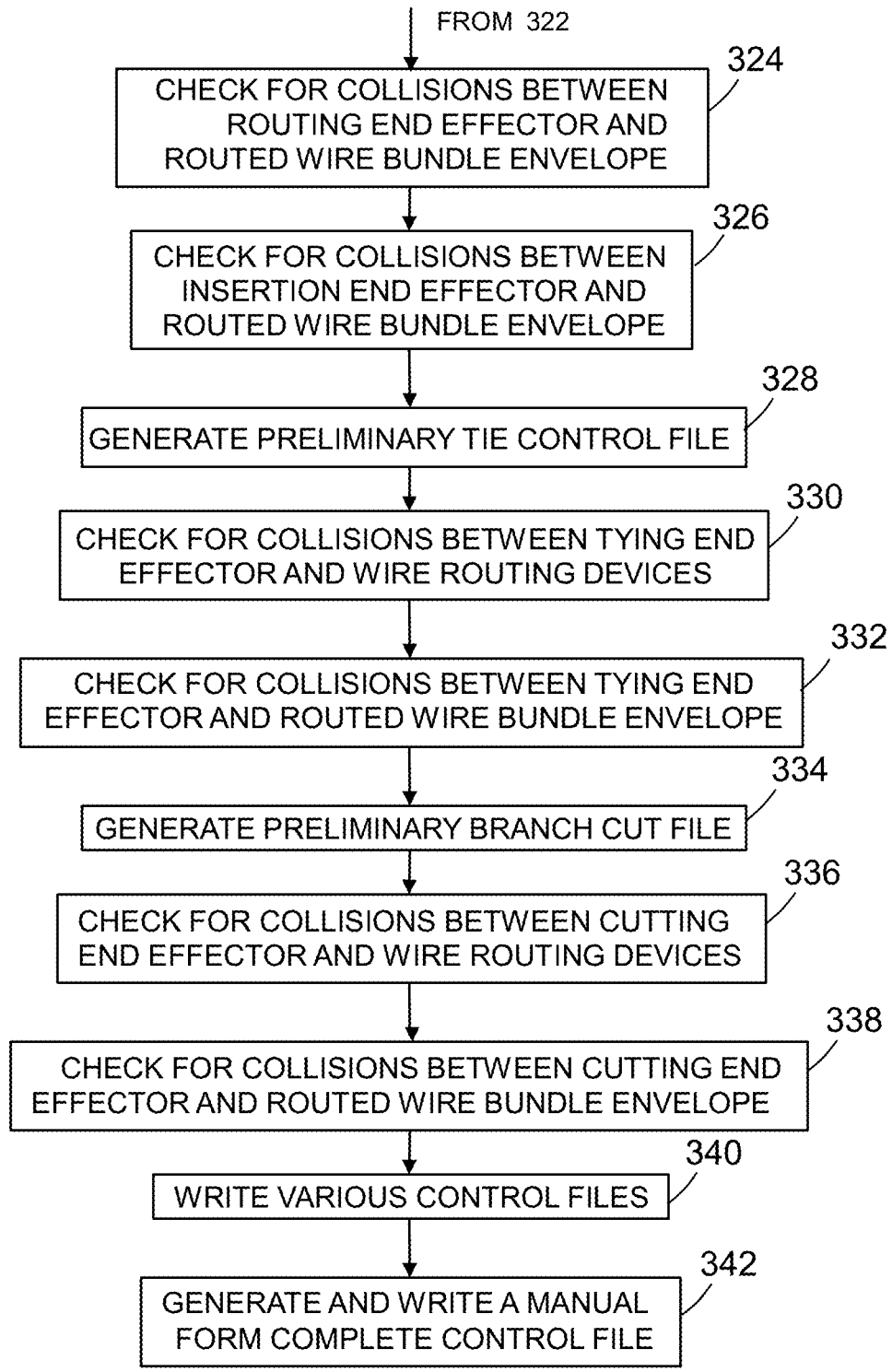

The general workflow 300 for laying out form board routing devices and for generating routing end effector tool paths is shown in FIGS. 38A and 38B, which together form one flowchart. This workflow 300 assumes that the wire bundle has already been flattened to a 2-D model using traditional CATIA harness development tools (e.g., EZFLAT), and that model includes points to identify the connector equipment identifier, connector clocking, backshell information, sleeve start/end points, and splice locations. The workflow 300 (described below with reference to FIGS. 38A and 38B) is started by generating locations for connector supports and wire routing devices on a 2-D plane without consideration of any form board hole pattern.

(1) During initialization, the user loads a 2-D wire frame model (step 302). The software retrieves the corresponding wire data. The software identifies all connector part numbers, clocking and backshell part numbers, and backshell angles/clocking. The software calculates the diameters of every branch in the bundle.

(2) The next step is to position the virtual first-end connector support (step 304). A starting (i.e., first-end) wire connector is identified. The selected wire connector should be the same starting connector that the form board design engineer used to flatten the 3-D CATIA harness into a 2-D wire frame model. Or the wire connector may be selected manually during the initialization phase above. The appropriate virtual connector support device for the selected starting wire connector is placed on the map.

(3) The next stage involves preliminary placement on the mapping of routing recipes (step 306). Treating the selected wire connector as the start of a trunk, follow through the trunk/branch structure of the harness multiple times, and position virtual connector support devices and virtual wire routing devices for one type of routing feature on each pass in the following sequence: first-end connector supports; second-end supports; breakouts, end fans and curves; splices; and straight runs.

(4) When a form board with a discrete routing device hole pattern is to be used (versus a plywood form board), pass through the harness trunk/branch structure again, where all routing devices are snapped to their nearest form board hole locations (step 308). There is a theoretical hole pattern that exists on the form boards, based on the dimensions of the perforated sheet. However (likely due to tolerance build up during the manufacturing process of the form boards), the actual hole location may not match the theoretical hole position. There is an optimum device layout that results in the highest quality/accuracy form board. The optimum device layout does not take into account the hole spacing of the perforated sheet. Each routing device has an optimum position that may not align with a hole location on the form board. Snapping the routing devices moves a device from an optimum position to an adjacent hole. This allows the devices to be installed on the form board in actual hole locations. When snapping the first-end connector routing recipe to the hole pattern, err on the side of making the branch longer, not shorter.

(5) In the next stage, adjacent routing recipes are simplified (step 310). If two adjacent but non-overlapping routing recipes have optional branch elastic retainers located within 25 mm of each other, then replace the two elastic retainers with a single elastic retainer at an intermediate position/hole between the two. This elastic retainer shall be considered a shared device on both of the routing feature's envelopes.

(6) Thereafter, minor routing feature conflicts are reduced (step 312). If two adjacent routing feature envelopes overlap, de-conflict as follows:
 (a) Routing devices may be moved from their preferred position to any position within the provided position range.
 (b) Single post wire routing devices may be repositioned at different form board hole locations, while still maintaining their posts at a similar position.
 (c) Elastic retainers and wire end holders may be rotated 180 degrees to provide alternate pick angles.
 (d) If any optional branch elastic retainers on a shared branch/trunk overlap each other, then eliminate both optional branch elastic retainers. Position a virtual routing path point at a point midway between the two original elastic retainer positions. This point shall be considered a shared point on both of the routing feature's envelopes.
 (e) Second-end branch terminations (wire end holders or elastic retainers) may be repositioned anywhere in a specified range from the branch end point.
 (f) If the collision involves a wire end holder or a second-end branch starting clip, this device may be moved to the other side of the branch centerline to prevent collisions.
 (g) If the collision involves a wire end holder or elastic retainer for holding un-insertable wires at a first-end wire connector, this device may be moved to the other side of the branch centerline to prevent collisions.
 (h) If the collision involves a splice routing feature, then the alternate layout may be substituted, or one or both elastic retainers on the trunk may be moved further apart by up to an additional 25 mm.
 (i) Branch angles may be adjusted up to ±15 degrees. Priority should be to adjust the smallest-diameter branches before adjusting the largest-diameter branches.
 (j) A curve(s) may be introduced in the normally straight parts of branches. Priority should be to adjust the smallest-diameter branches before adjusting the largest-diameter branches. A curve must have a bend radius of at least 20× the branch diameter and may not exceed an angle of 10 degrees. If more than one curve is introduced, the curves should alternate between left and right, and should not have an accumulated angular difference of more than 10 degrees. Two opposing curves with an accumulated angle of 0 degrees is preferred (e.g., an S-curve).
 (k) Branch lengths may be extended up to 5 mm.

If any of the above changes are made, this "Reduce minor routing feature conflicts" step should be re-started.

(7) If any remaining routing feature envelopes overlap, then the program shall require manual intervention to resolve the conflict (step 314). The program provides a user graphical interface with the following features: (a) enforce the form board hole pattern, when such a form board is used; (b) illustrate the structure of the bundle; (c) illustrate the wire routing devices and wire bundle envelopes, highlighting envelopes that overlap; (d) allow the user to delete, move, or add devices within a wire bundle envelope; (e) allow the user to specify a device from one envelope and also designate it as shared with an adjacent envelope; (f) indicate to the user how the structure of the harnesses (branch lengths and branch angles) is matching or varying from the original 2-D wire frame model. Additional features may be included.

(8) Following manual routing feature conflict resolution, a check for collisions between the device placement end effector and already-installed devices is performed (step 316). Assume an initial device placement sequence that starts with the starting wire connector and passes sequentially through the harness trunk/branch structure. Assume that all devices have a 0-degree pick angle. Check that this initial sequence and pick angles do not cause a collision between the end effector placing a device at each location and any previously placed devices. If such a collision occurs:
 (a) Re-assess with +90- and −90-degree pick angles. However, some elastic retainers may only use a 0-degree pick angle.
 (b) If the device is an elastic retainer or wire end holder, rotate the device 180 degrees and re-assess with 0-, +90- and −90-degree pick angles. However, some elastic retainers may only use a 0-degree pick angle.
 (c) If the device is an elastic retainer on a straight-type routing feature, the device may be re-positioned to allow up to 150 mm of unsupported wire between it and the next wire support.
 (d) If the device is an optional branch elastic retainer, the device may be re-positioned up to 30 mm away from its routing feature envelope or up to 20 mm from the adjacent routing feature envelope, whichever is less.
 (e) If the conflicting device is an elastic retainer or wire end holder, rotate the 180 degrees and re-start "Check for collisions between device placement end effector and routed harness."
 (f) Single-post wire routing devices supporting breakouts or curves may be installed at alternate angles as long as the post is at the target X,Y center point. Ideally, this is as close to perpendicular to the wire bundle (harness) centerline as practical.

(9) In the next workflow step, the envelope of the wire bundle as routed through the form board devices is calculated (step 318).

(10) For each from/to connector pair in the wire list, calculate the preliminary routing end effector TCP path (step 320). Ensure that all corners along the path have a radius of at least a specified fillet value.

(11) Then a check for collisions between the routing end effector and the wire routing devices is performed (step 322). The geometry of the routing end effector is swept along each path and an alert signal is generated in response to any "hard" collisions between the routing end effector and wire routing devices. A collision with the wire entry area of any wire routing device does not count as a "hard" collision.

(12) Next a check for collisions between the routing end effector and the routed wire bundle envelope is performed (step 324). The geometry of the routing end effector is swept along each path and an alert signal is generated in response to any "hard" collisions between the routing end effector and the routed wire bundle envelope. A collision of less than 3 mm does not count as a "hard" collision.

(13) In addition, a check for collisions between the insertion end effector and the routed wire bundle envelope is performed (step 326). For each first-end connector with inserted wires, check for collisions between its wire insertion envelope and any portion of the routed wire bundle envelope that is outside the connector's routing feature envelope.

(14) After the above-described checks have been completed, a preliminary tie control file is generated (step 328).

(15) Next a check for collisions between the tying end effector and the wire routing devices is performed (step 330).

(16) Then a check for collisions between the tying end effector and the routed wire bundle envelope is performed (step 332).

(17) Thereafter, a preliminary branch cut file is generated (step 334).

(18) Next a check for collisions between the cutting end effector and the wire routing devices is performed (step 336).

(19) Then a check for collisions between the cutting end effector and the routed wire bundle envelope is performed (step 338).

(20) Thereafter, various control files are written (step 340), including the form board layout control file, the manual form board preparation control file, the routing path control files, the tie control file, and the branch cut control file.

(21) In addition, a manual form complete control file is generated and written (step 342).

While systems and methods for designing and assembling form boards with attached wire routing devices for use in wire bundle assembly have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

As used herein, the term "computer system" should be construed broadly to encompass a system having at least one computer or processor, and which may have multiple computers or processors that communicate through a network or bus. As used in the preceding sentence, the terms "computer" and "processor" both refer to devices comprising a processing unit (e.g., a central processing unit) and some form of memory (i.e., a non-transitory tangible computer-readable storage medium) for storing a program which is readable by the processing unit.

The methods described herein may be encoded as executable instructions embodied in a non-transitory tangible computer-readable storage medium, including, without limitation, a storage device and/or a memory device. Such instructions, when executed by a computer system, cause the tool-equipped unmanned aerial vehicle to perform at least a portion of the methods described herein.

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A wire connector support device comprising:
a frame comprising a base plate having a hole and a vertical plate connected to or integrally formed with the base plate;
a first temporary fastener fastened to the hole in the base plate; and
a detent pin projecting horizontally from the vertical plate, wherein the detent pin is a quick-release alignment pin with a solid shank and spring-loaded locking balls;
wherein the first temporary fastener comprises a cylindrical housing having an external annular flange, and wherein the frame comprises a fastener retaining block having an arc-shaped groove in which a portion of the annular flange of the first temporary fastener is seated.

2. The wire connector support device as recited in claim 1, further comprising a notched projection connected to or integrally formed with and extending vertically upward from the vertical plate.

3. The wire connector support device as recited in claim 1, further comprising: a horizontal platform connected to or integrally formed with and extending horizontally from the vertical plate in a first direction opposite to a second direction in which the base plate is projecting; and a routing clip attached to the horizontal platform.

4. The wire connector support device as recited in claim 3, wherein the routing clip comprises:
a base fastened to the horizontal platform;
first and second flexible clip arms configured to bend resiliently; and
first and second hooks respectively connected to or integrally formed with the first and second flexible clip arms,
wherein the first and second hooks have respective outer inclined surfaces configured to displace in opposite directions when a downward-moving object contacts both outer inclined surfaces, thereby causing the first and second flexible clip arms to bend outwardly to enable the wire routing device to receive the object, and further have inner inclined surfaces configured to hold one or more wires.

5. The wire connector support device as recited in claim 4, wherein the first and second hooks have respective inner inclined surfaces configured to displace in opposite directions when an upward-moving object contacts both inner inclined surfaces, thereby causing the first and second flexible clip arms to bend outwardly to enable the object to be removed from the wire routing device.

6. The wire connector support device as recited in claim 5, wherein the outer inclined surfaces have curved profiles and the inner inclined surfaces have linear profiles.

7. The wire connector support device as recited in claim 1, wherein the first temporary fastener comprises the cylindrical housing, a plunger which is slidably coupled to the cylindrical housing, first and second locking pins extending through a hole in the base plate, and a spacer affixed to the cylindrical housing and disposed between respective portions of the first and second locking pins.

8. The wire connector support device as recited in claim 1, further comprising a second temporary fastener fastened to the base plate.

9. An assembly comprising a wire connector support device and a wire connector coupled to and supported by the wire connector support device, wherein:
the wire connector comprises a mating shell and a contact-receiving insert made of dielectric material having a multiplicity of spaced holes; and
the wire connector support device comprises:
a frame comprising a base plate having a hole and a vertical plate connected to or integrally formed with the base plate;
a temporary fastener fastened to the hole in the base plate, wherein the first temporary fastener comprises a cylindrical housing having an external annular flange, and wherein the frame comprises a fastener retaining block having an arc-shaped groove in which a portion of the annular flange of the first temporary fastener is seated; and
a detent pin projecting horizontally from the vertical plate, wherein the detent pin is a quick-release alignment pin with a solid shank and spring-loaded locking balls.

10. The assembly as recited in claim 9, further comprising a connector backshell which is held in place on the detent pin by the spring-loaded locking balls, wherein the mating shell of the wire connector is mated to the connector backshell.

11. The assembly as recited in claim 9, further comprising a notched projection connected to or integrally formed with and extending vertically upward from the vertical plate.

12. The assembly as recited in claim 9, further comprising: a horizontal platform connected to or integrally formed with and extending horizontally from the vertical plate in a first direction opposite to a second direction in which the base plate is projecting; and a routing clip attached to the horizontal platform.

13. The assembly as recited in claim 12, wherein the routing clip comprises:
a base fastened to the horizontal platform;
first and second flexible clip arms configured to bend resiliently; and
first and second hooks respectively connected to or integrally formed with the first and second flexible clip arms,
wherein the first and second hooks have respective outer inclined surfaces configured to displace in opposite directions when a downward-moving object contacts both outer inclined surfaces, thereby causing the first and second flexible clip arms to bend outwardly to enable the wire routing device to receive the object, and further have inner inclined surfaces configured to hold one or more wires.

14. The assembly as recited in claim 9, wherein the temporary fastener comprises the cylindrical housing, a plunger which is slidably coupled to the cylindrical housing, first and second locking pins extending through a hole in the base plate, and a spacer affixed to the cylindrical housing and disposed between respective portions of the first and second locking pins.

15. A form board assembly comprising a form board, a wire connector support device fastened to the form board, and a wire connector coupled to and supported by the wire connector support device, wherein:
the form board comprises a perforated plate having a multiplicity of holes;
the wire connector comprises a mating shell and a contact-receiving insert made of dielectric material having a multiplicity of spaced holes; and
the wire connector support device comprises:
a frame comprising a base plate having a hole and a vertical plate connected to or integrally formed with the base plate;
a temporary fastener fastened to the hole in the base plate and to a hole in the form board;
wherein the first temporary fastener comprises a cylindrical housing having an external annular flange, and wherein the frame comprises a fastener retaining block having an arc-shaped groove in which a portion of the annular flange of the first temporary fastener is seated; and
a detent pin projecting horizontally from the vertical plate, wherein the detent pin is a quick-release alignment pin with a solid shank and spring-loaded locking balls.

16. The form board assembly as recited in claim 15, further comprising a connector backshell which is held in place on the detent pin by the spring-loaded locking balls, wherein the mating shell of the wire connector is mated to the connector backshell.

17. The form board assembly as recited in claim 15, further comprising a notched projection connected to or integrally formed with and extending vertically upward from the vertical plate.

18. The form board assembly as recited in claim 15, further comprising:
a horizontal platform connected to or integrally formed with and extending horizontally from the vertical plate in a first direction opposite to a second direction in which the base plate is projecting; and
a routing clip attached to the horizontal platform, wherein the routing clip comprises:
a base fastened to the horizontal platform;
first and second flexible clip arms configured to bend resiliently; and
first and second hooks respectively connected to or integrally formed with the first and second flexible clip arms,
wherein the first and second hooks have respective outer inclined surfaces configured to displace in opposite directions when a downward-moving object contacts both outer inclined surfaces, thereby causing the first and second flexible clip arms to bend outwardly to enable the wire routing device to receive the object, and further have inner inclined surfaces configured to hold one or more wires.

19. The form board assembly as recited in claim 15, wherein the temporary fastener comprises the cylindrical housing, a plunger which is slidably coupled to the cylindrical housing, first and second locking pins extending through a hole in the base plate, and a spacer affixed to the cylindrical housing and disposed between respective portions of the first and second locking pins.

* * * * *